US006806031B2

(12) United States Patent
Endo et al.

(10) Patent No.: US 6,806,031 B2
(45) Date of Patent: Oct. 19, 2004

(54) SUPPORT FOR LITHOGRAPHIC PRINTING PLATE AND PRESENSITIZED PLATE

(75) Inventors: Tadashi Endo, Shizuoka (JP); Yoshitaka Masuda, Shizuoka (JP); Atsuo Nishino, Shizuoka (JP); Akio Uesugi, Shizuoka (JP); Katsuyuki Teraoka, Shizuoka (JP); Hisashi Hotta, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/854,691

(22) Filed: May 15, 2001

(65) Prior Publication Data

US 2002/0094490 A1 Jul. 18, 2002

(30) Foreign Application Priority Data

| | | |
|---|---|---|
| May 15, 2000 | (JP) | 2000-141484 |
| Jun. 21, 2000 | (JP) | 2000-186005 |
| Aug. 28, 2000 | (JP) | 2000-257559 |
| Aug. 29, 2000 | (JP) | 2000-258688 |
| Sep. 25, 2000 | (JP) | 2000-291113 |

(51) Int. Cl.[7] .................. G03F 7/09

(52) U.S. Cl. .................. 430/278.1; 430/138; 101/454; 101/456

(58) Field of Search .................. 430/270.1, 275.1, 430/278.1, 302, 138; 101/453, 454, 456, 457, 458, 463.1, 465, 467

(56) References Cited

U.S. PATENT DOCUMENTS

| | | | | |
|---|---|---|---|---|
| 4,502,925 A | | 3/1985 | Walls | |
| 5,779,824 A | * | 7/1998 | Sawada et al. | 148/437 |
| 5,837,345 A | * | 11/1998 | Nishino et al. | 428/141 |
| 6,114,089 A | * | 9/2000 | Takita et al. | 430/278.1 |
| 6,200,727 B1 | * | 3/2001 | Urano et al. | 430/270.1 |
| 6,232,037 B1 | * | 5/2001 | Uesugi et al. | 430/278.1 |
| 6,264,821 B1 | * | 7/2001 | Nishino et al. | 205/660 |
| 6,399,279 B1 | * | 6/2002 | Urano et al. | 430/302 |
| 6,423,471 B1 | * | 7/2002 | Sorori et al. | 430/281.1 |
| 6,494,137 B2 | * | 12/2002 | Sawada et al. | 101/459 |
| 6,508,170 B2 | * | 1/2003 | Katsuoka et al. | 101/455 |
| 2001/0025799 A1 | * | 10/2001 | Nishino et al. | 205/658 |
| 2002/0029710 A1 | * | 3/2002 | Sawada et al. | 101/463.1 |
| 2002/0153253 A1 | * | 10/2002 | Nishino et al. | 205/50 |

FOREIGN PATENT DOCUMENTS

| | | | | |
|---|---|---|---|---|
| EP | 0 595 179 A1 | | 5/1994 | |
| EP | 0 701 908 A2 | | 3/1996 | |
| EP | 0 816 118 A1 | | 1/1998 | |
| EP | 960 743 A2 | * | 12/1999 | B41N/3/03 |
| JP | 60-036195 | * | 2/1985 | B41N/3/00 |
| JP | 60-063341 | * | 4/1985 | C22C/21/00 |
| JP | 62-109041 | * | 5/1987 | G03C/1/71 |
| JP | 06-135175 A | | 5/1994 | |
| JP | 09-086068 A | | 3/1997 | |
| JP | 09-142049 | * | 6/1997 | B41N/1/08 |
| JP | 11-184074 A | | 7/1999 | |

* cited by examiner

*Primary Examiner*—Barbara Gilliam
(74) *Attorney, Agent, or Firm*—Burns, Doane, Swecker & Mathis, L.L.P.

(57) ABSTRACT

Disclosed is a presensitized plate, having an anodized layer and recording layer provided on a support for a lithographic printing plate, wherein the anodized layer is provided by subjecting an aluminum plate to graining and anodizing treatments. The presensitized plate has wide development latitude, makes it difficult for scratch-like non-image portions to be generated and facilitates handling in usual operation.

2 Claims, 8 Drawing Sheets

SUPPORT FOR LITHOGRAPHIC PRINTING PLATE AND PRESENSITIZED PLATE

BACKGROUND OF THE INVENTION

1. Field of the invention

The present invention relates to a support for a lithographic printing plate and a presensitized plate, particularly to a positive working presensitized plate having a photosensitive layer that can become alkali-soluble by photothermal conversion with laser beams and a support for a lithographic printing plate used for the positive working presensitized plate.

2. Description of the Related Arts

Lithographic printing is a printing method using the property that water and oil are immiscible. On the printing surface of the lithographic printing plate used for the method, areas (hereunder referred to as non-image areas) that accept water and repel oil ink and areas (hereunder referred to as image areas) that repel water and accept oil ink are formed.

The support for a lithographic printing plate, which is used so as to carry the non-image areas of the surface, requires various properties such as water wettability and water receptivity, and further good adhesion to a photosensitive layer provided thereon, which are incompatible.

When the water wettability of the support is too low, ink attaches on the non-image areas during printing and a stain is generated on a blanket cylinder, then a so-called scum develops on a print. When the water receptivity of the support is too low, a significant amount of fountain solution is needed to prevent clogging on shadow areas during printing. Therefore, a so-called water range becomes narrow.

Recent years, accompanied with development of image formation technology, it has come to be possible to make a printing plate directly by scanning narrow focused laser beams on the printing plate and by forming a manuscript of letters, images and the like directly on the plate without using a film manuscript.

For example, in the case of a so-called thermal positive working type presensitized plate in which a positive image is formed by making a photosensitive layer alkali-soluble by photothermal conversion in the photo sensitive layer, heat generated from photothermal conversion materials in the photosensitive layer by applying laser beams induces image forming reaction.

Here, when a deep pit generated by graining treatment exists on the surface of support treated for graining, thickness of the portion of the photosensitive layer becomes thicker, and image forming reaction on the bottom of the pit becomes inadequate. As a result, local residual layers (hereunder referred to also as dot residual layers) are generated on the non-image areas, causing a problem of scum developing on the non-image areas during printing.

Moreover, the amount of the fountain solution is decided based on a water gloss on the plate in the event of controlling fine adjustment of water scale during printing operation. Accordingly, in the case where the pit is shallow after graining treatment, a gloss of the non-image areas increases, thus resulting in difficulty in fine adjustment of the amount of the fountain solution during printing.

In order to solve the problems described above, specifying of a surface shape of the support has been proposed before.

For example, a rough surface shape having a pit, in which the slope of a straight line by the first order regression analysis of a pit diameter and the maximum depth in a direction perpendicular to the diameter is 0.300 or less under 1.5 $\mu$m or less of the pit diameter, has been proposed in JP-A-9-86068 (the term "JP-A" as used herein means an "unexamined published Japanese patent application"). Here, it is described that the rough surface shape prevents scum developing on the non-image areas during printing and provides excellent ballpoint pen characteristics. However, though the method shown in the above gazette could solve the problem with dot residual layers, the method was not sufficient for fine control of water volume and a water range during printing.

The brush graining process in which at least two kinds of brushes are used for graining to prevent scum and clogging on the shadow areas has been proposed in JP-A-6-135175. However, though the method shown in the foregoing gazette was sufficient for fine control of water volume and water width during printing, the method could not solve the problem with the dot residual layers sufficiently.

Moreover, a support comprising a double structure of small and large pits, in which an average opening diameter of a larger pit with uniformity is 3 m or more and 6 m or less, an average opening diameter of a small pit is 0.2 $\mu$m or more and 0.8 $\mu$m or less, and a ratio of depth to the opening diameter of the small pit is not more than 0.2 $\mu$m, has been proposed in JP-A-11-184074. Here, it is described that the support could improve dot gain with high definition, resistance to stain developing on a blanket, scum resistance under small water volume and printability on YUPO paper. Although the method described in the foregoing gazette could provide better fine control of water volume, further improvements in restraining the dot residual layers are desired.

In the presensitized plate using an aluminum support which has been treated for graining and having an anodized layer formed thereon, since thermal conductivity of the support is much higher than that of the photosensitive layer, heat generated around an interface of the photosensitive layer and the support moves into the support before image forming reaction (alkali-soluble reaction) occurs sufficiently. As a result, solubility of the photosensitive layer to plate developer becomes inadequate around the interface of the photosensitive layer and the support, and the residual layers are easily generated on the areas which must be non-image areas originally. Therefore, high sensitive developer must be used, but by using it, non-image portions are easily generated on the area to be the image area. That is, slight variation of sensitivity of the developer indicated by electronic conductivity during developing easily causes development failure, and the intrinsic problem remains, in which development latitude is much narrower than the conventional PS plate system that has been used before. In order to solve the problem, various methods for improving development performance of the photosensitive layer around the interface of the photosensitive layer and the support in the presensitized plate of a thermal positive working type have been studied, but the result has not reached a satisfactory level.

When the photosensitive layer that can become alkali-soluble by heating sustains damage by some causes, the area to be an image area also becomes easily soluble in developer. That is, the printing plate sustains damage easily in practical use. For this reason, scratch-like non-image portions is generated by tiny contact to the plate surface such as bumping in handling the printing plate, tiny abrasion in interleaving sheets and contact to the plate surface by fingers. Accordingly, handling of the printing plate is very difficult under the present circumstance.

In particular, in the presensitized plate of a thermal positive working type, when the alkali-soluble level of the photosensitive layer by exposure of laser is not that high, sometimes a slightly soluble layer is formed as the top layer of the photosensitive layer to obtain clear discrimination of an image on development. In this case, since other parts than the slightly soluble layer are soluble in alkali, the foregoing narrowness of development latitude and the generating of the scratch-like non-image portion are especially problematic.

It is also indispensable for a recording layer of such a thermal type to contain infrared absorbent having a photothermal conversion function. Since solubility of the absorbent is low due to high-molecular weight of the absorbent and further the absorbent adsorbed in micro openings on the anodized layer of the support can not be removed easily, there has been the problem that the residual layers are easily generated on a development process with alkali developer.

In order to solve this problem, various under-coatings have been studied to improve the development performance of the photosensitive layer on the interface of the photosensitive layer and the support in the positive working presensitized plate. But, the result has not reached a satisfactory level.

In particular, as recent market movements, a request of shortening exposure time for increasing the productivity and a request of using laser at lower output for a longer life of the laser are strong. Therefore, a presensitized plate has been requested, in which a printing plate is directly made by laser beams, generated heat is effectively utilized for image forming reaction, good solubility to alkali developer is provided to the non-image areas, and scum on the non-image areas caused by high sensitivity and the residual layers are restrained.

SUMMARY OF THE INVENTION

A first object of the present invention is to provide a positive working presensitized plate of a thermal type, which has wide development latitude in order not to cause development failure easily by variation of sensitivity of developer, and which does not generate scratch-like non-image portions easily and is handled easily in the conventional operation.

A second object of the present invention is to provide a presensitized plate that can be processed to such a lithographic printing plate that a blanket cylinder is not stained easily, no local residual layer is generated on non-image areas, fine adjustment of the amount of the fountain solution is easily controlled during printing and ink spreading does not occur easily under small volume of water, and to provide a support for a lithographic printing plate that can be used suitably for the presensitized plate.

A third object of the present invention is to provide a presensitized plate that can be processed to such a lithographic printing plate that a blanket cylinder is not stained easily, no local residual layer is generated on non-image areas, fine adjustment of the amount of the fountain solution is easily controlled during printing and ink spreading does not occur easily under small volume of water, and to provide a support for a lithographic printing plate that can be used suitably for the presensitized plate and a preparing method thereof.

A fourth object of the present invention is to provide a presensitized plate of a thermal type that can be processed to such a lithographic printing plate that no local residual layer is generated on non-image areas, fine adjustment of the amount of the fountain solution is easily controlled during printing, and to provide a support for a lithographic printing plate that can be used suitably for the presensitized plate of a thermal type.

A fifth object of the present invention is to provide a positive working presensitized plate of a thermal type, which can utilize heat generated with infrared absorbent effectively for image forming, in which there is no residual layer caused by penetration of a photosensitive layer into a micropore formed on an anodized layer, which has high sensitivity, that can be processed to a lithographic printing plate with excellent scum resistance on non-image areas and in which high quality image can be formed, and to provide a support for a lithographic printing plate that can be used suitably for the positive working presensitized plate of a thermal type.

The inventors of the present invention completed the present invention as a result of conducting extensive study to attain the first object described above.

A first aspect of the present invention is a presensitized plate comprising: an intermediate layer readily soluble in alkali; and a photosensitive layer that can become alkali-soluble by heating, said layers being sequentially provided on a support for a lithographic printing plate, provided by subjecting an aluminum plate to graining treatment, alkali etching treatment and anodizing treatment, wherein an amount of alkali etching is set in a range of 0.5 to 4 $g/m^2$ for said alkali etching treatment, and an average thickness of thinnest 10% of said photosensitive layer on convex portions of a surface of the support is set in a range of 0.2 to 2 $\mu$m.

In the first aspect of the presensitized plate, it is conceivable that convex portions on the surface of the support are rounded and smoothed by alkali etching with the foregoing quantity after graining treatment, thus resulting in improvement in development performance by eliminating residual layers, and that stress to pressure from the upper side of the photosensitive layer is dispersed to prevent breaks of the photosensitive layer by setting the thickness of a thinnest portion of the photosensitive layer on the convex portions of the surface of the support in the above-described range when forming the photosensitive layer on the support.

In the case where amount of alkali etching is less than 0.5 $g/m^2$, or the average thickness of thinnest 10% of the foregoing photosensitive layer on the convex portions of the surface of the support is less than 0.2 $\mu$m, the thickness may decrease easily and inadequate inking may occur when the developer has high sensitivity, and also scratch resistance may highly decrease.

On the other hand, in the case where amount of alkali etching is more than 4 $g/m^2$, asperities on the support decrease largely, thus causing decrease of anchor effects of the photosensitive layer, easy falling off of the photosensitive layer, inferior development performance in the high sensitive developer and also inferior scratch resistance. In the case where the average thickness of thinnest 10% of the photosensitive layer on the convex portions of the surface of the support is more than 2 $\mu$m, energy required for making the whole photosensitive layer alkali-soluble becomes large, causing generating of the residual layers very easily during development, which results in narrow development latitude.

As described above, development latitude can be expanded and better damage resistance can be provided by using the presensitized plate according to the first aspect of the present invention.

The inventors of the present invention, as a result of conducting extensive study to attain the second object described above, completed a support for a lithographic printing plate according to the second aspect of the present invention, in which, with regard to the support before coating the photosensitive layer, (1) for a surface of the support, arithmetic average roughness ($R_a$) measured in compliance with JIS B0601-1994 is set in a range of 0.3 to 0.5 μm, (2) for the surface of the support, 10-point average roughness ($R_z$) measured in compliance with JIS B0601-1994 is set in a range of 3.0 to 6.0 μm, and (3) for the surface of the support, the number PC of roughness curve peaks is 15 or more per 1 mm, when a set value is 0.3–0.3 μm. It was found out that in the support, there is no local residual layer on non-image areas and fine adjustment of the amount of the fountain solution can be easily controlled, ink spreading hardly occurs under small volume of water.

Specifically, the second aspect of the present invention is a support for a lithographic printing plate, provided by a treatment process including at least two or more steps of subjecting an aluminum plate to graining and any one of etching and desmutting steps between said graining steps, wherein for a surface of said support, arithmetic average roughness ($R_a$) measured in compliance with JIS B0601-1994 is set in a range of 0.3 to 0.5 μm, for the surface of said support, 10-point average roughness ($R_z$) measured in compliance with JIS B0601-1994 is set in a range of 3.0 to 6.0 μm, and for the surface of said support, the number $P_c$ of roughness curve peaks is 15 or more per 1 mm, when a set value is 0.3–0.3 μm.

Preferably, for the surface of said support, an 85-degree surface gloss regulated by JIS Z8741-1997 is set equal to 30 or lower.

In one of the preferable embodiments, said treatment process lastly includes a step of anodizing.

In another of the preferable embodiments, said treatment process lastly includes a step of anodizing, and then a step of water wettability treatment.

The second aspect of the present invention also provides a presensitized plate comprising said support for a lithographic printing plate and a photosensitive layer thereof. In this case, further interlayer comprising organic materials may be formed between the support for the lithographic printing plate according to the second aspect and the photosensitive layer.

The inventors of the present invention, as a result of conducting extensive study to attain the third object described above, completed a support for a lithographic printing plate according to the third aspect of the present invention, in which, with regard to the aluminum support before coating the photosensitive layer, (1) for a surface of the support, in a filtered waviness curve measured at a cut-off value of 0.8 mm and an evaluation length of 6 mm in compliance with JIS B0610-1987, the number of waves having a depth of 0.3 μm or deeper is set in a range of 35 to 60, and the number of waves having a depth of 1.0 μm or deeper is 5 or less, (2) for the surface of the foregoing support, arithmetic average roughness measured at the cut-off value of 0.8 mm and the evaluation length of 6 mm in compliance with JIS B0601-1994 is set in a range of 0.35 to 0.5 μm, and (3) a uniform honeycomb pit having a diameter set in a range of 0.5 to 2 μm is provided on a full surface of the surface of the foregoing support. It was found out that in the support, the stain hardly develops on a blanket cylinder, there is no residual layer on non-image areas, fine adjustment of the amount of the fountain solution can be easily controlled during printing and ink spreading hardly occurs under small volume of water.

Specifically, the third aspect of the present invention is a support for a lithographic printing plate, provided by a treatment process including at least two or more steps of subjecting an aluminum plate to electrochemical graining and any one of etching and desmutting steps between said electrochemical graining steps, wherein for a surface of said support, in a filtered waviness curve measured at a cut-off value of 0.8 mm and an evaluation length of 6 mm in compliance with JIS B0610-1987, the number of waves having a depth of 0.3 μm or deeper is set in a range of 35 to 60, and the number of waves having a depth of 1.0 μm or deeper is 5 or less, for the surface of said support, arithmetic average roughness measured at the cut-off value of 0.8 mm and the evaluation length of 6 mm in compliance with JIS B0601-1994 is set in a range of 0.35 to 0.5 μm, and uniform honeycomb pits having a diameter set in a range of 0.5 to 2 μm are provided on a full surface of said support.

Preferably, for the surface of said support, an 85-degree surface gloss regulated by JIS Z8741-1997 is set equal to 30 or lower.

In one of the preferable embodiments, said treatment process lastly includes a step of water wettability treatment.

The inventors of the present invention completed a preparing method of a support for a lithographic printing plate according to the present invention, the preparing method comprising the steps of: performing an electrochemical graining to form a surface having the number of waves of a depth 0.3 μm or deeper set in a range of 35 to 60, and the number of waves of a depth 1.0 μm or deeper set equal to 5 or less, in a filtered waviness curve measured at a cut-off value of 0.8 mm and an evaluation length of 6 mm in compliance with JIS B0610-1987; and performing further electrochemical graining. It was found out that the method described above is suitable to obtain a support in which stain hardly develops on a blanket cylinder, there is no local residual layer on non-image areas, fine adjustment of the amount of the fountain solution can be easily controlled, and ink spreading hardly occurs under small volume of water.

Specifically, the third aspect of the present invention also provides a method for preparing a support for a lithographic printing plate, having a treatment process including at least two or more steps of subjecting an aluminum plate to electrochemical graining and any one of etching and desmutting steps between said electrochemical graining steps, comprising the steps of: performing one electrochemical graining to form a surface having the number of waves of a depth 0.3 μm or deeper set in a range of 35 to 60, and the number of waves of a depth 1.0 μm or deeper set equal to 5 or less, in a filtered waviness curve measured at a cut-off value of 0.8 mm and an evaluation length of 6 mm in compliance with JIS B0610-1987; and performing another electrochemical graining.

The third aspect of the present invention also provides a presensitized plate comprising said support for a lithographic printing plate and a photosensitive layer thereof. In this case, further interlayer comprising organic materials may be formed between the support for the lithographic printing plate according to the second aspect and the photosensitive layer.

The inventors of the present invention, as a result of extensive study to attain the fourth object, also completed a support for a lithographic printing plate according to the fourth aspect of the present invention by regulating size and number of concave portions formed on the surface of the support and by keeping the gloss of the surface in some scope. It was found out that when the support is processed into a lithographic printing plate, there is no local residual layer on non-image areas and fine adjustment of the amount of the fountain solution is easily controlled during printing.

The fourth aspect of the present invention provides a support for a lithographic printing plate, provided by subjecting an aluminum plate to graining treatment, wherein for a surface of said support, the number of concave portions within 1 mm is ten or less, each of said concave portions having a width of 8 $\mu$m or wider, alternatively a maximum depth of 1.7 $\mu$m or deeper in a direction perpendicular to the width, and for the surface of said support, an 85-degree surface gloss regulated by JIS Z8741-1997 is 30 or lower.

Here, the width and maximum depth of the concave portions on the surface of the support for the lithographic printing plate are measured by observing a cross sectional shape with a scanning electron microscope. When a cross section of the support for the lithographic printing plate according to the fourth aspect of the present invention is measured at an optional place, the number of concave portions having 8 $\mu$m or more in the width, or 1.7 $\mu$m or more in the maximum depth perpendicular to the width is 10 pieces or less in 1 mm of the cross section.

The fourth aspect of the present invention also provides a presensitized plate comprising said support for a lithographic printing plate and a recording layer thereof, said recording layer containing infrared absorbent and a high-molecular compound insoluble in water and soluble in an alkali aqueous solution, wherein solubility to an alkali developer is increased by infrared laser exposure.

It is presumable that in the fourth aspect of the present invention, the possibility that the photosensitive layer existing on deep concave portions remains during development can be reduced by controlling the number of concave portions exceeding the set dimensions in width and depth within a certain range on the support for the lithographic printing plate prepared by performing graining treatment on an aluminum plate. However, when the surface becomes too smooth by controlling the number of wider or deeper concave portions, problems such as decrease of adhesion to photosensitive layers, difficulty in fine control of water volume due to gloss increase during printing, come up easily. Therefore, in the fourth aspect of the present invention, the 85-degree surface gloss is controlled under 30 to satisfy all of restraining of the residual layers, adhesion to the photosensitive layer and controlling of fine water volume during printing.

The inventors of the present invention, as a result of extensive study to attain the fifth object of the present invention, completed a support for lithographic printing plate according to the fifth aspect of the present invention, on which an anodized layer with a specified opening area is formed. It was found out that the residual layers are not generated during printing by using the support, the support has high sensitivity, a lithographic printing plate processed from the support has better scum resistance on non-image areas and high quality image can be formed.

Specifically, the fifth aspect of the present invention provides a support for a lithographic printing plate, provided by subjecting an aluminum plate to graining treatment and anodizing treatment, wherein when a diameter and a density of a micropore present in an anodized layer are respectively d(m) andρ (number of micropores/$m^2$), both satisfy an expression (i) below:

$$0.5<\pi(d/2)^2\times\rho<2.0 \quad (i)$$

The fifth aspect of the present invention also provides a presensitized plate comprising said support for a lithographic printing plate and a recording layer thereof, said recording layer containing infrared absorbent and a high-molecular compound insoluble in water and soluble in an alkali aqueous solution, wherein solubility to an alkali developer is increased by infrared laser exposure.

In the fifth aspect of the present invention, the diameter of micropores d (referred to also as pore diameter hereunder) is determined by an average diameter of at least 30 pieces which are read by visual observation on SEM (scanning electron microscope) pictures. The SEM pictures are prepared by observing on the surface of the presensitized plate with a scanning electron microscope of electrical field emission type and without vapor deposition, after gum on the non-image areas of the plate after recording an image is washed off and air-dried. Density of microporesρ (referred to as pore density hereunder) is determined by counting and averaging micropores observed in at least 10 fields of view with 400 nm square in the SEM pictures taken by 150,000 times in the same way.

Aluminum oxide which is main substance composing the anodized layer has lower thermal conductivity compared with metal aluminum and has advantage over metal aluminum in point of restraining diffusion of heat generated in the photosensitive layer. Since the anodized layer, in particular, has many fine cells called micropores (referred to also as pore hereunder) in the thickness direction of the anodized layer, thermal conductivity of the layer becomes further lower than the conventional aluminum oxide layer, thus resulting in advantage in restraining heat diffusion.

In the fifth aspect of the present invention, characteristics of the micropores existing on the anodized layer are determined in the expression (i) described above. The expression (i) determines a ratio of an opening area of the micropores when the micropores on the surface are observed from the surface of the layer.

In the fifth aspect of the present invention, improvement in sensitivity and restraining residual layer generation are attained by combination of an anodized layer having the specified opening area ratio and the positive working photosensitive layer of a thermal type. This is because adhesion to the photosensitive layer, void holding property and thermal insulation property can be well balanced by keeping the ratio of opening area in the set range determined by the expression (i) described above.

As a result that the opening area ratio indicated in the expression (i) is kept in the range more than 0.5 and less than 2.0, preferably not more than 1.0, more preferably not more than 0.9, decrease of the thermal insulation property caused by deep penetration of the photosensitive layer into the micropores and clogging of the pores can be prevented, and the phenomena that the penetrated photosensitive layer can not be removed easily by developer can be prevented, thus attaining the restraining of the residual layer generation. Further, since the pore diameter of the micropores and the pore density on the anodized layer are controlled within a specified range and the thickness and void ratio of the anodized layer effective for restraining the heat diffusion are secured, thermal insulation effect of the anodized layer can be kept effectively, and sensitivity can be improved.

The diameter and density of the micropores can be adjusted by controlling conditions for forming the anodized layer and conditions for post-treatment such as acid/alkali treatment, treatment for clogging the pore and the like after forming the anodized layer, as well known before.

BRIEF DESCRIPTION OF THE DRAWINGS

FIG. 9B a state after anodizing.

FIG. 10B a state after anodizing.

FIG. 11B a state after anodizing.

DETAILED DESCRIPTION OF THE PREFERRED EMBODIMENTS

Figure 1:
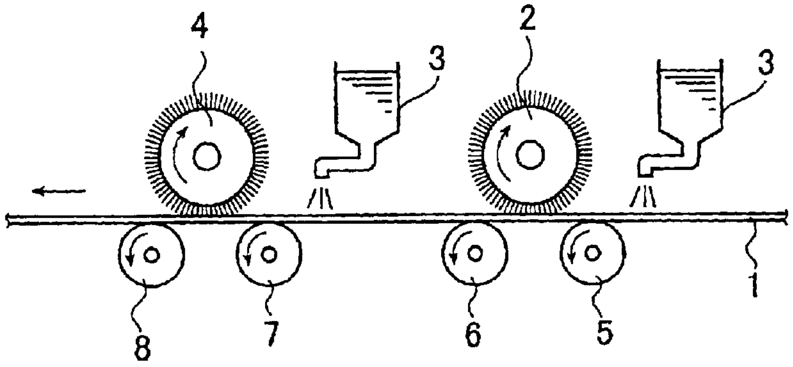
FIG. 1 is a side view showing a concept of a brush graining process used for mechanical graining used in the present invention.

The present invention is described below in detail.

[A support for a Lithographic Printing Plate]

<Aluminum Plate (Rolled Aluminum)>

An aluminum plate used for a support for a lithographic printing plate of the present invention is metal having dimensional stable aluminum as the main component and are composed of aluminum or aluminum alloy. Here, the support for a lithographic printing plate of the present invention is a generic name of the support for the lithographic printing plate of the present invention used for the presensitized plate in the first aspect and the support for the lithographic printing plates in the second, third, fourth and fifth aspects of the present invention. The same applies hereinafter. Besides a pure aluminum plate, alloy with aluminum as the main component containing very small quantity of different elements, plastic film or paper laminated or vapor deposited with aluminum or aluminum alloy may be used. Further, as described in JP-B-48-18327 (the term "JP-B" as used herein means an "examined Japanese patent publication"), a composite sheet in which an aluminum sheet is combined on a polyethylene terephthalate film may be used.

Hereinafter, various plates composed of aluminum or aluminum alloy described before are referred to as an aluminum plate as a generic name. Different elements that may be contained in the aluminum alloy are silicon, iron, manganese, copper, magnesium, chromium, zinc, bismuth, nickel, titanium and so on. The content in the aluminum alloy is 10 wt % or less.

A pure aluminum plate is preferably used in the present invention, but since it is difficult to produce perfectly pure aluminum from the viewpoint of refining technology, aluminum containing tiny quantity of different elements may be allowable. Composition of the aluminum plate used in the present invention is not specified in this way and materials well-known before such as JIS A1050, JIS A1100, JIS A3005, JIS A3004, International registered alloy 3103A and the like may be used as occasion arises. With regard to a production method of an aluminum plate, continuous casting and DC casting can be used, and also an aluminum plate produced without an annealing process and soaking in the DC casting can be used. The aluminum plate having asperity by laminated rolling or transcription in the final rolling process may be used. Thickness of aluminum plates used in the present invention is around 0.1 to 0.6 mm. This thickness may be changed depending on size of a printing machine, size of a printing plate and user requires.

The support for a lithographic printing plate used for the presensitized plate according to the first aspect of the present invention is obtained by performing graining treatment, alkali etching treatment and anodizing treatment on the aluminum plate. Other various processes besides the graining treatment, the alkali etching treatment and the anodizing treatment may be included in the production process of the support.

The support according to the second aspect of the present invention is obtained by treating the foregoing aluminum plate at the treating process having at least two or more graining steps and an etching step or a desmutting step between the graining steps. While this process includes two or more graining steps and an etching step or a desmutting step, other various steps besides those may be included.

As an example of a treating process, mechanical graining treatment, the first etching treatment, the first desmutting treatment, the first electrolytic graining process, the second etching treatment, the second desmutting treatment, the second electrolytic graining treatment, the third etching treatment, the third desmutting treatment and anodizing treatment are performed in order. Herein, an ordinal number such as "the first" is used in the process order when the same treatment is used repeatedly between other steps. When the same treatment is used, the conditions for the treatment may be the same or different.

The support for a lithographic printing plate according to the third aspect of the present invention is obtained by treating the aluminum plates at the treating process having two or more electrochemical graining treatment steps and an etching step or a desmutting step between the electrochemical graining steps. While this process includes two or more electrochemical graining treatment steps and an etching step or a desmutting step, other various steps besides those may be included.

The support for a lithographic printing plate according to the fourth aspect of the present invention is obtained by performing graining treatment on the aluminum plate and other various steps besides the graining treatment may be included in this production process for the support.

The support for a lithographic printing plate according to the fifth aspect of the present invention is obtained by performing graining treatment and anodizing treatment on the aluminum plate, and other various steps besides the graining treatment and the anodizing treatment may be included in this production process for the support.

<Surface Roughing Treatment (Graining Treatment)>

The foregoing aluminum plate has a preferable shape by performing graining treatment. As a graining treatment method, there is mechanical graining as disclosed in JP-A-56-28893, chemical etching, electrolytic graining and the like. Furthermore, an electrochemical graining method graining a surface of aluminum in hydrochloric acid electrolytic solution or nitric acid electrolytic solution electrochemically, a mechanical graining method such as a wire brushing graining method scratching a surface of aluminum with metal wire, a ball graining method graining a surface of aluminum with abrasives and a graining ball, a brush graining method graining the surface with nylon brushes and abrasives and the like, may be used. These graining methods may be used alone or in combination of those.

Among those graining methods, a preferable method for making a grained surface used in the present invention is an electrochemical method graining the surface chemically in the hydrochloric acid electrolytic solution or nitric acid electrolytic solution. Preferable current density is 50 to 400 $C/dm^2$ at an anode electricity quantity. Further concretely, for example, it is carried out in electrolytic solution containing hydrochloric acid or nitric acid of 0.1 to 50 wt % under such conditions as at 20 to 100° C. of temperature, 1 second to 30 minutes of time and 100 to 400 $C/dm^2$ of current density, using direct current or alternating current. Since the electrochemical graining can easily process fine asperities on the surface, it is suitable for improving adhesion between the photosensitive layers and the support.

By the graining, pits in the shape of crater or honeycomb with the average diameter of 0.5 to 20 $\mu$m can be formed with an area ratio of 30 to 100%. The pits formed have functions to improve scum resistance and press life of the non-image areas of the printing plates. In the electrochemical treatment, the quantity of electricity, that is, the product of electric current and running time for the current, which is required for forming adequate pits on the surface, is an important condition for the electrochemical graining. It is desirable to form adequate pits by less amount of electricity from a viewpoint of energy saving.

Surface roughness after the graining treatment, in the first and the fifth aspects of the present invention, is preferably 0.2 to 0.5 $\mu$m at the arithmetic average roughness ($R_a$) measured at 0.8 mm of cut-off value, 3.0 mm of evaluation length in accordance with JIS B0601-1994.

In the fourth aspect of the present invention, center line average roughness ($R_a$) is preferably 0.2 to 0.6 $\mu$m and maximum height ($R_{max}$) is preferably 2.5 to 6.0 $\mu$m. With regard to the formation of concave portions by the graining treatment, preferably, the width is at least 2 to 30 $\mu$m and preferably 5 to 10 $\mu$m, the maximum depth perpendicular to the width is 0.1 to 5 $\mu$m and preferably 0.5 to 2 $\mu$m, and the ratio of width to maximum depth perpendicular to the width (width/maximum depth perpendicular to width) is 2 or more, and preferably 5 or more. Further preferably, there are 10 or less concave portions with 8 $\mu$m of the width, or 1.7 $\mu$m or more of the maximum depth perpendicular to the width at the distance of 1 mm.

<Alkali-etching Treatment>

The aluminum plate grained as described above is etched chemically by alkali. Preferable alkali agents used for the present invention are, for example but without limitation, include sodium hydroxide, sodium carbonate, sodium aluminate, sodium metasilicate, sodium phosphate, potassium hydroxide and lithium hydroxide.

With regard to conditions for alkali etching treatment, without any limitation, alkali concentration is preferably 1 to 50 wt %, more preferably 5 to 30 wt %, alkali temperature is preferably 20 to 100° C., further preferably 30 to 50° C.

Amount of alkali etching at the alkali etching treatment is 0.5 to 4 $g/m^2$, preferably 0.7 to 2.5 $g/m^2$, and more preferably 0.7 to 1.5 $g/m^2$ in the first aspect of the present invention.

The presensitized printing plate processed by keeping the amount of the alkali etching after the surface graining in the range described above and by rounding and smoothing convex portions on the surface of the support have an excellent development performance without inadequate inking or generation of the residual layers in development. Details are described below.

When the amount of alkali etching is less than 0.5 $g/m^2$, convex portions on the surface of the support formed by graining are kept in a sharp shape. The thinner portions of the photosensitive layer formed on these sharp convex portions are around 0.1 $\mu$m or less. In the case of the thinner photosensitive layer on the convex portions, if the sensitivity of the developer is high, the developer erodes the photosensitive layer and reaches easily the intermediate layer readily soluble in alkali. As a result, the intermediate layer is dissolved and the photosensitive layer is removed and non-image portions are generated easily on the area which should be an image area originally. That is, the thickness decreasing easily occurs, causing the inadequate inking sometimes.

In the case where some scratches are generated by contact to the plate surface, in the same way, the developer reaches easily the intermediate layer readily solible in alkali, and the non-image portions are generated easily.

In order to make the photosensitive layer thicker at the sharp convex portions to prevent these defects, it is needed to make the whole photosensitive layers thicker, thus resulting in that the residual layers are very easily generated in development.

In particular, in the case where a slightly soluble layer is formed as the top layer of the photosensitive layer, tips of sharp convex portions crawl in the slightly soluble layer, and thickness of the spots of the slightly soluble layer becomes thinner sometimes. As a result, the developer easily reaches the intermediate layer readily soluble in alkali, when the slightly soluble layer is dissolved slightly in the developer or scratches are produced by contact to the plate surface.

In the first aspect of the present invention, amount of the alkali etching is 0.5 $g/m^2$ or more, and the convex portions on the surface of the supports are rounded and smoothed. Therefore, it is not needed to make the thickness of the whole photosensitive layer thicker and average thickness of thinnest 10% of the photosensitive layer on the convex portions of the surface of the support can be 0.2 to 2 $\mu$m as described below. Then, there is no problem with the inadequate inking in the case of high sensitivity of the developer, with scratches made by the contact, and with generation of the residual layers in development.

On the other hand, when the amount of the alkali etching is more than 4 $g/m^2$, anchor effect of the photosensitive layers are reduced and the photosensitive layers are easily peeled off since the asperities of the supports are substantially decreased. Therefore, development performance in the high sensitive developer and scum resistance are sometimes inferior.

In the first aspect of the present invention, there is no problem as described above, since amount of the alkali etching is 4 $g/m^2$ or less.

In the fourth aspect of the present invention, amount of the alkali etching in the alkali etching treatment is preferably 0.01 to 10 $g/m^2$, more preferably 0.1 to 5 $g/m^2$.

In the fifth aspect of the present invention, amount of the alkali etching in the alkali etching treatment is preferably 0.1 to 20 $g/m^2$.

After the alkali etching treatment, washing with acid is carried out to remove smut remained on the surface. Acid to be used includes, for example, nitric acid, sulfuric acid, phosphoric acid, chromic acid, hydrofluoric acid and borofluoric acid. In particular, as a method for removing smut after electrochemical graining treatment, the method in which smut is made contact to sulfuric acid of 15 to 65 wt % at 50 to 90° C. of temperature, as described in JP-A-53-12739 is preferable.

<Anodizing Treatment>

Anodizing treatment is performed on an aluminum plate treated as described above. With regard to the anodizing treatment, methods that have been conventionally used in this field can be used. Specifically, when direct current or alternating current is fed to the aluminum plates in aqueous solution or non aqueous solution, alone or in combination, of sulfuric acid, phosphoric acid, chromic acid, oxalic acid, sulfamic acid, benzene-sulfonic acid and the like, an anodized layer can be formed on the surface of the aluminum plate.

In this case, even if any ingredient contained in Al alloy plate, electrode, city water, underground water and the like is contained in the electrolytic solution, there is no problem. Further, containing of the second and third ingredients is also allowable. The second and third ingredients herein include ion of metal such as Na, K, Mg, Li, Ca, Ti, Al, V, Cr, Mn, Fe, Co, Ni, Cu, Zn and the like; cation such as ammonium ion; anion such as nitric acid ion, carbonic acid ion, chloride ion, phosphoric acid ion, fluoride ion, sulfurous acid ion, titanic acid ion, silicic acid ion and boric acid ion. Containing 0 to 10000 ppm of those ions is allowable.

Since conditions for anodizing treatment change variously depending on the electrolytic solution being used, those are not decided unconditionally, but it is generally appropriate that concentration of electrolytic solution is 1 to 80 wt %, temperature of solution is −5 to 70° C., current density is 0.5 to 60 $A/dm^2$, voltage is 1 to 100V, time for electrolysis is 10 to 200 seconds.

Among these anodizing treatment methods, the method in which anodizing is carried out in sulfuric acid electrolytic solution with high current density, described in UK patent 1,412,768, is particularly preferable.

In the present invention, quantity of the anodized layers is preferably 1 to 10 $g/m^2$. If it is less than 1 $g/m^2$, plates are scratched easily. And if it is more than 10 $g/m^2$, much quantity of electricity is needed for the production, which is economically disadvantaged. Quantity of the anodized layers is preferably 1.5 to 7 $g/m^2$, more preferably 2 to 5 $g/m^2$.

In the fifth aspect of the present invention, it is needed to select conditions of the anodizing treatment so that diameter d and density$\rho$ of micropores on the anodized layer can satisfy the expression (i) after the anodizing treatment and at post-treatment described below that may be carried out if desired.

For example, as the methods for controlling to enlarge the diameter of the micropores in the anodizing treatment, a method using phosphoric acid or oxalic acid, a method reducing temperature of the electrolytic solution to around 0° C., a method decreasing the concentration of the electrolytic solution to around a few percent, a method increasing the electric current density to around tens $A/dm^2$ are known generally. As the methods for controlling to increase the density of the micropores in the anodizing treatment, a method increasing the concentration of the electrolytic solution, a method raising the temperature of the electrolytic solution, a method decreasing the electric current density, and a method using alternating current with high frequency are also known generally.

<Post-treatment to Control Opening Area of Micropores>

In the fifth aspect of the present invention, post-treatment is performed as required after the anodizing treatment. The post-treatment needs to be performed under conditions that the diameter d and the density$\rho$ of the micropores of the anodized layer after the post-treatment satisfy the expression (i) described above, but the method is not limited.

For example, treatment using acid solution or alkali solution can be used for enlarging the diameter of the micropores. In treatment of the micropores on anodized layers using acid solution such as sulfuric acid, phosphoric acid, their mixture and the like, concentration is preferably 10 to 500 g/L, more preferably 20 to 100 g/L, temperature is preferably 10 to 90° C., more preferably 40 to 70°, and immersion time is preferably 10 to 300 seconds and more preferably 30 to 120 seconds, for stable and uniform treatment. On the other hand, in the treatment of the micropores on the anodized layers using the alkali solution, aqueous solution of sodium hydroxide, potassium hydroxide, lithium hydroxide and the like are used as the alkali solution. pH of the aqueous solution is preferably 11 to 13, temperature is preferably 10 to 90° C., and immersion time is preferably around 5 to 300 seconds.

By combination of these post-treatments and the controlling by selection of conditions for the anodizing treatment described above, desired diameter and density of the micropores can be also obtained.

In the fifth aspect of the present invention, the diameter of micropores d is determined by average of diameter of at least 30 pieces which are read by visual observation on SEM pictures. The SEM pictures are prepared by observing on the surface of presensitized plates with a scanning electron microscope and without vapor deposition after gum on the non-image areas of the plate after recording images are washed off and air-dried. The density of the micropores$\Sigma$ is determined by counting and averaging number of micropores observed in 10 fields of view with 400 nm square, taken out of the SEM pictures taken with 150,000 times in the same way.

<Treatment for Water Wettability>

In the present invention, further treatment for water wettability is preferable to reinforce water wettability.

Treatment for water wettability includes, for example but without limitation, includes a method for treating with alkali metal silicate described in the specification of U.S. Pat. No. 2,714,066 and U.S. Pat. No. 3,181,461, a method for treating with potassium fluorozirconate described in JP-B-36-22063, a method for treating with polyvinyl phosphonic acid described in the specification of U.S. Pat. No. 4,153,461, a method for treating with aqueous solution containing phosphoric acid and inorganic fluorine compounds described in JP-A-9-244227, and a method for treating with aqueous solution containing titanium and fluoride described in JP-A-10-252078 and JP-A-10-263411. Among them, the method for treating with alkali metal silicate (silicate treatment) is preferable.

As the silicate treatment, various public known methods may be adopted. Alkali metal silicate used for the silicate treatment includes, for example, sodium silicate, potassium silicate, and lithium silicate.

The silicate treatment may be performed, for example, by immersing anodized aluminum supports in alkali metal solution, in which concentration of alkali metal silicate is preferably 0.01 to 30 wt %, more preferably 0.01 to 10 wt %, further preferably 0.01 to 5.0 wt %, still further preferably 0.05 to 3 wt %, and pH at 25° C. is preferably 10 to 13, preferably at 4 to 80° C., more preferably 5 to 40° C., and preferably for 0.5 to 120 seconds, more preferably 1 to 60 seconds, further preferably 2 to 30 seconds, still further preferably 2 to 20 seconds. The conditions described above, concentration of alkali metal silicate, pH, temperature, treating time and the like may be selected as appropriate. When pH of aqueous solution of alkali metal silicate is lower than 10, the solution easily becomes gel, and when pH is higher than 13, the anodized layer is likely dissolved. These points must be paid attention.

In the water wettable treatment, hydroxide may be compounded to keep pH of aqueous solution of alkali metal silicate high as required. As the hydroxide, for example, sodium hydroxide, potassium hydroxide and lithium hydroxide are included.

Alkaline earth metal salt and/or the group 4 (IVA) metal salt may also be formulated in the aqueous solution of alkali metal silicate. As the alkaline earth metal salt, water soluble salt such as for example, nitrate of alkaline earth metal (for example, calcium nitrate, strontium nitrate, magnesium nitrate, barium nitrate), sulfate, chloride, phosphate, acetate, oxalate, borate and the like of alkaline earth metal are included. As the group 4 (IVA) metal salt, for example, titanium tetrachloride, titanium trichloride, titanium potassium fluoride, titanium potassium oxalate, titanium sulfate, titanium tetraiodide, zirconium chloride oxide, zirconium dioxide, zirconium oxychloride, zirconium tetrachloride are included. Alkaline earth metal salt and the group 4 (IVA) metal salt may be used alone or in combination of 2 or more. The quantity of the metal salt to be used is preferably 0.01 to 10 wt %, more preferably 0.05 to 5.0 wt %.

Concentration of aqueous solution for treatment using polyvinyl phosphonic acid is preferably 0.01 to 10 wt %, more preferably 0.1 to 5 wt % and further preferably 0.2 to 2.5 wt %. Temperature is preferably 10 to 70° C., more preferably 30 to 60° C. The treatment is performed by immersion in this aqueous solution preferably for 0.5 seconds to 10 minutes, and more preferably 1 to 30 seconds.

Si quantity adsorbed by the silicate treatment is measured with a fluorescent X-ray analyzer and the quantity is preferably about 1.0 to 15.0 $mg/m^2$.

Solubility resistance of the surface of aluminum supports to the alkali developer can be improved by this silicate treatment to restrain elution of aluminum components into the developer and to decrease generation of development residue caused by developer exhaustion.

An example of a treatment process suitable for the second and third aspects of the present invention is shown below.

<Mechanical Graining>

Mechanical graining treatment described in JP-A-6-135175 and JP-B-50-40047 is performed. Mechanical graining treatment is preferably carried out before the first electrochemical graining treatment. Mechanical graining with a rotating nylon brushing roll having 0.2 to 0.9 mm of fiber diameter and slurry liquid supplied to the surface of aluminum plates is advantageous. Such method as spraying the slurry liquid, using a wire brush, transferring asperities of a reduction roll to aluminum plates and the like may be used.

In the mechanical graining treatment, before brushing graining, as required, at first, treatment for removing rolling oil on the surface of aluminum plates, for example, treatment for removing oil using surfactant, organic solvent, alkali solution and the like, may be performed.

Subsequently, brushing graining is performed by using a brush or at least two kinds of brushes having different fiber diameters and supplying abrasive slurry liquid on the aluminum plates. In the brushing graining, a brush used first is called the first brush and a brush used second is called the second brush. In the graining, roll brushes 2 and 4 sandwiching an aluminum plate 1, two supporting rollers 5 and 6, and 7 and 8 for each are placed as indicated in FIG. 1. The two supporting rollers 5 and 6, and 7 and 8 are placed as the shortest distance of outer surfaces of the rollers is less than outside diameters of roll brushes 2 and 4. The aluminum plate 1 is pressed by the roll brushes 2 and 4 and is conveyed at constant speed in the state such as forcing aluminum plate between the supporting rollers 5 and 6, and rollers 7 and 8, and the surface of aluminum plate is preferably brushed by supplying abrasive slurry liquid 3 on the aluminum plate and by rotating the roll brushes.

As brushes used for the present invention, one in which brush materials such as nylon, polypropylene, animal fur, steel wire and the like are planted on roller bases with uniform length and distribution, one in which bundles of fibers of brush materials are planted in small holes on roller bases, one of channel roller type and the like, are preferably used.

Preferable material among them is nylon and preferable fiber length after planting is 10 to 20 mm. Preferable diameter of the fibers is 0.24 to 0.83 mm, more preferable is 0.295 to 0.6 mm. Round cross section of the fibers is preferable. When the diameter of fibers is less than 0.24 mm, scum resistance on shadow areas becomes worse in some case, and when the diameter is over 0.83 mm, resistance to stain developing on blanket cylinders becomes worse in some case. The material of the fibers is preferably nylon including nylon 6, nylon 6.6, nylon 6.10 and the like. Nylon 6.10 is the most preferable in terms of tensile strength, abrasive resistance, dimensional stability by absorbing water, flexural strength, heat resistance, recovery performance and the like.

The number of brushes is preferably 1 to 10, more preferably 1 to 6. Brush roller, as described in JP-A-6-135175, may be used in combination of brush rollers having different diameters of fibers. Supporting rollers having a metal or rubber surface and better straightness tolerance are used. Rotating direction of brush rollers is preferably the same with conveying direction of the aluminum plate shown in FIG. 1, and in the case of using multiple rollers, some of them may rotate reversely.

Abrasives used in the present invention may be publicly known ones. For example, abrasives such as pumice, silica sand, aluminum hydroxide, alumina powder, volcanic ash, Carborundum, emery and their combination may be used. Among them, abrasives having average particle size of 5 to 150 m and specific gravity of 1.05 to 1.3 are preferable.

<First Etching Treatment>

Electrolytic polishing in acid solution or chemical etching in acid solution or alkali solution is performed.

The etching treatment is performed for the purpose of removing rolling oil, stain, natural oxidation layer on the surface of the foregoing aluminum plates (rolled aluminum) and also for the purpose of dissolving edge portions of asperities formed by the mechanical graining to have smooth wavy surface.

Details in such a chemical etching method are described in U.S. Pat. No. 3,834,398. As acid used in the acid solution, fluoric acid, fluorozirconic acid, phosphoric acid, sulfuric acid, hydrochloric acid, nitric acid and the like are included, and these are used alone or in combination, as described in JP-A-57-16918. As alkali used in alkali solution, potassium hydroxide, sodium tertiary phosphate, sodium aluminate, sodium carbonate and the like are included, and these are used alone or in combination, as described in JP-A-57-16918. Concentration of acid solution is preferably 0.5 to 25 wt %, more preferably 1 to 5 wt %. Concentration of aluminum solved in the acid solution is preferably 0.5 to 5 wt %. Concentration of alkali solution is preferably 5 to 30 wt %, more preferably 20 to 30 wt %. Preferable concentration of Aluminum solved in alkali solution is 0.5 to 30 wt %. At the etching in acid solution or alkali solution, preferable liquid temperature and treating time are 40 to 90° C. and 1 to 120 seconds, respectively. Quantity of etching treatment is preferably 1 to 30 $g/m^2$ in solved quantity, more preferably 1.5 to 20 $g/m^2$.

<First Desmutting>

When the first etching is performed in the alkali solution, smut is generated on the surface of aluminum generally. In this case, it is preferable to perform desmutting using phosphoric acid, nitric acid, sulfuric acid, hydrochloric acid, chromic acid or mixed acid of two or more of these. Desmutting time is preferably 1 to 30 seconds. Liquid temperature is from room temperature to 70° C.

Desmutting after electrochemical graining treatment may be skipped. When overflow waste of electrolytic solution used for the electrochemical graining is used, a water washing process after desmutting may be skipped, but the aluminum plate must be handled in a wet state to avoid educing of components in desmutting liquid on dried aluminum plates.

<First Electrolytic Graining (Electrochemical Pregraining in Aqueous Solution Based on Hydrochloric Acid or Nitric Acid) Treatment>

In the second aspect and the third aspect of the present invention, the first electrochemical graining in the aqueous solution based on hydrochloric acid or nitric acid by using alternating current or direct current is carried out as pretreatment in order to perform more uniformly the second electrochemical graining in aqueous solution based on hydrochloric acid or nitric acid, which is performed later.

A treatment process to obtain a support for a lithographic printing plate according to the third aspect of the present invention includes two or more steps of electrochemical graining (also referred to as “electrolytic graining” hereunder). In the second and third aspects of the present invention, when there are two steps of electrolytic graining, one carried out first is called first electrolytic graining and another carried out later is called second electrolytic graining. When there are three or more steps of electrolytic graining, further electrolytic graining step may be included before the first electrolytic graining, between the first electrolytic graining and the second electrolytic graining, or after the second electrolytic graining. The conditions for the further electrolytic graining may be the same as those for the first and the second electrolytic graining or may be different therefrom.

Electrochemical graining treatment in aqueous solution based on hydrochloric acid or nitric acid by using an alternating current or a direct current is performed aiming at obtaining uniform asperities in size and distribution without overlapping.

Aqueous solution based on hydrochloric acid, which may be used for conventional electrochemical graining by using alternating current, can be used, by adding chlorine compounds of 1 g/L or more to saturated concentration in hydrochloric acid solution of 1 to 100 g/L, the chlorine compounds including a chlorine ion such as aluminum chloride, sodium chloride, ammonium chloride, sodium hypochlorite and the like.

It is also allowable that metal contained in aluminum alloy such as iron, copper, manganese, nickel, titanium, magnesium, silica and the like are solved in aqueous solution based on hydrochloric acid. Temperature is preferably 20 to 50° C. and more preferably 30 to 40° C.

Figure 2:
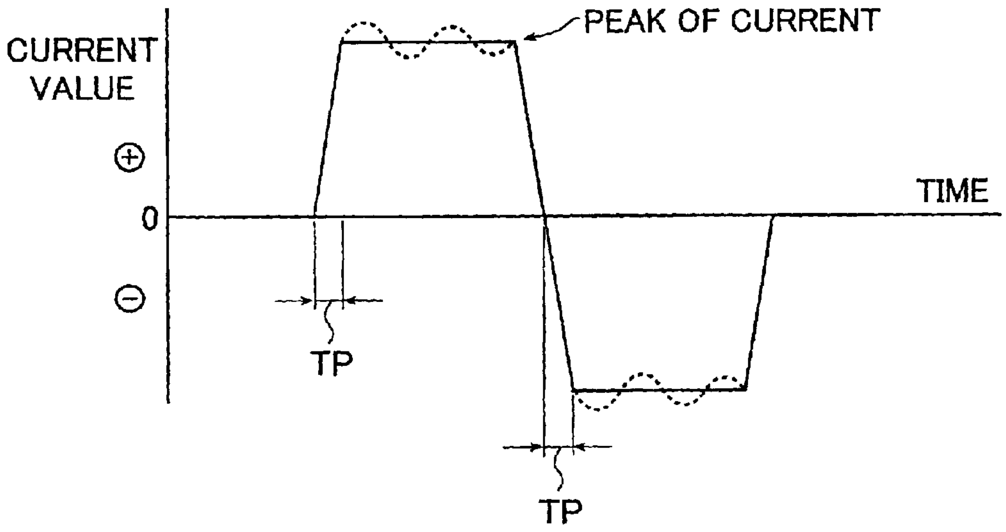
FIG. 2 is a waveform view showing an example of a trapezoidal wave used for electrochemical graining using an alternating current used in the present invention.

Trapezoidal wave as an example of an alternating current used for electrochemical graining in the present invention includes one shown in FIG. 2. A time (TP) necessary for a current value to reach its peak from zero is preferably 0.5 to 2 msec. When the time is shorter than 0.5 msec, non-uniformity in treatment called “chatter mark” easily occurs in the direction perpendicular to the moving direction of aluminum plates. When TP is longer than 2 msec, resistance to uniform graining treatment occurs since the treatment is easily affected by micro ingredients that are typically ammonium ions in the electrolytic solution used for electrochemical graining, and that increase naturally in electrolytic treatment in nitric acid solution. As a result, scum resistance is deteriorated. As a duty ratio of an alternating current with the trapezoidal wave, 1:2 to 2:1 may be used and the duty ratio is preferably 1:1 in the case of an indirect power feeding method in which conduct rollers for aluminum are not used as described in JP-A-5-195300. The frequency of the trapezoidal alternating current is preferably 50 to 70 Hz in the second aspect of the present invention. In the case of the frequency lower than 50 Hz, a main electrode made of carbon is easily dissolved, and in the case of the frequency higher than 70 Hz, inductance components on electric power source circuits give influence easily, causing a high power source cost. This process may be replaced by electrochemical graining using a direct current as described in JP-A-1-141094. The frequency of a trapezoidal alternating current is preferably 50 to 150 Hz in the third aspect of the present invention, more preferably 60 to 120 Hz.

This first electrolytic graining process may be electrochemical graining using a direct current as described in JP-A-1-141094. In the direct current graining, graining is carried out electrochemically using direct current voltage in acid solution. Electrochemical graining by using a direct current voltage in acid solution is performed by applying a direct current voltage between anodes and cathodes placed alternately in an electrolytic cell filled with acid solution and by passing an aluminum plate while keeping some distance to the anodes and the cathodes.

As acid solution, one to be used in conventional electrochemical graining by using an alternating current may be used. For example, aqueous solution based on hydrochloric acid, nitric acid, and the like may be used. Among them solution based on nitric acid is preferable. In the case of solution based on nitric acid, nitric acid compounds containing nitrate ion such as aluminum nitrate, sodium nitrate, ammonium nitrate may be used. One or more kinds of aluminum salt, ammonium salt and the like are also preferably mixed at the content of 1 to 150 g/L. Incidentally, ammonium ions increases naturally in nitric acid solution by electrolytic treatment. It is also allowable that metals contained in an aluminum alloy such as iron, copper, manganese, nickel, titanium, magnesium, silica are dissolved in acid solution. Further ammonium ion, nitrate ion and the like may be added.

Concentration of acid solution is preferably 1.0 g/L or more to saturated concentration, and more preferably 5 to 100 g/L. When the concentration is less than 1.0 g/L, conductivity of the liquid becomes lower to raise electrolytic voltage in some case. When the concentration is over 100 g/L, problems with erosion at the apparatus occur in some case. The temperature of acid solution is also preferably 30 to 55° C., more preferably 35 to 50° C., and further preferably 40 to 50° C. When the temperature is less than 30° C., conductivity of the liquid becomes lower to raise electrolytic voltage in some case. When the temperature is over 55° C., problems with erosion at the apparatus occur in some cases.

As the cathode, for example, platinum, stainless, carbon, titanium, tantalum, niobium, zirconium, hafnium or alloy of these may be used. In the case of using titanium for cathodes, the surface of titanium may be coated by platinum metal or platinum alloy and then may be heat-treated at 400 to 10000° C. for 30 to 60 minutes to create cathodes with better erosion resistance. The surface of the cathode is preferably close to mirror finished surface as much as possible to prevent a rise of electrolytic voltage by deposition of hydroxides.

In the present invention, direct current voltage includes not only continuous a direct current voltage but also ones rectified a commercial alternating current with diodes, transistors, thyristors, GTOs and the like, and a rectangular pulse direct current and the like, and also the direct current voltage means voltage without reverse of polarity as general definition for a direct current. In a particular continuous direct current voltage with the ripple ratio 10% or less is preferable. Current density is preferably 20 to 200 $A/dm^2$, more preferably 50 to 120 $A/dm^2$. Quantity of electricity applied to aluminum plates in electrochemical graining is preferably 10 to 1000 $C/dm^2$, and more preferably 40 to 600 $C/dm^2$.

In the graining treatment by using a direct current, anodes and cathodes may be composed of one substance each or combination of multiple electrode pieces. Electrodes composed of multiple electrode pieces in combination are preferable since those are prepared simply and at low cost and moreover can create uniform current distribution. In the preparation by combining multiple electrodes, for example, multiple electrodes are placed in parallel with specified distance or multiple electrodes are placed in parallel sandwiching insulators of around 1 to 5 mm. The shape of these electrodes is not limited specifically and rods with rectangular cross section or rods with round cross section may be used. As the insulators, materials having electrical insulating property and chemical resistance are preferable and polyvinyl chloride, rubber, Teflon, FRP and the like are used. Length of anodes and cathodes L (m) is preferably 0.05 to 5 V (m) respectively when the passing speed of an aluminum plate is defined in V (m/sec).

As the anode, electrodes prepared by plating or cladding bulb metals such as titanium, tantalum and niobium with platinum metal or platinum alloy, and ferrite electrodes may be used. Ferrite electrodes are made by jointing two or more electrodes in butting or splicing due to difficulty in making longer electrodes. In this case, since the joint portions cause processing unevenness, the joint portions are placed in the staggered arrangement so that each joint portions are not placed on the same position in the direction perpendicular to the moving direction of aluminum plates. Distance between the anodes and the aluminum plates is preferably 10 to 50 mm and more preferably 15 to 30 mm.

For an apparatus used for the electrochemical graining using direct current, it is advantageous to use a graining system in that one or more pairs of anodes and cathodes are placed alternately in an aqueous acid solution over which an aluminum plate is to be passed.

The apparatus for use in the electrochemical graining treatment using direct current voltage in preparing a support for a lithographic printing plate of the second and the third aspects according to the present invention will be explained using figures.

Figure 3:
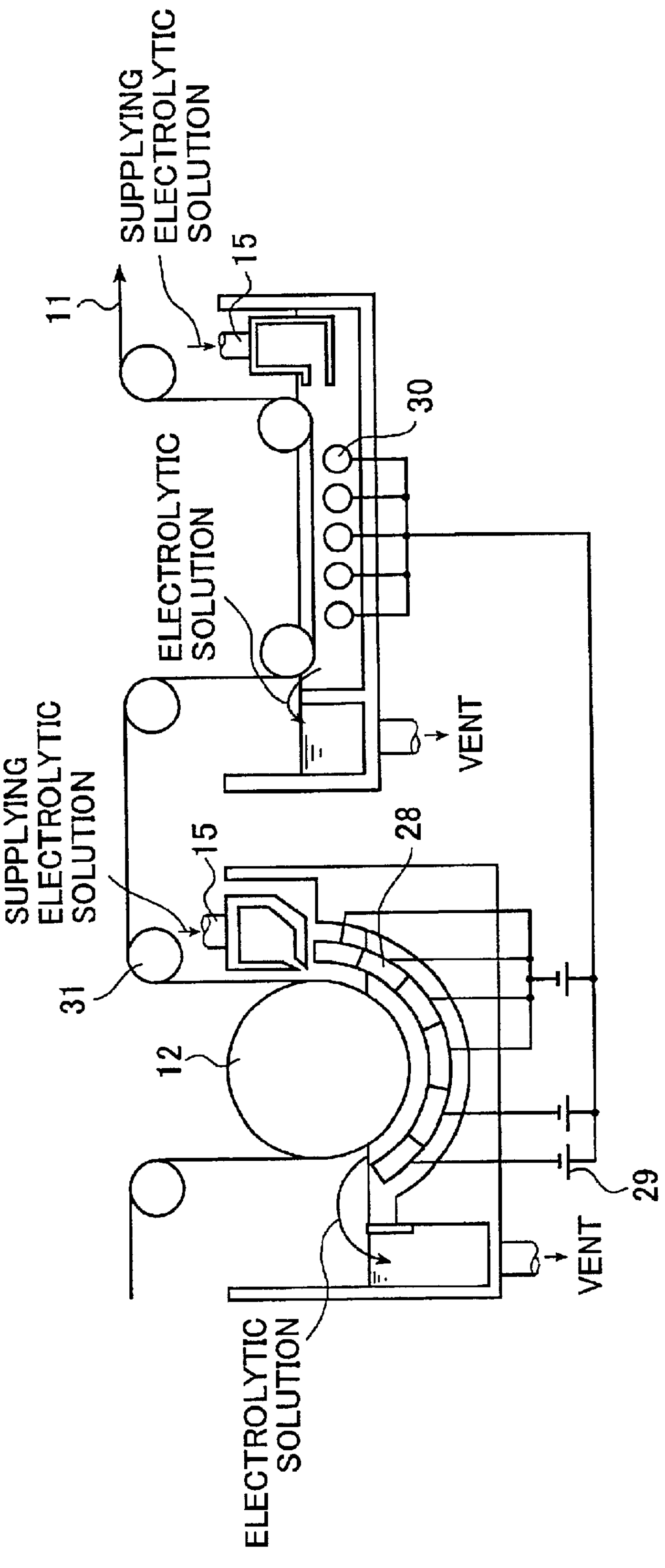
FIG. 3 is a side view showing an example of anode and cathode electrolytic treatment cell arrangement used for DC graining used in the present invention.
Figure 4:
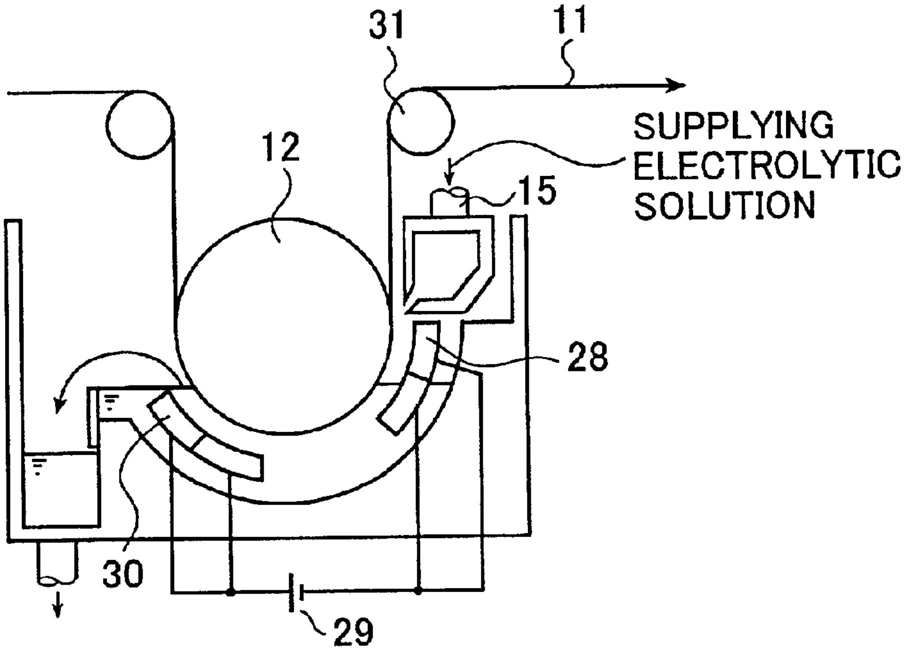
FIG. 4 is an explanatory view illustrating an example of an electrolytic treatment cell structure including cathode and anode electrodes arranged in one cell used in the present invention.

The apparatus for the graining treatment using direct current voltage shown in FIG. 3 is first equipped with an electrolytic bath where the anodic electrolytic treatment of an aluminum plate is carried out, and then with an electrolytic bath where the cathodic electrolytic treatment of an aluminum plate is carried out. The apparatus shown in FIG. 4 is equipped with an anode for carrying out the cathodic electrolytic treatment of an aluminum plate and a cathode for carrying out the anodic electrolytic treatment of an aluminum plate respectively in a single electrolytic bath. In FIGS. 3 and 4, 11 represents an aluminum plate, 12 represents a radial drum roller, 15 represents a supplying opening of the electrolytic solution, 28 represents a cathode, 29 represents a direct current electric source, 30 represents an anode and 31 represents a pass roll.

<Second Etching Treatment>

An electrolytic polishing treatment in an aqueous acid solution, or a chemical etching treatment in an aqueous acid solution or an aqueous alkali solution is carried out.

The second etching treatment is carried out for the purpose of removing quickly the smut formed by the previous step of electrochemical graining. This second etching treatment enables honeycomb pits to be formed uniformly by the electrochemical graining carried out in a later step. The quantity of the etching is preferably 0.5 to 10 $g/m^2$. Composition of aqueous solution, temperature, treatment time and the like used in the etching are selected from the range described above on the first etching treatment.

<Second Desmutting Treatment>

This is the same as the first desmutting treatment described above.

<Second Electrolytic Graining (Electrochemical Surface Roughening in an Aqueous Solution Based on Hydrochloric Acid or Nitric Acid) Treatment>

An alternating current graining forms honeycomb pits by conducting the electrochemical graining using an alternating current in an aqueous acid solution. The formation of this honeycomb pits gives a surface that is double-structured with the surface obtained from the first electrolytic graining treatment. This can improve the scum resistance and the press life.

For the aqueous acid solution, those used in the conventional electrochemical graining treatment can be used, for example, aqueous solutions based on hydrochloric acid, nitric acid and the like. Among them, an aqueous solution based on nitric acid is preferred. In the case of the aqueous solution based on nitric acid, nitric acid compounds containing nitrate ion, such as aluminum nitrate, sodium nitrate and ammonium nitrate can be used. Also, it is preferable to mix at least one kind such as aluminum salt, ammonium salt and the like in the quantity of 1 to 150 g/L. Ammonium ion is also increased spontaneously by the electrolytic treatment in the nitric acid aqueous solution. Also, metals included in an aluminum alloy such as iron, copper, manganese, nickel, titanium, magnesium and silica may be dissolved in the aqueous acid solution. Further, ammonium ion, nitrate ion and the like may also be added.

The concentration of the aqueous acid solution is preferably not less than 1.0 g/L and up to the saturated concentration, more preferably 5 to 100 g/L. If the concentration is less than 1.0 g/L, resultant poor conductivity of the liquid may raise the electrolytic voltage. If the concentration exceeds 100 g/L, a problem may occur in the anticorrosion property of the equipment. Also, the temperature of the aqueous acid solution is preferably set between 30 and 55° C., or more preferably between 40 and 50° C. In case of the temperature being less than 30° C., resultant poor conductivity of the liquid may raise the electrolytic voltage. If the temperature exceeds 55° C., a problem may occur in the anticorrosion property of the equipment.

A trapezoidal wave that is an example of alternating current used for the electrochemical graining according to the present invention refers to the one that is shown in FIG. 2. A time (TP) necessary for a current value to reach its peak from zero is preferably 0.5 to 2 msec. If it is shorter than 0.5 msec, the processing unevenness called chatter mark occurring perpendicularly to the running direction of the aluminum plate is apt to occur. If the TP is longer than 2 msec, a uniform graining treatment becomes hard to be accomplished, because it becomes vulnerable to the influence of very small quantities of ingredients represented by such as an ammonium ion in the electrolytic solution used for the electrochemical graining, being spontaneously increased through the electrolytic treatment in a nitric acid solution. As a result, the scum resistance tends to be lowered. While a duty ratio of trapezoidal AC from 1:2 to 2:1 can be used, a duty ratio of 1:1 is preferred in the indirect electric power supplying system using no conductor rolls for aluminum as described in JP-A-5-195300. The frequency of trapezoidal AC of 50–70 Hz is preferred. With the frequency of lower than 50 Hz, the main pole of carbon electrode becomes apt to be dissolved, and with that of more than 70 Hz, it becomes apt to be influenced by the inductance component on the power circuit, thus resulting in a high cost power source.

This process is also suitable for the electrochemical graining treatment using direct current such as being described in JP-A-1-141094.

Figure 5:
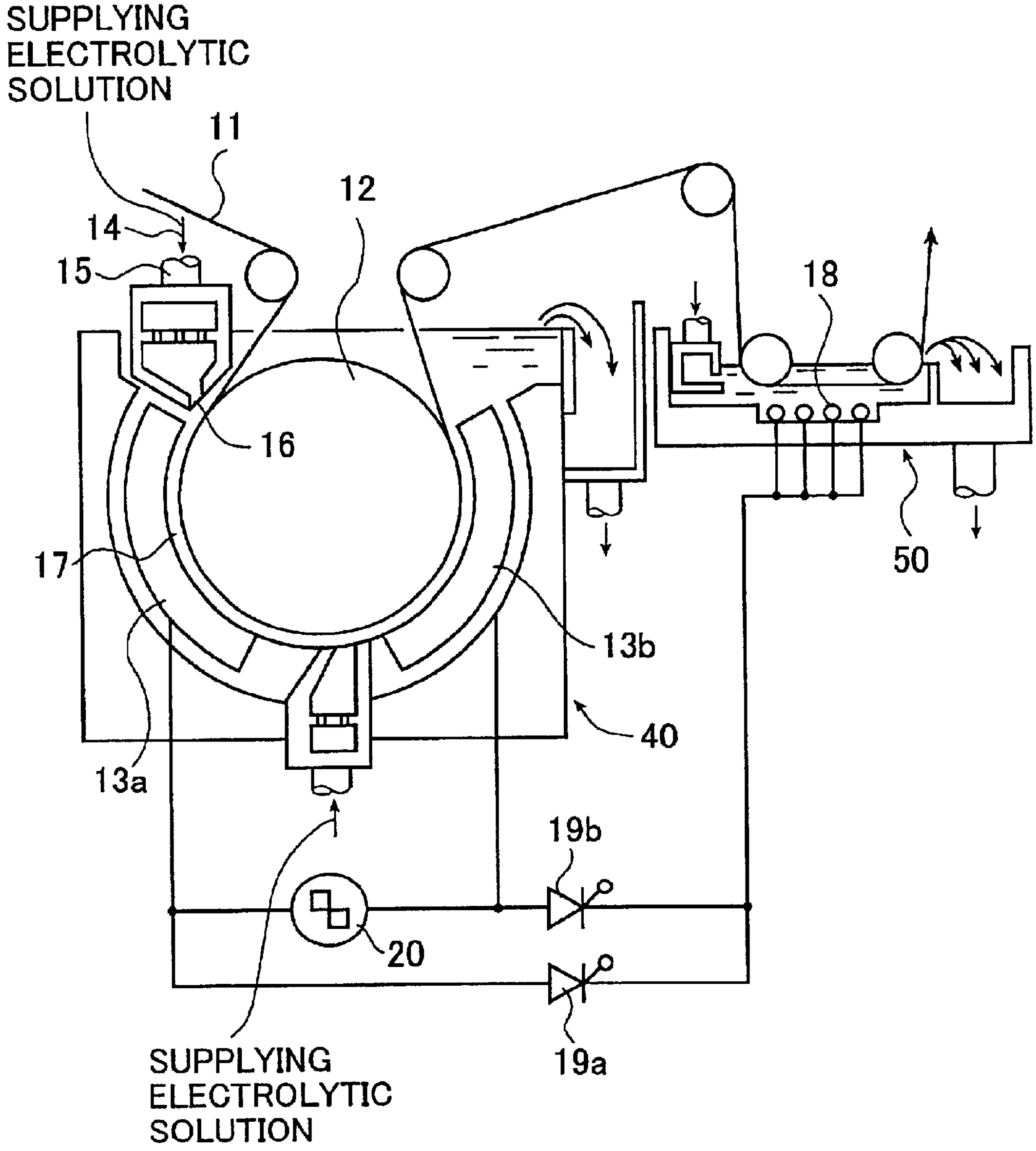
FIG. 5 is a side view showing an example of a radial cell used for AC graining used in the present invention.

FIG. 5 illustrates preferable equipment of a radial type for conducting the electrochemical graining with the use of alternating current according to the present invention. In FIG. 5, 11 represents an aluminum plate, 12 represents a radial drum roller supporting the aluminum plate, 20 represents an alternating current power source, 40 represents a main electrolytic cell and 50 represents a supplementary anode cell. The aluminum plate is running keeping a constant clearance from the main electrodes 13*a* and 13*b* made of carbon and a supplementary anode 18 of ferrite, platinum or the like that is provided in order to prevent the main electrode carbon to be dissolved. A proper level of the clearance is generally 3 to 50 mm. The ratio of the treatment length of the main electrode and the supplementary electrode and the ratio of the length of the main electrodes 13*a* and 13*b* are different depending on the desired electrolytic conditions. The ratio of the length of the main electrodes 13*a* and 13*b* can be selected from the range from 1:2 to 2:1, however, making it 1:1 as much as possible is preferred. The ratio of the treatment length of the main electrode 13*a* or 13*b* and the supplementary electrode 18 is preferably set between 1:1 and 1:0.1. Also, it is preferable to provide the heads of the electrodes 13*a* and 13*b* respectively with a soft start zone conducting a low current density processing illustrated in FIG. 6 as described in JP-B-63-16000, in order to suppress the lateral-striped processing unevenness called chatter marks occurring perpendicular to the running direction of the aluminum plate. The main electrode 13 is hard to be provided with R (bend) along the radial drum roller 12. So, it is usual to arrange them by putting nonconductors with the thickness of 1 to 5 mm called insulators in-between as described in JP-A-5-195300.

The current being flowed through the supplementary electrode is diverted from the power source being controlled by a commutating element 19 or a switching element to render desired current strength. As commutating element 19, thyristors 19*a* and 19*b* are preferable, which are able to control the current flowing through the supplementary anode by a firing angle. Diverting the current to the supplementary anode restrains dissolution of the carbon electrode of the main electrode, and the grained form in the electrochemical graining process can be controlled. The current ratio of the current flowing through the carbon electrode to the current flowing through the supplementary anode is preferably set from 0.95:0.05 to 0.7:0.3.

Figure 6:
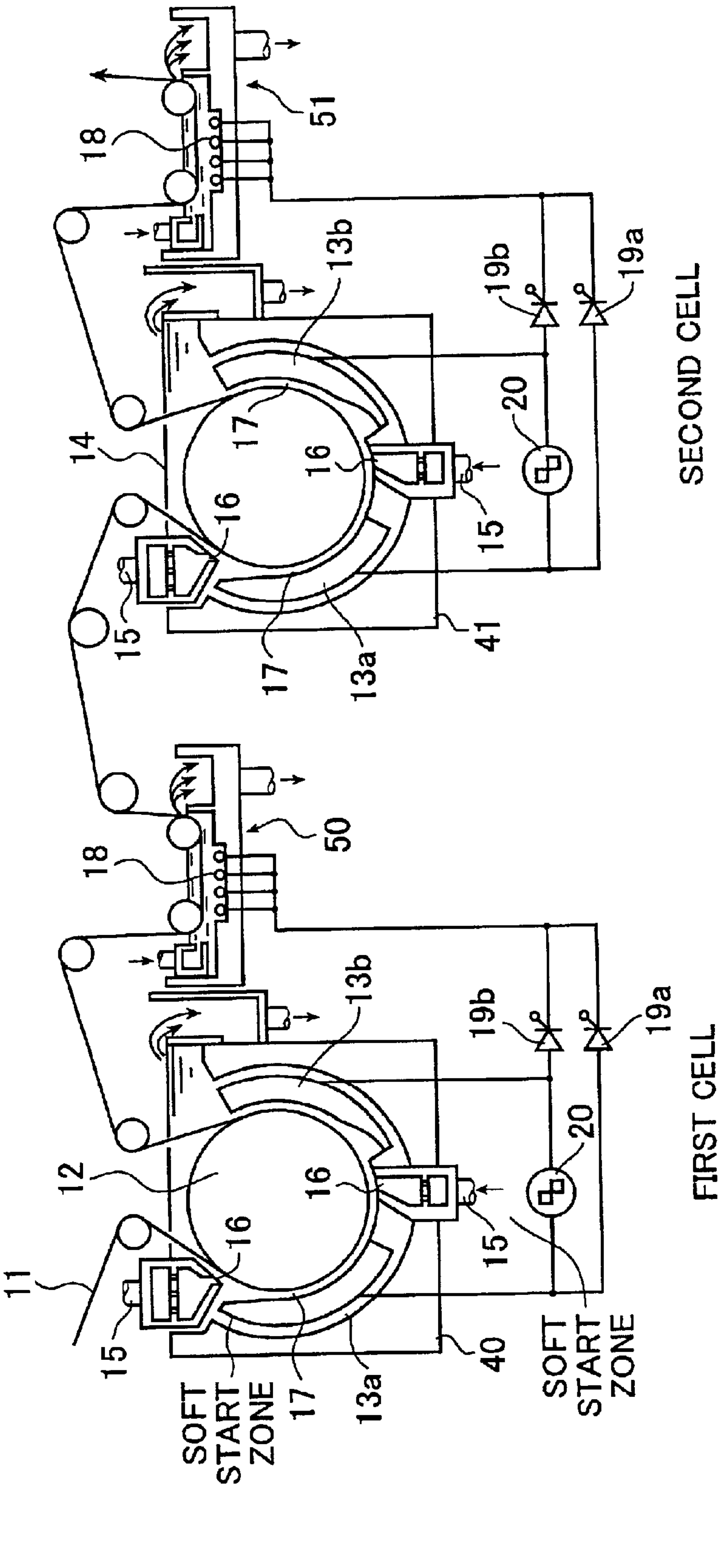
FIG. 6 is a side view showing an example of serial arrangement of two radial cells used for AC graining used in the present invention.

The liquid flow may be either parallel or counter to the aluminum plate progress, however, the counter flow generates lesser processing unevenness. Electrolytic treatment bath 14 enters into the electrolytic bath supplying opening 15, and enters into the cavity via the distributor so as to be uniformly distributed to the whole width direction of the radial drum 12, and is gushed from the slit 16 to the electrolytic bath passage 17. Two or more sets of electrolytic equipment of FIG. 5 can be used in tandem as shown in FIG. 6. In FIG. 6, reference numeral 41 represents a main electrolytic cell and 51 represents a supplementary anodic cell.

<Third etching treatment>

The third etching treatment is conducted in order to remove the smut formed on the surface of the aluminum plate and improve the resistance to stain developing on the blanket and scum resistance.

Hydrofluoric acid, fluorozirconic acid, phosphoric acid, sulfuric acid, hydrochloric acid, nitric acid and the like are used for the aqueous acid solution. Sodium hydroxide, potassium hydroxide, sodium tertiary phosphate, sodium aluminate, sodium silicate, sodium carbonate and the like are used for the aqueous alkali solution. These aqueous solutions of acid or alkali can be used alone or as a mixture of two or more of them respectively. The quantity of etching is set preferably as 0.02 to 3 $g/m^2$, and more preferably 0.1 to 1.5 $g/m^2$. The etching is carried out in a range of 0.05 to 40 wt % of acid or alkali concentration, 40 to 100° C. of liquid temperature and 5 to 300 seconds of processing time, to make the above etching quantity in the range of 0.02 to 3 $g/m^2$.

After this third etching treatment is carried out, asperities of 0.1 $\mu$m or less in depth have been formed inside the honeycomb pits of an average diameter of 0.5 to 2 $\mu$m as described in JP-A-3-104694.

A slight electrochemical etching treatment may be also combined by applying direct current to the aluminum plate set as a cathode in an aqueous solution of neutral salt.

<Third Desmutting Treatment>

When a slight etching of an aluminum plate surface is carried out, some indissoluble matter, that is smut, is produced on the surface. The smut can be removed by washing with phosphoric acid, sulfuric acid, nitric acid, chromic acid or a mixture thereof. Conditions of the third desmutting treatment can be selected from the conditions described in the first desmutting treatment. In particular, it is preferable to treat by using an aqueous solution based on sulfuric acid at a liquid temperature of 50 to 70° C.

<Anodizing Treatment>

In order to enhance the water receptivity and the abrasion resistance, an anodizing treatment is further provided.

Any electrolyte producing an oxidized porous layer can be used for the anodizing treatment of an aluminum plate, and typically, sulfuric acid, phosphoric acid, oxalic acid, chromic acid or a mixture thereof are used. Concentration of those electrolytes can be properly determined depending on the kind of electrolyte used. The conditions of the anodizing cannot be generally specified because it changes variously depending on the electrolyte, but typically, ranges of 1 to 80 wt % of concentration of electrolyte solution, 5 to 70° C. of liquid temperature, 1 to 60 A/dm$^2$ of current density, 1 to 100 V of voltage and 10 seconds to 5 minutes of electrolytic time are suitable.

In the sulfuric acid method, treatment is usually carried out with direct current, but alternating current can also be used. The electrolytic treatment is carried out by using sulfuric acid of a concentration of 5 to 30 wt %, at a temperature of 20 to 60° C. for 5 to 250 seconds. Preferably the electrolyte solution contains aluminum ion. Further, the current density at the time is set preferably 1 to 20 A/dm$^2$.

In case of the phosphoric acid method, the treatment is preferably carried out at a concentration of 5 to 50 wt %, a temperature of 30 to 60° C. and a current density of 1 to 15 A/dm$^2$ for 10 to 300 seconds.

The amount of anodized layer is preferably 1.0 g/m$^2$ or more, more preferably, 2.0 to 6.0 g/m$^2$. If the amount of anodized layer is less than 1.0 g/m$^2$, the press life becomes insufficient and the non-image areas of a lithographic printing plate become apt to be scratched which may result in occurrence of so-called "scratch stain" that is the ink adhering to the scratched part at the time of printing.

<Treatment for water wettability>

The aluminum surface is provided with a treatment of making it water wettable if necessary after the provision of the anodizing treatment.

The treatment for water wettability according to the present invention includes the alkali metal silicate (e.g. sodium silicate aqueous solution) method, for example, such as those described in U.S. Pat. Nos. 2,714,066; 3,181,461; 3,280,734 and 3,902,734. In this method a support provided with a dipping treatment or an electrolytic treatment in an aqueous solution of sodium silicate. In addition, such methods as treating with potassium fluorozirconate disclosed in JP-B-36-22063, and polyvinyl phosphonic acid as disclosed in U.S. Pat. Nos. 3,276,868; 4,153,461 and 4,689,272 are used. Those provided with a pore sealing treatment after the electrochemical graining and anodizing treatment are also preferable. Such pore sealing treatment is carried out by dipping into a hot aqueous solution containing hot water and inorganic salts or organic salts and by steam bathing and the like.

Figure 7:
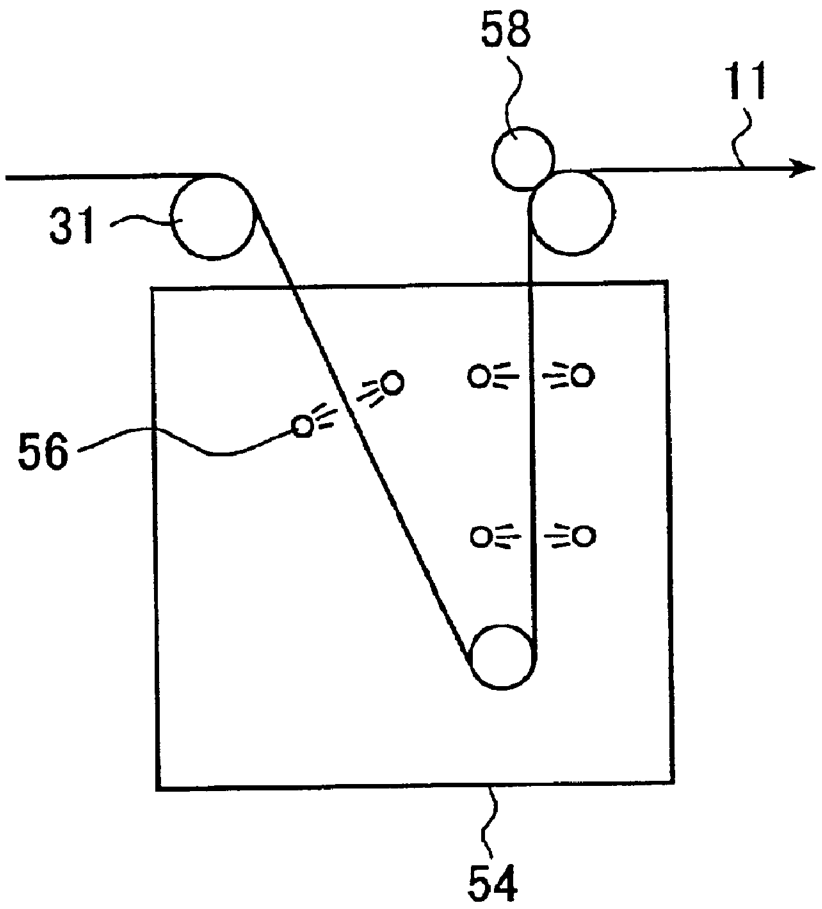
FIG. 7 is a schematic view of a treatment cell used for chemical etching, desmutting, and washing by water spraying.

An apparatus for use in the chemical etching treatment, the desmutting treatment, the water washing treatment and the treatment for water wettability in the preparing of a support for a lithographic printing plate of the second and third aspects of the present invention described above can be the one of dipping, or spraying such as, for example, illustrated in FIG. 7. In FIG. 7, 54 represents a processing cell, 56 represents spraying nozzles and 58 represents a nip roller.

Also, an aluminum plate that has passed through the electrochemical graining treatment cell, the chemical etching cell, the desmutting treatment cell, the water washing treatment cell and the water wettability treatment cell in the preparing of a support for a lithographic printing plate of the second and third aspects of the present invention described above can be provided with each of the treatments uniformly spreading to the width direction of the aluminum plate by squeegeeing the solution with the nip roller.

The support for a lithographic printing plate of the present invention can be either of the ones that only one side is treated or both sides are treated. When it is the one that only one side is treated, the reverse side may be applied with a back coat layer for the purpose of preventing the aluminum to be dissolved at the time of development.

For details of each treatment described in each of the above items, well-known conditions can be employed suitably. Also, JP-A-9-109570, the application of the present applicant, and the contents of other literature cited herein are incorporated herein by reference.

The support for a lithographic printing plate of the second aspect of the present invention obtained by treatments in the above processes has the following surface characteristics:

1) Regarding the surface of the support, $R_a$ is 0.3 to 0.5 μm, preferably 0.35 to 0.45 μm, where $R_a$ refers to an arithmetic average roughness which represents the surface roughness. The arithmetic average roughness is defined in JIS B0601-1994. Here, the cutoff value and the evaluation length applied were 0.8 mm and 4 mm respectively.

When the average roughness is in the above range, the halftone dots hardly interlink even if the fountain solution is reduced, and the local residual layers on non-image areas disappear.

2) Regarding the surface of the support, $R_z$ is 3.0 to 6.0 μm, preferably 3.5 to 5.0 μm, where $R_z$ refers to a 10-point average roughness which represents the surface roughness. This refers to a value expressed with micrometer (μm) that is obtained as follows: extract standard lengths out of the roughness curve to the direction of the mean line, then measure the extracted parts in the direction of longitudinal magnification from the mean line, then the average of absolute values of peak heights from the highest to the fifth peak and the average of absolute values of ravine depths from the deepest to the fifth ravine, and then sum up the both. This is defined in JIS B0601-1994. Here, the standard length of 0.8 mm and the evaluation length of 4 mm were applied.

When the 10-point average roughness is in the above range, the halftone dots hardly interlink even if the fountain solution is reduced, and the local residual layers on non-image areas disappear.

3) Regarding the surface of the support, PC is 15 or more per millimeter, preferably 20 or more per millimeter when the set value is 0.3 to 0.3 μm. Here, Pc refers to the number of peaks on the roughness curve. This refers to the counted number expressed as the number per millimeter that is obtained as follows: put a certain standard level (0.3 μm) in both positive and negative directions from the center line of the roughness curve, then count one when the curve crosses the positive standard level (0.3 μm) after crossing the negative standard level (−0.3 μm), and repeat this counting until reaching the measuring length (6 mm).

When the peak number $P_c$ is in the above range, the fine adjustment of the amount of the fountain solution on the plate can be easily performed.

Also, preferably, the surface of the support has an 85-degree surface gloss as defined in JIS Z8741-1997 of not more than 30, and more preferably, of 15 to 30.

When it is in the above range, fine adjustment of the amount of the fountain solution at the time of printing can be performed easily.

Also, the support for a lithographic printing plate of the third aspect of the present invention obtained by treatments in the above processes has the following surface characteristics:

1) Regarding the surface of the support, it has 35 to 60, or preferably 40 to 55 waves with the depth of 0.3 μm or deeper and five or less, or preferably two or less waves with the depth of 1.0 μm or deeper in the filtered waviness curve measured with the cutoff of 0.8 μm and the evaluation length of 6 mm based on JIS B0610-1987.

When the number of wave with the depth of 0.3 μm or deeper is 35 to 60, fine adjustment of the amount of the fountain solution on the plate can be performed easily and the halftone dots hardly interlink with each other even if the fountain solution is reduced. Also, when the number of the wave with the depth of than 1.0 μm or deeper is five or less, the local residual layers on the non-image areas disappear.

2) Regarding the surface of the support, it has the average roughness of 0.35 to 0.5 μm, or preferably 0.35 to 0.45 μm, measured with a cut-off value of 0.8 mm and an evaluation length of 6 mm based on JIS B0601-1994.

When it is in the above range, fine adjustment of the amount of the fountain solution on the plate can be performed easily and the halftone dots hardly interlink with each other even if the fountain solution is reduced.

3) In the whole surface of the support it has uniform honeycomb pits with diameters of 0.5 to 2 μm.

By this, fine adjustment of the amount of the fountain solution on the plate can be performed easily and the local residual layers on the non-image areas disappear.

Also, preferably, the surface of the support has an 85-degree surface gloss as defined in JIS Z8741-1997 of not more than 30, and more preferably, of 15 to 30.

When it is in the above range, fine adjustment of the amount of fountain solution at the time of printing can be performed easily.

The manufacturing method of a support of a lithographic printing plate according to the present invention is characterized in that:

an aluminum plate is treated by a treatment process having at least two steps of electrochemical graining and a step of etching or desmutting between the steps of electrochemical graining;

wherein, by one of the steps of electrochemical graining, a surface is produced that has 35 to 60 waves with the depth of 0.3 μm or deeper and no more than five waves with the depth of 1.0 μm or deeper in the filtered waviness curve measured with the cut-off of 0.8 mm and the evaluation length of 6 mm based on JIS B0610-1987, before another electrochemical graining step is further carried out.

For example, if it has two steps of electrochemical graining processes, it has a feature in realizing the above surface characteristics owing to the first electrochemical graining process (the first electrolytic graining process).

According to this method, the manufacturing of a support for a lithographic printing plate, which is less likely to develop stain on the blanket cylinder, has no local residual layer on the non-image areas, is easy to control fine adjustment of the amount of the fountain solution at the time of printing, and is less likely rendering the ink to spread when fountain solution is reduced, preferably a support for a lithographic printing plate of the third aspect of the present invention is easily performed.

Also, the support of a lithographic printing plate of the fourth aspect of the present invention obtained by processing with the above treatment processes has following surface characteristics.

1) No more than 10 concave portions with the width of not less than 8 μm or the maximum depth in the direction perpendicular to the width being not less than 1.7 μm are present in 1 mm.

2) A support for a lithographic printing plate with 30 or less of the 85-degree surface gloss as defined in JIS Z8741-1997 is provided.

In the fourth aspect of the present invention, the observation of a cross-sectional shape is conducted as follows.

To obtain a shape of a cross section, first, a piece of the support is buried in resin and a method of grinding it in the direction perpendicular to the surface of the support or a method of cutting it out with a microtome is used. Any grinding method is applicable, however, to conduct so-called 'mirror polishing' is preferable because it is suitable for the observation at high magnification.

Observation of the cross-sectional shape is performed on its picture photographed from the frontal direction of the cross section using an ordinary electron microscope. The photographing magnification is usually in the extent of about 3000 to about 10000 times and is selected optionally adapting to the size of the concave portions in order to facilitate recognition of the width and depth of the concave portions. The photographing of the picture is performed so that the observation range becomes at least 1 mm or more by moving the sample in accordance with the range to be photographed. A suitable way to confirm the state of the concave portions on the support for a lithographic printing plate of the fourth aspect of the present invention is a way of observing five or more places at random in the inner part of the support where some 100 mm of the edge portion thereof in the direction of its width are excluded, counting the number of concave portions with the width of not less than 8 μm or the maximum depth in the direction perpendicular to the width being not less than 1.7 μm, and averaging them.

Definitions of "width" and "maximum depth perpendicular to the width" of the concave portion in the present invention are provided depending on the way of measuring the electron microscopic photographs directly as described above. Accordingly, the "width" of the concave portion persistently refers to the distance in a straight line from one end to another end of the hollow in the cross sectional picture. Needless to say, the straight line does not parallel the surface of the plain aluminum, when the concave portion does not open in the direction perpendicular to the surface of the plain aluminum. Also, the "maximum depth perpendicular to the width" persistently means the depth at the position where the depth in the direction perpendicular to the straight line of the above "width" of the concave portion becomes maximum, accordingly, when the concave portion is not a symmetrical shape, it does not necessarily accord with the depth provided by a perpendicular bisector of the above-described straight line.

For concave portion formed by two or more pits being overlapped each other, all of the overlapped pits are regarded as one concave portion, and the "width" and the "maximum depth perpendicular to the width" of the concave portion are measured.

The number of pits (or concave portions or dents) per unit length and the width and depth of them can be controlled by conventional methods by means of adjusting conditions of the surface treatments such as the above-described graining treatments and etching treatments.

In the fourth aspect of the present invention, the measurement of the 85-degree surface gloss is carried out as follows.

The 85-degree surface gloss of the support for a lithographic printing plate of the fourth aspect of the present invention can be determined based on the measuring methods of the "85-degree surface gloss" in the "mirror surface gloss" as defined in JIS Z8741-1997. In a practical measurement, publicly known variable gloss meters, for example, Digital Variable Gloss Meter UGV-4K from SUGA Test Instruments Co. may be used. While the 85-degree surface gloss for untreated aluminum plates is in the extent of 90 to 140, after providing each of the above surface treatments, it becomes substantially to the extent of 10 to 30 and conforms to the range prescribed in the fourth aspect of the present invention. However, if it exceeds 30 due to the surface treatment conditions, it can be readily decreased to below 30 by adjusting the treating conditions of the electrochemical graining treatment.

When the 85-degree surface gloss is 30 or less, fine adjustment of the amount of water at the time of printing can be performed easily by the synergetic effect with the function of the treatment for water wettability of the surface, owing to the contribution of fine asperities of the surface to the water receptivity. It is undesirable that the 85-degree surface gloss exceeds 30, because this characteristic may not be manifested sufficiently in this case.

[Presensitized Plate]

A presensitized plate in accordance with each of the aspects of the present invention can be obtained by providing photosensitive layers over the support for a lithographic printing plate of the present invention as described below.

A photosensitive presensitized plate in accordance with the second and third aspects of the present invention can be obtained by providing conventionally known photosensitive layers over a support for a lithographic printing plate in accordance with the second and third aspects of the present invention. A presensitized plate in accordance with the second and third aspects of the present invention exhibits excellent performance when it is converted to a lithographic printing plate provided with the prepress processing.

Photosensitive materials used for this photosensitive layer are not particularly limited and those used generally in the photosensitive lithographic printing plates can be used. For example, each of those described in JP-A-6-135175 can be used. Before application of the photosensitive layer, an organic undercoat layer (intermediate layer) is provided if necessary. For the organic undercoat layer used in this undercoat layer, those conventionally known can be used. For example, those described in JP-A-6-135175 can be used. The photosensitive layer can be either a negative working type or a positive working type.

Also, a heat-sensitive presensitized plate in accordance with the second and third aspects of the present invention can be obtained by providing heat-sensitive layers over a support for a lithographic printing plate in accordance with the second and third aspects of the present invention. The heat-sensitive layer can be either a negative working type or a positive working type.

Also, a presensitized plate in accordance with the second and third aspects of the present invention can be obtained by providing a photosensitive layer (recording layer) used for presensitized plates in accordance with the first, fourth and fifth aspects of the present invention to be described later over the support for a lithographic printing plate in accordance with the second and third aspects of the present invention. In this case, an intermediate layer readily soluble in alkali that will be described later can also be provided.

On the surface of the photosensitive layer formed as above, a mat layer may also be provided so that the vacuuming time on the contact exposure using a vacuum frame for printing is shortened and lack of sharpness in printing is prevented. More particularly, methods of providing a mat layer such as described in JP-A-50-125805, JP-B-57-6582 and JP-B-61-28986, and methods of thermal deposition of solid powder such as described in JP-A-62-62337 are cited.

Also, a presensitized plate in accordance with the first aspect of the present invention can be obtained by providing, in order, an intermediate layer readily soluble in alkali that will be described later and a photosensitive layer that can become alkali-soluble by heating that will be described later, over a support for a lithographic printing plate used for a presensitized plate in accordance with the first aspect of the present invention.

Further, presensitized plates in accordance with the fourth and fifth aspects of the present invention can be obtained respectively by providing a recording layer containing infrared absorbent being described later and a high-molecular compound insoluble in water and soluble in an alkali aqueous solution also being described later that increases in its solubility to an alkali developer with infrared laser exposure, over a support for a lithographic printing plate in accordance with the fourth and fifth aspects of the present invention. They may have an intermediate layer readily soluble in alkali between the recording layer and the support.

Following are descriptions on the intermediate layer readily soluble in alkali and the photosensitive layer that can become alkali-soluble by heating that are used for the presensitized plate of the present invention (herein after refers to the first through fifth presensitized plates in accordance with the present invention as a generic term.)

<Intermediate Layer>

While the intermediate layer readily soluble in alkali in the presensitized plate of the present invention is not particularly limited as far as it is readily soluble in alkali, it is preferred to contain polymers including monomers having acid groups and it is more preferred to contain polymers with monomers having acid groups and including monomers having onium groups. Note that, the presensitized plate of the present invention includes, besides the one that is constituted of two layers such as an "intermediate layer" and an "photosensitive layer" as described below, the one that is constituted of only one photosensitive layer wherein the alkali solubility of the aluminum support side is higher than that of the surface side.

Details of polymers included in the intermediate layer will be explained below. The polymer included in the intermediate layer is a compound produced by polymerization of monomers having at least one acid group. And preferably, it is a compound produced by polymerization of monomers having acid groups and monomers having onium groups.

The acid groups here used are, preferably, those with acid dissociation constant ($pK_a$) of 7 or less, more preferably, —COOH, —$SO_3H$, —$OSO_3H$, —$PO_3H_2$—$OPO_3H_2$, —$CONHSO_2$, —$SO_2NHSO_2$—, and particularly —COOH are preferred.

On the other hand, preferred onium groups are those containing any atoms belonging to the group 15 (VB group) or the group 16 (VIB group) in the periodic table, more preferred onium groups are those containing nitrogen atoms, phosphorus atoms or sulfur atoms, and an onium group containing nitrogen atoms is particularly preferred.

Polymers used in the present invention are those polymer compounds characterized in that their main chain structure is preferably a vinyl polymer such as acrylic resin, methacrylic resin or polystyrene, urethane resin, polyester or polyamide. More preferably, the main chain structure is a polymer compound characterized in that it is a vinyl polymer such as acrylic resin, methacrylic resin or polystyrene. Particularly preferred is the polymer compound characterized in that the monomer having an acid group is a compound expressed in the general formula (1) or (2) and the monomer having an onium group is a compound expressed in the general formulas (3), (4) or (5) being described later.

(1)

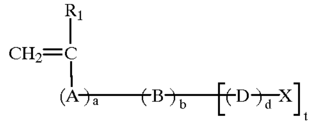

(2)

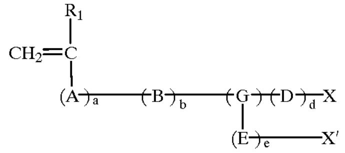

In formulas (1) and (2), A represents a divalent combination group and B represents a divalent aromatic group or a substituted aromatic group. D and E represent independently a divalent combination group respectively. G represents a trivalent combination group. X and X' represent independently an acid group with $pK_a$ of 7 or less, or its alkali metal salt or ammonium salt respectively. $R_1$ represents a hydrogen atom, an alkyl group or a halogen atom. Reference codes a, b, d and e represent independently an integer of 0 or 1 respectively. The reference code t represents an integer of 1–3.

In a monomer having an acid group, preferably, A represents —COO— or —CONH—, and B represents a phenylene group or a substituted phenylene group where the substituent is a hydroxy group, a halogen atom or an alkyl group. D and E represent independently an alkylene group or a divalent combination group that is expressed with molecular formulas $C_nH_{2n}O$, $C_nH_{2n}S$ or $C_nH_{2n+1}N$, respectively. G represents a trivalent combination group that is expressed with molecular formulas $C_nH_{2n-1}$, $C_nH_{2n-1}O$, $C_nH_{2n-1}S$ or $C_nH_{2n}N$. Provided, that n represents an integer of 1–12. X and X' represent independently a carboxylic acid, sulfonic acid, phosphonic acid, a sulfuric monoester or a phosphoric monoester phosphorate, respectively. $R_1$ represents a hydrogen atom or an alkyl group. Reference codes a, b, d and e represent independently 0 or 1 respectively, but a and b are not 0 at the same time.

In monomers having an acid group, particularly preferable one is a compound expressed with the general formula (1), wherein B represents a phenylene group or a substituted phenylene group where the substituent is a hydroxy group or an alkyl group of 1 to 3 carbon atoms. D and E represent independently an alkylene group of 1 to 2 carbon atoms or an alkylene group of 1 to 2 carbon atoms combined with an oxygen atom respectively. $R_1$ represents a hydrogen atom or an alkyl group. X represents a carboxylic acid. The reference code a is 0, and b is 1.

Concrete examples of monomers having an acid group are shown below. However, the present invention is not limited to these examples.

Concrete Examples of Monomers Having an Acid Group acrylic acid, methacrylic acid, crotonic acid, isocrotonic acid, itaconic acid, maleic acid, maleic anhydride

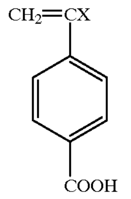
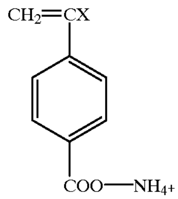
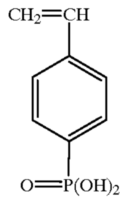
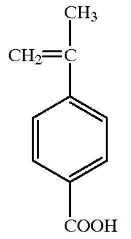
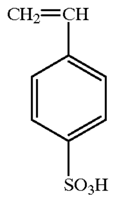
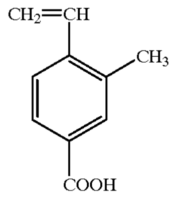
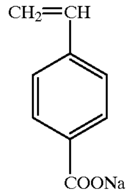
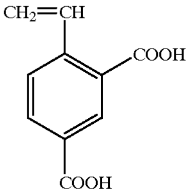
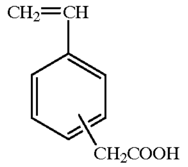
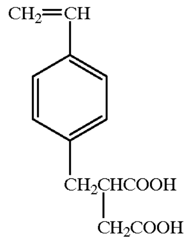
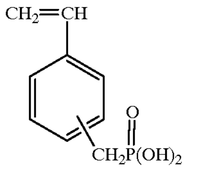
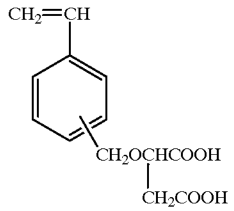
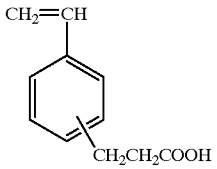
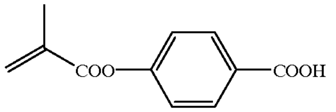
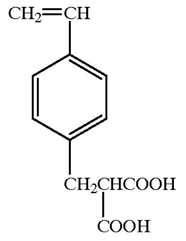
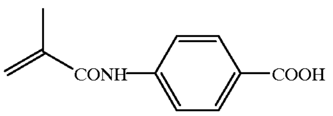
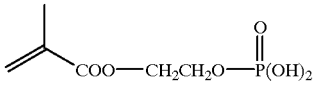
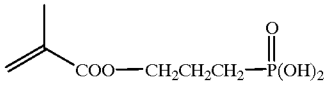

-continued

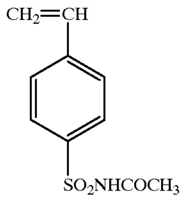

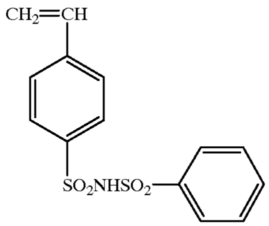

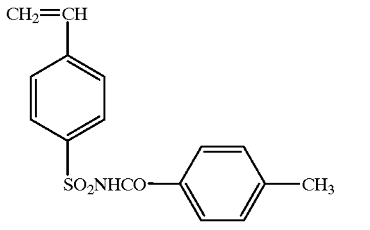

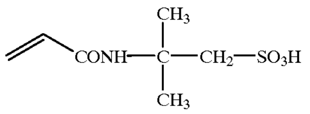

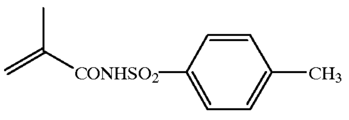

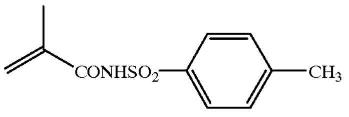

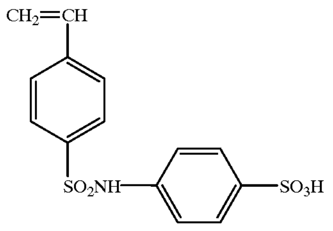

Next, polymers including a monomer having an onium group expressed by one of the following formulas (3), (4) or (5) will be explained.

(3)

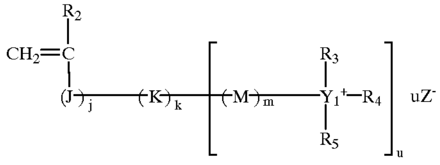

(4)

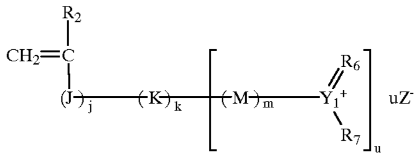

-continued (5)

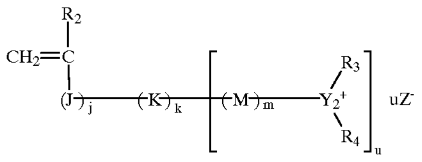

In formulas (3)–(5), J represents a divalent combination group. K represents a divalent aromatic group or a substituted aromatic group. M represents a divalent combination group. $Y_1$ represents an atom of the group 15 (VB group) in the periodic table, and $Y_2$ represents an atom of the group 16 (VIB group) in the periodic table. $Z^-$ represents a counter anion. $R_2$ represents a hydrogen atom, an alkyl group or a halogen atom. $R_3$, $R_4$, $R_5$ and $R_7$ represent independently a hydrogen atom or, an alkyl group, an aromatic group or an aralkyl group that may be bonded with substituents if circumstances require, respectively, and $R_6$ represents an alkylidyne or a substituted alkylidyne, but $R_3$ and $R_4$, and, $R_6$ and $R_7$ may form a ring respectively by bonding to each other. Reference codes j, k and m represent independently 0 or 1 respectively. The reference code u represents an integer of 1–3.

In monomers having onium groups, more preferably, J represents —COO— or —CONH—, and K represents a phenylene group or a substituted phenylene group where the substituent is a hydroxy group, a halogen atom or an alkyl group. M represents an alkylene group or a divalent combination group that is expressed with molecular formulas $C_nH_{2n}O$, $C_nH_{2n}S$ or $C_nH_{2n+1}N$. Provided, that n represents an integer of 1 to 12. $Y_1$ represents a nitrogen atom or a phosphorus atom and $Y_2$ represents a sulfur atom. $Z^-$represents a halogen ion, $PF_6$—, $BF_4$— or $R_8SO_3$—. $R_2$ represents a hydrogen atom or an alkyl group. $R_3$, $R_4$, $R_5$ and $R_7$ represent independently a hydrogen atom or, an alkyl group, an aromatic group or an aralkyl group of 1 to 10 carbon atoms that may be bonded with substituents if circumstances require, respectively, and $R_6$ represents an alkylidyne or an substituted alkylidyne of 1 to 10 carbon atoms. $R_3$ and $R_4$, and, $R_6$ and $R_7$ may form a ring respectively by bonding to each other. Reference codes j, k and m represent independently 0 or 1 respectively, however, j and k are not 0 at the same time. $R_8$ represents an alkyl group, an aromatic group or an aralkyl group of 1 to 10 carbon atoms that may be bonded with substituents.

Among monomers having onium groups, more preferably K represents a phenylene group or a substituted phenylene group where the substituents is a hydrogen atom or an alkyl group of 1 to 3 carbon atoms. M represents an alkylene group of 1 to 2 carbon atoms or an alkylene group of 1 to 2 carbon atoms combined with an oxygen atom. Z represents a chlorine ion or $R_8SO_3$—. $R_2$ represents a hydrogen atom or a methyl group. The reference code j is 0 and k is 1. $R_8$ represents an alkyl group of 1 to 3 carbon atoms.

Concrete examples of the monomers having onium groups are shown below. However, the present invention is not limited to those examples.

Concrete Examples of Monomers Having Onium Groups

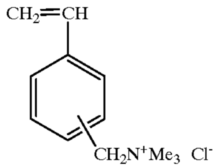
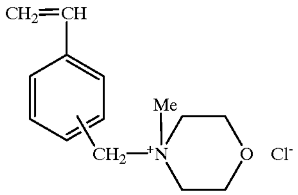
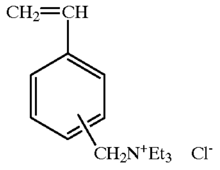
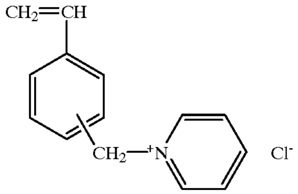
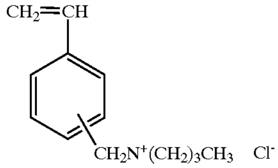
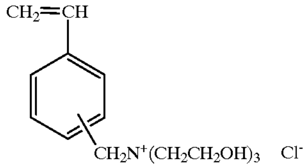
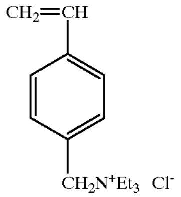
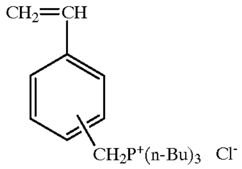
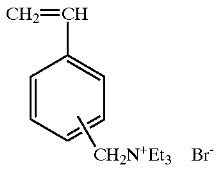
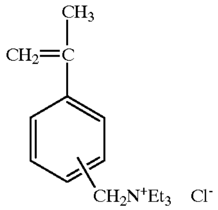
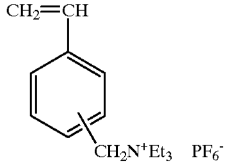
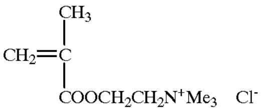
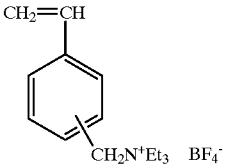
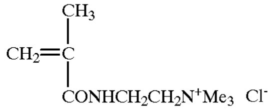
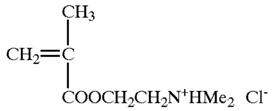

-continued

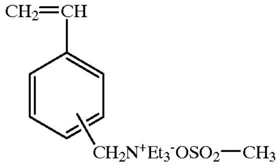
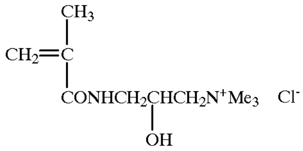
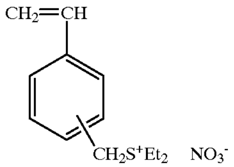
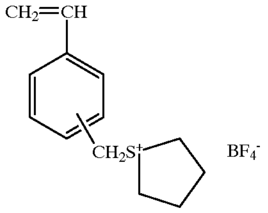
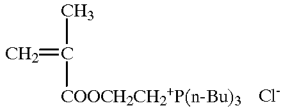

Monomers with acid groups may be used either alone or in a combination of two or more of them, and also, monomers with onium groups may be used either alone or in a combination of two or more of them. Further, polymers used in accordance with the present invention may be used as a mixture of two or more polymers that are different in monomers, the composition ratio or the molecular weight. In this case, the polymer having a monomer with an acid group as a polymerization ingredient has, preferably more than 1 mol %, and more preferably more than 5 mol % of the monomer with an acid group, and also, the polymer having a monomer with an onium group as a polymerization ingredient has, preferably more than 1 mol %, and more preferably more than 5 mol % of the monomer with an onium group.

In addition, these polymers may contain at least one kind of monomers selected from (1)–(14) shown below as a copolymer ingredient.

(1) Acrylamides, methacrylamides, acrylic esters, methacrylic esters methacrylates and hydroxystyrenes such as N-(4-hydroxyphenyl) acrylamide, N-(4-hydroxyphenyl) methacrylamide; o-, m- or p-hydroxystyrene, o- or m-bromo-p-hydroxystyrene, o- or m-chloro-p-hydroxystyrene and o-, m- or p-hydroxyphenyl acrylate or methacrylate;

(2) unsaturated carboxylic acids such as acrylic acid, methacrylic acid, maleic acid and maleic anhydride and half ester thereof; itaconic acid and itaconic anhydride and half ester thereof;

(3) acrylamides such as N-(o-aminosulfonyl phenyl) acrylamide, N-(m-aminosulfonyl phenyl) acrylamide, N-(p-aminosulfonyl phenyl) acrylamide, N-[1-(3-aminosulfonyl)

naphthyl] acrylamide, N-(2-aminosulfonyl ethyl) acrylamide; methacrylamides such as N-(o-aminosulfonyl phenyl) methacrylamide, N-(m-aminosulfonyl phenyl) methacrylamide, N-(p-aminosulfonyl phenyl) methacrylamide, N-[1-(3-aminosulfonyl)naphthyl] methacrylamide, N-(2-aminosulfonyl ethyl) methacrylamide; also, unsaturated sulfonamides of acrylic esters and the like such as o-aminosulfonyl phenyl acrylate, m-aminosulfonyl phenyl acrylate, p-aminosulfonyl phenyl acrylate, 1-(3-aminosulfonyl phenyl naphthyl) acrylate; unsaturated sulfonamides of methacrylic esters and the like esters such as o-aminosulfonyl phenyl methacrylate, m-aminosulfonyl phenyl methacrylate, p-aminosulfonyl phenyl methacrylate, 1-(3-aminosulfonyl phenyl naphthyl) methacrylate;

(4) phenyl sulfonyl acrylamides that may have a substituent such as tosylacrylamide and phenyl sulfonyl methacrylamides that may have a substituent such as tosylmethacrylamide;

(5) acrylic esters and methacrylic esters that have an aliphatic hydroxy group, for example, 2-hydroxyethyl acrylate or 2-hydroxyethyl methacrylate;

(6) (substituted) acrylic esters acrylates such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, N-dimethylamino ethyl acrylate;

(7) (substituted) methacrylic esters such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, N-dimethylamino ethyl methacrylate;

(8) acrylamides or methacrylamides such as acrylamide, methacrylamide, N-methylol acrylamide, N-methylol methacrylamide, N-ethyl acrylamide, N-ethyl methacrylamide, N-hexyl acrylamide, N-hexyl methacrylamide, N-cyclohexyl acrylamide, N-cyclohexyl methacrylamide, N-hydroxyethyl acrylamide, N-hydroxyethyl methacrylamide, N-phenyl acrylamide, N-phenyl methacrylamide, N-benzyl acrylamide, N-benzyl methacrylamide, N-nitrophenyl acrylamide, N-nitrophenyl methacrylamide, N-ethyl-N-phenyl acrylamide and N-ethyl-N-phenyl methacrylamide;

(9) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(10) vinyl esters such as vinyl acetate, vinyl chloroacetate, vinyl butyrate and vinyl benzoate;

(11) styrenes such as styrene, α-methyl styrene, methyl styrene and chloromethyl styrene;

(12) vinyl ketones such as methyl vinyl ketone, ethyl vinyl ketone, propyl vinyl ketone and phenyl vinyl ketone;

(13) olefins such as ethylene, propylene, isobutylene, butadiene and isoprene;

(14) N-vinyl pyrrolidone, N-vinyl carbazole, 4-vinyl pyridine, acrylonitrile, methacrylonitrile and the like.

For the polymer used here, the one containing a monomer having an acid group not less than 1 mol % is preferable and the one containing the same not less than 5 mol % is more preferable, and also, the one containing a monomer having an onium group not less than 1 mol % is preferable and the one containing the same not less than 5 mol % is more preferable. In addition, if a monomer having an acid group is contained by 20% or more, the dissolution removal at the time of alkali development is facilitated much more. And if a monomer having an onium group is contained by 1 mol % or more, the adhesion is improved much more owing to the synergistic effect with the acid group. Constitutional ingredients having acid groups may be used either alone or in a combination of two or more of them, and also, monomers with onium groups may be used either alone or in a combination of two or more of them. Further, for polymers used in accordance with the present invention they may be used as a mixture of two or more polymers that are different in monomers, the composition ratio or the molecular weight. Then, typical examples of polymers used in the present invention are shown below. The composition ratios of polymer structures represent mole percentages.

TYPICAL EXAMPLES OF POLYMERS

| | STRUCTURES | NUMBER-AVERAGE MOLECULAR WEIGHT ($M_n$) |
|---|---|---|
| No. 1 | 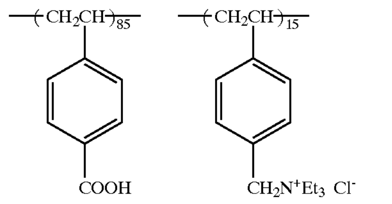 | 2,100 |
| No. 2 | 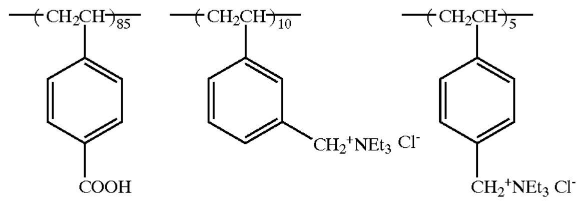 | 4,800 |

-continued
TYPICAL EXAMPLES OF POLYMERS
| | STRUCTURES | NUMBER-AVERAGE MOLECULAR WEIGHT ($M_n$) |
|---|---|---|
| No. 3 | 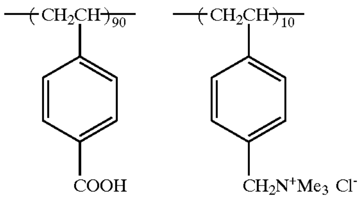 | 3,200 |
| No. 4 | 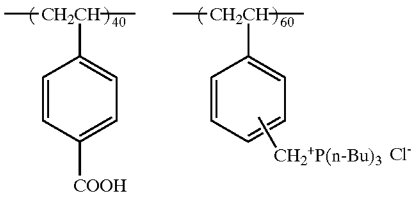 | 2,300 |
| No. 5 | 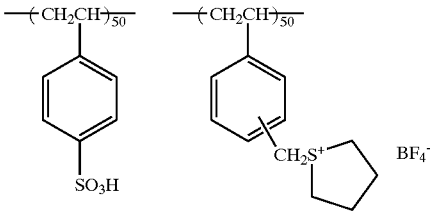 | 1,400 |
| No. 6 | 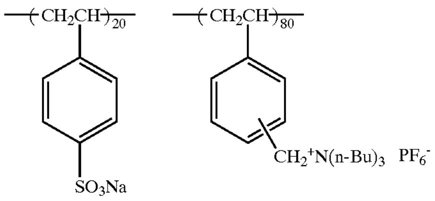 | 4,500 |
| No. 7 | 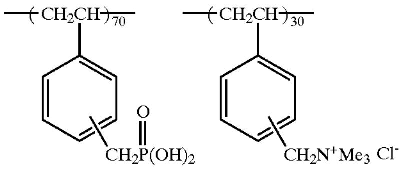 | 5,000 |
| No. 8 | 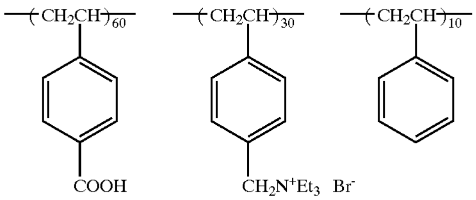 | 1,000 |
| No. 9 | 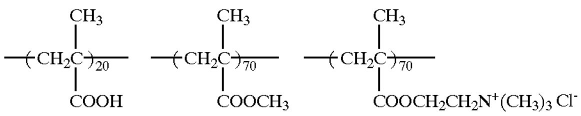 | 1,300 |

-continued
TYPICAL EXAMPLES OF POLYMERS
| | STRUCTURES | NUMBER-AVERAGE MOLECULAR WEIGHT ($M_n$) |
|---|---|---|
| No. 10 | 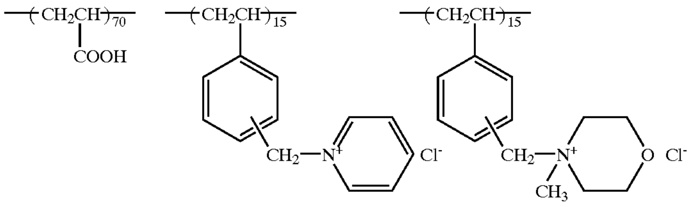 | 2,900 |
| No. 11 | 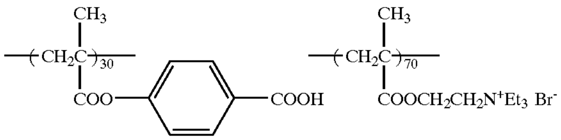 | 800 |
| No. 12 | 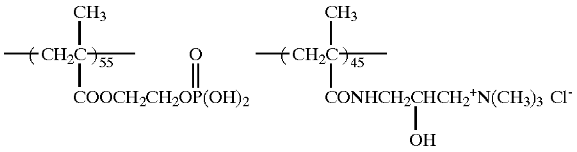 | 300 |
| No. 13 | 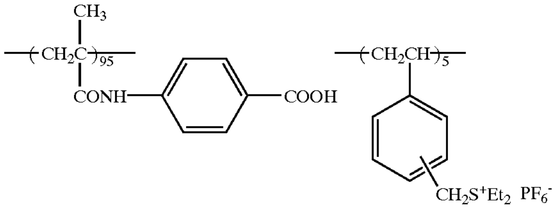 | 1,900 |
| No. 14 | 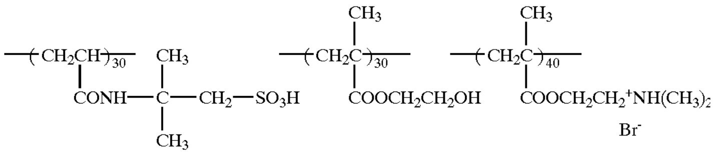 | 4,100 |
| No. 15 | 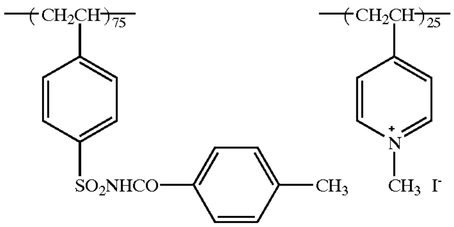 | 3,500 |
| No. 16 | 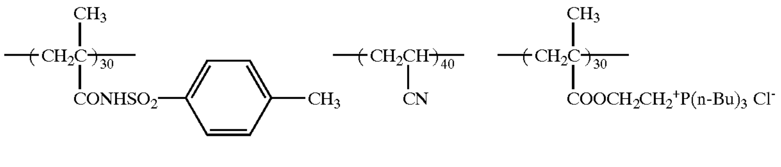 | 3,000 |

-continued
TYPICAL EXAMPLES OF POLYMERS
| | STRUCTURES | NUMBER-AVERAGE MOLECULAR WEIGHT ($M_n$) |
|---|---|---|
| No. 17 | 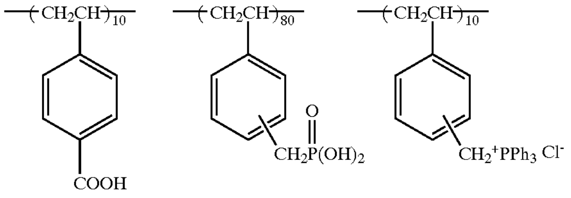 | 3,300 |
| No. 18 | 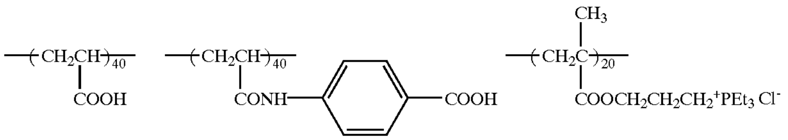 | 600 |
| No. 19 | 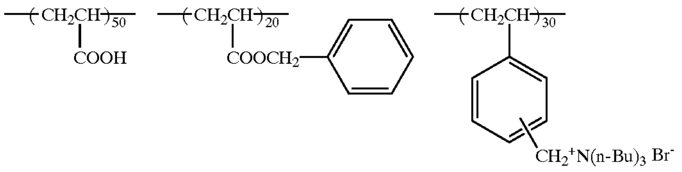 | 5,000 |
| No. 20 | 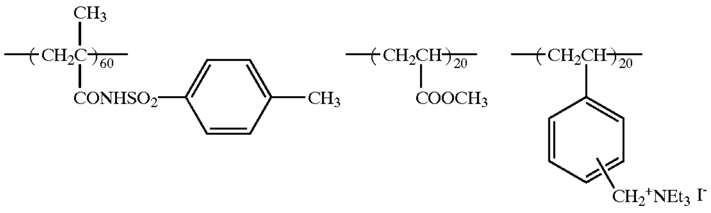 | 2,400 |
| No. 21 | 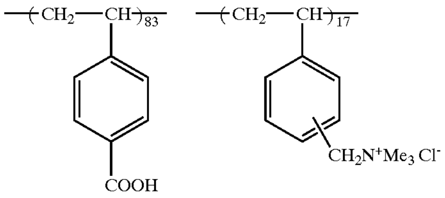 | 32 THOUSANDS |
| No. 22 | 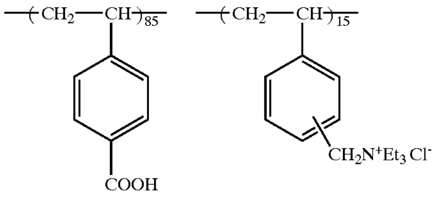 | 28 THOUSANDS |
| No. 23 | 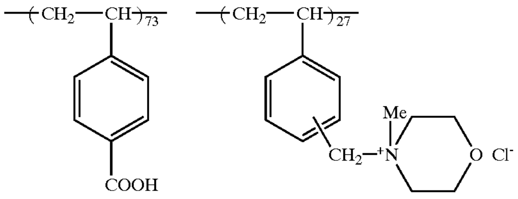 | 26 THOUSANDS |

-continued
TYPICAL EXAMPLES OF POLYMERS
| | STRUCTURES | NUMBER-AVERAGE MOLECULAR WEIGHT ($M_n$) |
|---|---|---|
| No. 24 | 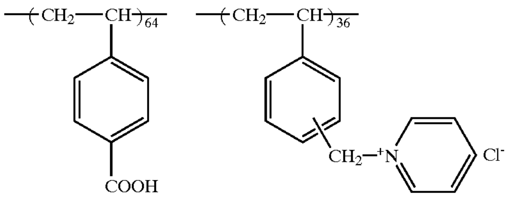 | 41 THOUSANDS |
| No. 25 | 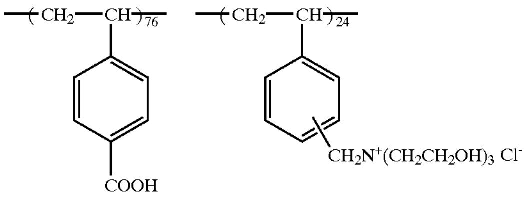 | 11 THOUSANDS |
| No. 26 | 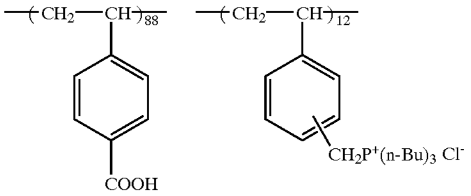 | 17 THOUSANDS |
| No. 27 | 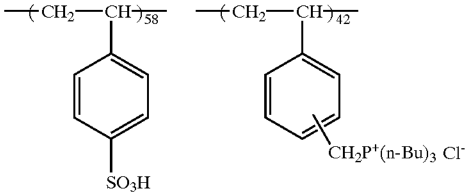 | 36 THOUSANDS |
| No. 28 | 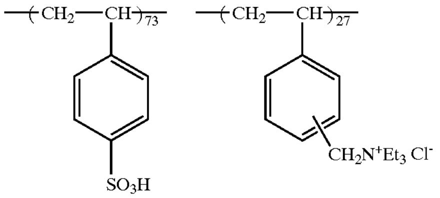 | 22 THOUSANDS |
| No. 29 | 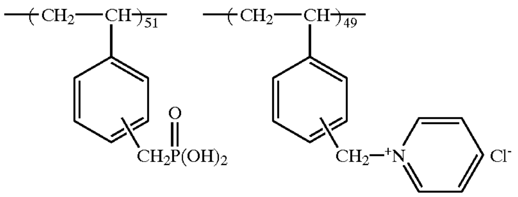 | 44 THOUSANDS |
| No. 30 | 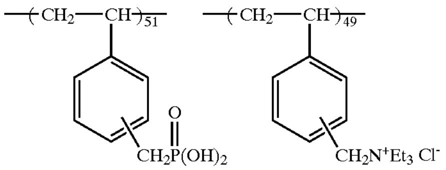 | 19 THOUSANDS |

-continued
TYPICAL EXAMPLES OF POLYMERS
| | STRUCTURES | NUMBER-AVERAGE MOLECULAR WEIGHT ($M_n$) |
|---|---|---|
| No. 31 | 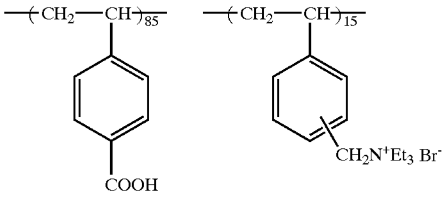 | 28 THOUSANDS |
| No. 32 | 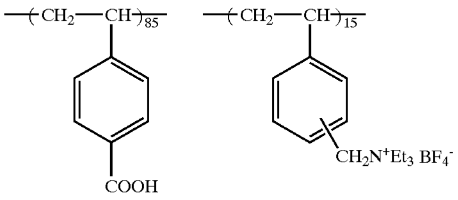 | 28 THOUSANDS |
| No. 33 | 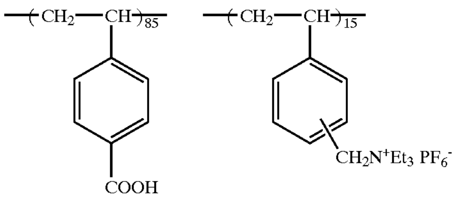 | 28 THOUSANDS |
| No. 34 | 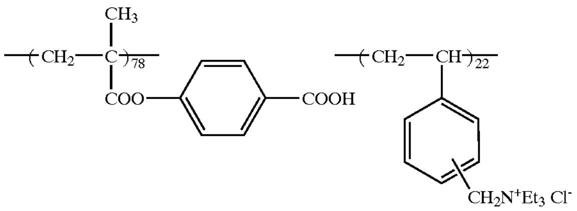 | 34 THOUSANDS |
| No. 35 | 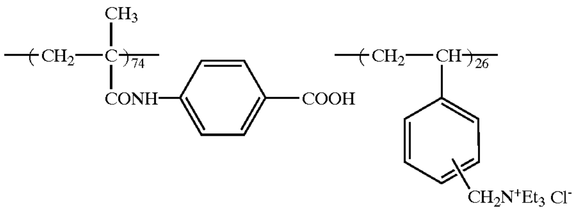 | 42 THOUSANDS |
| No. 36 | 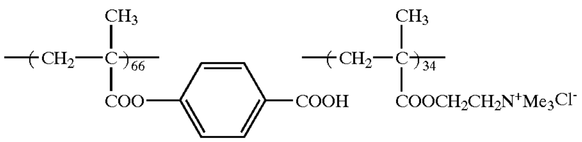 | 13 THOUSANDS |
| No. 37 | 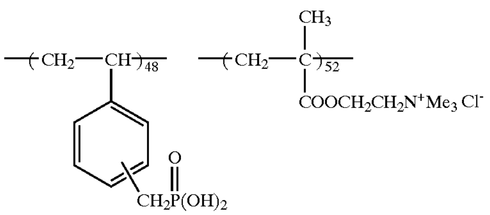 | 15 THOUSANDS |

-continued
TYPICAL EXAMPLES OF POLYMERS
| | STRUCTURES | NUMBER-AVERAGE MOLECULAR WEIGHT ($M_n$) |
| --- | --- | --- |
| No. 38 | 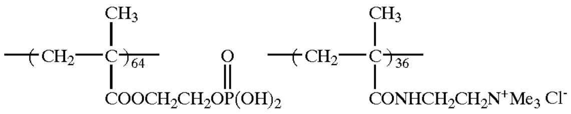 | 46 THOUSANDS |
| No. 39 | 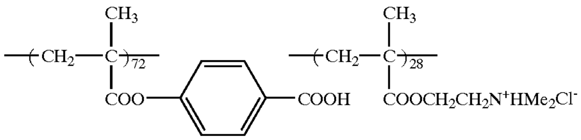 | 34 THOUSANDS |
| No. 40 | 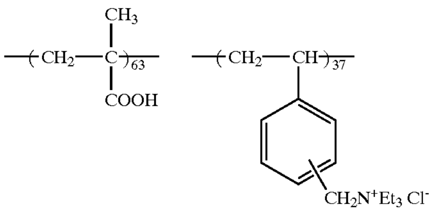 | 63 THOUSANDS |
| No. 41 | 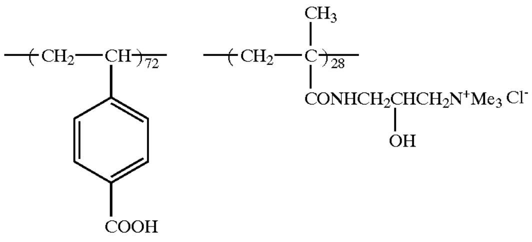 | 25 THOUSANDS |
| No. 42 | 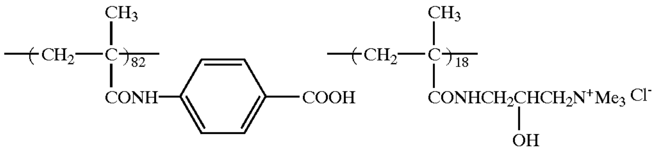 | 25 THOUSANDS |
| No. 43 | 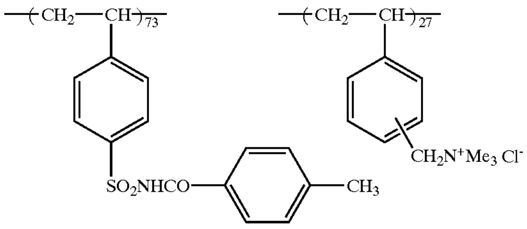 | 33 THOUSANDS |
| No. 44 | 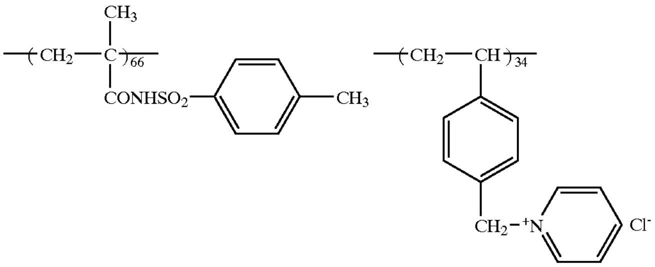 | 41 THOUSANDS |

-continued

TYPICAL EXAMPLES OF POLYMERS

| | STRUCTURES | NUMBER-AVERAGE MOLECULAR WEIGHT ($M_n$) |
|---|---|---|
| No. 45 | 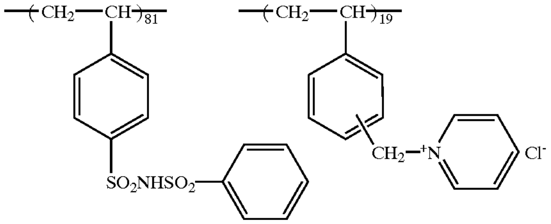 | 14 THOUSANDS |
| No. 46 | 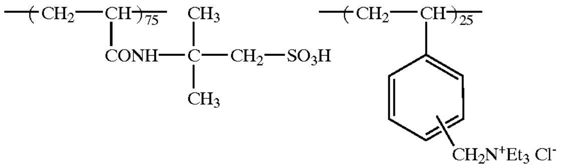 | 22 THOUSANDS |
| No. 47 | 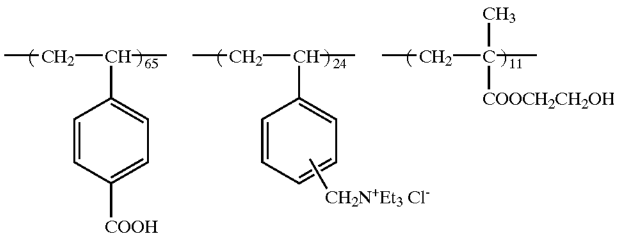 | 23 THOUSANDS |
| No. 48 | 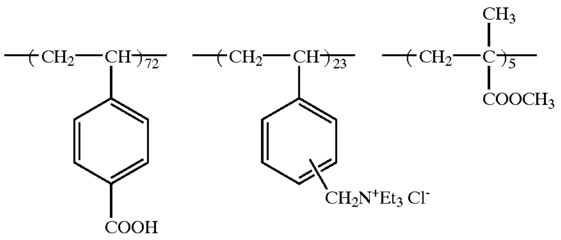 | 47 THOUSANDS |

Polymers used in the present invention can be generally produced using radical chain polymerization processes (refer to "Textbook of Polymer Science" $3^{rd}$ ed. (1984) F. W. Billmeyer, A Wiley-Interscience Publication).

While molecular weights of the polymers used in the present invention can range widely, when measured by using the light scattering method, a weight-average molecular weight ($M_w$) in a range of 500–2,000,000 is preferable, and the range of 1,000–600,000 is more preferable. Also, a number-average molecular weight ($M_N$) calculated with the integrated intensity of end groups and side chain functional groups in the NMR measurement in a range of 300–500,000 is preferable, and the range of 500–100,000 is more preferable. If the molecular weight is smaller than the above range, the adhesion strength to the support becomes weak so that deterioration of the press life may occur. On the other hand, if the molecular weight is larger exceeding the above range, the adhesion strength to the support becomes too strong so that the remains of the photosensitive layer in the non-image areas may result in insufficient removal. Also, while the quantity of the unreacted monomer contained in the polymer can range widely, being 20 wt % or less is preferable, and being 10 wt % or less is more preferable.

The polymer having a molecular weight in the above range can be obtained by using a polymerization initiator and a chain transfer agent together and adjusting addition levels of them at the time when the corresponding monomers are copolymerized. The chain transfer agent refers to a substance that transfers the active site of the reaction by chain transfer reaction in the polymerization reaction, and the susceptibility of the transfer reaction is expressed by a chain transfer constant $C_S$. The chain transfer constant $C_S \times 10^4$ (60° C.) of the chain transfer agent used in the present invention is preferably 0.01 or more, more preferably 0.1 or more, and 1 or more is particularly preferable. As of the polymerization initiator, peroxides, azo compounds and redox initiators that are generally used in radical polymerization can be utilized with no modification. Among them azo compounds are particularly preferable.

Concrete examples of chain transfer agents include halogen compounds such as carbon tetrachloride and carbon tetrabromide, alcohols such as isopropyl alcohol and isobutyl alcohol, olefins such as 2-methyl-1-butene and 2,4-diphenyl-4-methyl-1-pentene, and sulfur containing compounds such as ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide, 2-hydroxyethyl disulfide, thiosalicylic acid, thiophenol, thiocresol, benzylmercaptan and phenethylmercaptan, however, the chain transfer agents are not limited to these examples.

More preferred are ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide, 2-hydroxyethyl disulfide, thiosalicylic acid, thiophenol, thiocresol, benzylmercaptan and phenethylmercaptan, and particularly preferred are ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide and 2-hydroxyethyl disulfide.

Also, while the quantity of the unreacted monomer contained in the polymer can range widely, being 20 wt % or less is preferable, and being 10 wt % or less is more preferable.

Next, description will be made for synthetic examples of the polymer for use in the present invention.

Synthetic example 1

For synthesis of the polymer (No. 1), 50.4 g of p-vinylbenzoic acid (made by Hokko Chemical Industry Co., Ltd.), 15.2 g of triethyl(p-vinylbenzyl)ammonium chloride, 1.9 g of mercaptoethanol and 153.1 g of methanol were poured into a three-neck flask having a volume of 2 L, heated while being agitated in a flow of nitrogen, and kept at a 60° C. The solution was added with 2.8 g of 2,2'-azobis (isobutyric acid)dimethyl, and continued to be agitated for 30 minutes as it was. Thereafter, a reaction liquid obtained in the above-described manner was dropwise added with a solution obtained by dissolving 201.5 g of p-vinylbenzoic acid, 60.9 g of triethyl (p-vinylbenzyl)ammonium chloride, 7.5 g of mercaptoethanol and 11.1 g of 2,2'dimetylazobis (isobutyric acid) in 612.3 g of methanol for 2 hours. After the end of dropping, the solution was heated to 65° C., and continued to be agitated for 10 hours in a flow of nitrogen. After the end of reaction, the reaction liquid obtained was cooled to a room temperature. A yield of the reaction liquid was 1,132 g, and a concentration of a solid thereof was 30.5 wt %. Moreover, a number-average molecular weight ($M_n$) of a product obtained was obtained by $1^3$C-NMR spectrum. A value thereof resulted in 2,100.

Synthetic example 2

For synthesis of the polymer (No. 2), a similar operation to that for the synthetic example 1 was performed except that a mixture with a field m/p: 2/1 of triethyl(vinylbenzyl) ammonium chloride was used in place of triethyl(p-vinylbenzyl)ammonium chloride, and that ethyl mercaptopropionate was used in place of mercaptoethanol. As a result, a polymer having a number-average molecular weight (Mn) of 4,800 was obtained.

Synthetic example 3

For synthesis of the polymer (No. 25), 146.9 g (0.99 mol) of p-vinylbenzoic acid (made by Hokko Chemical Industry Co., Ltd.), 44.2 g (0.21 mol) of vinylbenzyltrimethylammonium chloride and 446 g of 2-methoxyethanol were poured into a three-neck flask having a volume of 1 L, heated while being agitated in a flow of nitrogen, and kept at a 75° C. Next, the solution was added with 2.76 g (12 mmol) of 2,2,1-azobis(isobutyric acid) dimethyl, and continued to be agitated. 2 hours later, 2.76 g (12 mmol) of 2,2'-azobis (isobutyric acid) dimethyl was added thereto. 2 more hours later, 2.76 g (12 mmol) of 2,2'-azobis(isobutyric acid) dimethyl was added thereto. After being agitated for 2 more hours, the solution was cooled to a room temperature. The reaction liquid obtained was poured into 12 L of ethyl acetate under agitation. A solid deposited was filtered and dried. A yield thereof was 189.5 g. A molecular weight of the solid obtained was measured by a light dispersion method, and a weight-average molecular weight ($M_w$) thereof resulted in 32 thousands.

Other polymers for use in the present invention are synthesized in the same manner as described above.

Moreover, into the intermediate layer of the presensitized plate of the present invention, a compound represented by the following general formula (6) can be also added as well as the foregoing polymers.

$$(HO)_m—R_1—(COOH)_n \qquad (6)$$

In the formula (6), a reference code $R_1$ denotes an arylene group having 6 to 14 carbon atoms, and reference codes m and n each independently denotes a integer from 1 to 3.

Description will be made below for the compound represented by the general formula (6) shown above. Preferably, the number of carbon atoms of the arylene group denoted by the code $R_1$ is 6 to 14, more preferably, 6 to 10. Concrete examples of the arylene group represented by the code $R_1$ include a phenylene group, a naphtyl group, an anthryl group and a phenathryl group. The arylene group denoted by the code $R_1$ may be substituted for an alkyl group having 1 to 10 carbon atoms, an alkenyl group having 2 to 10 carbon atoms, an alkynyl group having 2 to 10 carbon atoms, an aryl group having 6 to 10 carbon atoms, a carboxylic ester group, an alkoxy group, a phenoxy group, a sulfuric ester group, a phosphonic ester group, a sulfonyl amide group, a nitro group, a nitrile group, an amino group, a hydroxy group a halogen atom, an ethylene oxide group, a propylene oxide group, a triethyl ammonium chloride group or the like.

Concrete examples of the compounds represented by the general formula (6) include 3-hydroxybenzoic acid, 4-hydroxybenzoic acid, salicylic acid, 1-hydroxy-2-naphthoic acid, 2-hydroxy-1-naphthoic acid, 2-hydroxy-3-naphthoic acid, 2,4-dihydroxybenzoic acid, and 10-hydroxy-9-anthracenecarboxylic acid. However, the compound is not limited to the above-described concrete examples. Moreover, the compound represented by the general formula (6) may be singly used, or two or more of the compounds may be mixed for use.

The intermediate layer including the foregoing polymer for use in the present invention and the compound represented by the foregoing general formula (6), which is added according to needs, is provided by being coated on the above-described aluminum support by various methods.

As methods for providing the intermediate layer, for example, the following two methods can be enumerated. One is a coating method for providing an intermediate layer. In the method, the polymer for use in the present invention and the compound represented by the general formula (6), which is added according to needs, are dissolved in an organic solvent such as methanol, ethanol and methyl ethyl ketone, a mixed solvent of these organic solvents or a mixed solvent of one or more of these organic solvents and water. The solution obtained in the above-described manner is coated on the aluminum support, and dried. In another method, the polymer for use in the present invention and the compound represented by the general formula (6), which is added according to needs, are dissolved in an organic solvent such as methanol, ethanol and methyl ethyl ketone, a mixed solvent of these organic solvents or a mixed solvent of one or more of these organic solvents and water. Then, the aluminum support is immersed in the solution obtained in the above-described manner, cleaned by water or air, and then dried.

In accordance with the former method, the solution of the foregoing compounds with a concentration of 0.005 to 10 wt % in total can be coated by various methods. For example, any method including bar coater coating, spin coating, spray coating, curtain coating and the like may be used. In the latter method, a concentration of the solution is 0.005 to 20 wt %, preferably, 0.01 to 10 wt %, an immersion temperature is 0 to 70° C., preferably, 5 to 60° C., and an immersion time is 0.1 second to 5 minutes, preferably 0.5 to 120 seconds.

pH of the foregoing solution can be adjusted so that the solution can be used in a pH ranging from 0 to 12, preferably from 0 to 6, with a basic substance such as ammonia, triethylamine, potassium hydroxide, inorganic acid such as hydrochloric acid, phosphoric acid, sulfuric acid and nitric acid, various organic acidic substances including organic sulfonic acid such as nitrobenzene sulfonic acid and naphthalene sulfonic acid, organic phosphonic acid such as phenylphosphonic acid, organic carbonic acid such as benzoic acid, coumaric acid and malic acid, and organic chloride such as naphthalenesulfonyl chloride and benzenesulfonyl chloride.

Moreover, for improving the tone reproduction characteristic of the presensitized plate, a substance absorbing ultraviolet rays, visible light, infrared rays and the like can be also added.

A coating amount of the compound after being dried, which constitutes the intermediate layer of the presensitized plate of the present invention, is suitably 1 to 100 mg/m$^2$, preferably, 2 to 70 mg/m$^2$, in total. When the foregoing coating amount is less than 1 mg/m$^2$, a sufficient effect is not obtained sometimes. A similar case occurs also when the coating amount is more than 100 mg/m$^2$.

<Photosensitive Layer>

The photosensitive layer that can become alkali-soluble by heating is not particularly limited as far as the photosensitive layer (recording layer) is writable by irradiation of infrared laser and solubility thereof increases. The photosensitive layer as described above, which is directly recordable by exposure to the infrared laser and increases the solubility of the exposure portion to alkali developer, will be referred to as thermal positive working photosensitive layer hereinafter as occasion demands.

An image forming mechanism of the thermal positive working photosensitive layer is as below. Specifically, the thermal positive working photosensitive layer is made soluble in water or alkali water by action such as bonding release of the high-molecular compounds having formed the layer, which is caused by acid generated by light irradiation and heating and thermal energy themselves, and then the photosensitive layer is removed by development to form non-image areas.

As the thermal positive working photosensitive layer, well-known one can be employed. For example, enumerated are photosensitive layers (recording layers) described in the gazettes of JP-A-9-222737, JP-A-9-90610, JP-A-9-87245, JP-A-9-43845, JP-A-7-306528, the specification of Japanese Patent Application No. 10-229099 by the applicant of the present application (gazette of JP-A-2000-35666) and the specification of Japanese Patent Application No. 11-240601.

The photosensitive layer that can become alkali-soluble by heating in the presensitized plate of the present invention contains a positive working photosensitive composition for infrared laser (hereinafter, simply referred to also as "photosensitive composition").

The positive working photosensitive composition for infrared laser, which is contained in the photosensitive layer, contains: at least (A) an alkali-soluble high-molecular compound (referred to also as "high-molecular compound insoluble in water and soluble in an alkali aqueous solution" in this specification); and (C) a compound absorbing light to generate heat (referred to also as "infrared absorbent" in this specification); and preferably, further contains (B) a compound lowering solubility of the high-molecular compound in an alkali solution by dissolving the same in the alkali-soluble high-molecular compound and reducing the solubility lowering action by heating; and further, according to needs, contains another component.

(A) Alkali-soluble High-molecular Compound

The alkali-soluble high-molecular compound for use in the present invention is not particularly limited as far as it is a high-molecular compound insoluble in water and soluble in an alkali solution, and conventionally well-known one can be employed. For example, the one described in paragraph number 0051 to 0068 in the specification of Japanese Patent Application No. 11-357048 by the applicant of the present application can be suitably employed.

As the alkali-soluble high-molecular compound as described above, a homopolymer of monomers, which contains acid groups in principal chains and/or side chains in polymers, a copolymer thereof or a mixture of the homopolymer and/or the copolymer is preferably used.

In the present invention, it is preferable in expression of the solubility of the exposure portion and insolubility of the non-exposure portion to the alkali developer that the alkali-soluble high-molecular compound be a high-molecular compound containing, in molecule, any functional group of (1) phenolic hydroxy group (—Ar—OH), (2) sulfonamide group (—$SO_2$NH—R), (3) substituted sulfonamide-series acid group (—$SO_2$NHCOR, —$SO_2NHSO_2$R, —$CONHSO_2$R), (4) carboxy group (—$CO_2$H), (5) sulfonic acid group (—$SO_3$H) and (6) phosphoric acid group (—OPO3$H_2$).

In the foregoing functional groups (1) to (6), Ar denotes a divalent aryl-bonded group that may contain a substituent, and R denotes a monovalent hydrocarbon group that may contain a substituent.

Among the alkali-soluble high-molecular compounds, each of which has an acid group selected from the foregoing functional groups (1) to (6), the alkali-soluble high-molecular compound containing, in the molecule, any functional group of (1) phenolic hydroxy group, (2) sulfonamide group and (3) substituted sulfonamide-series acid group (hereinafter referred to as "active imide group") is preferable. Particularly, the high-molecule compound containing any one of (1) phenolic hydroxy group and (2) sulfonamide group in the molecule is preferable in that it sufficiently secures the solubility to the alkali developer, a development latitude and a layer strength.

As the alkali-soluble high-molecular compound particularly preferable for use in the present invention, the following can be exemplified. However, the present invention is not limited to these examples.

Examples of the high-molecular compounds containing (1) phenolic hydroxy groups include novolac resin and pyrogallol acetone resin such as phenol-formaldehyde resin, m-cresol-formaldehyde resin, p-cresol-formaldehyde resin, m-/p-mixed cresol-formaldehyde resin and phenol/cresol (any of m-, p- and m-/p-) mixed formaldehyde resin.

Besides the above, as the high-molecular compound containing the phenolic hydroxy group, a high-molecular compound containing the phenolic hydroxy group in a side chain thereof can be preferably used. As the high-molecular compound containing the phenolic hydroxy group in the side chain, exemplified is a high-molecular compound obtained by homopolymerizing polymeric monomers made of low-molecular compounds which contains at least one phenolic hydroxy group and at least one polymerizable unsaturated bond or by copolymerizing another polymeric monomer with the concerned monomers.

Examples of the polymeric monomers containing the phenolic hydroxy groups include acrylamide, methacrylamide, acrylic ester, methacrylic ester, which contain the phenolic hydroxy group, and hydroxystyrene. Specifically, the following is preferably used: N-(2-hydroxyphenyl)acrylamide; N-(3-hydroxyphenyl)acrylamide; N-(4-hydroxyphenyl)acrylamide; N-(2-hydroxyphenyl)methacrylamide; N-(3-hydroxyphenyl)methacrylamide; N-(4-hydroxyphenyl)methacrylamide; o-hydroxyphenyl acrylate; m-hydroxyphenyl acrylate; p-hydroxyphenyl acrylate; o-hydroxyphenyl methacrylate; m-hydroxyphenyl methacrylate; p-hydroxyphenyl methacrylate; o-hydroxystyrene; m-hydroxystyrene; p-hydroxystyrene; 2-(2-hydroxyphenyl)ethylacrylate; 2-(3-hydroxyphenyl)ethylacrylate; 2-(4-hydroxyphenyl)ethylacrylate; 2-(2-hydroxyphenyl)ethylmethacrylate; 2-(3-hydroxyphenyl)ethylmethacrylate; 2-(4-hydroxyphenyl)ethylmethacrylate and the like. Such resin containing the phenolic hydroxy group may be used in combination of two types thereof or more.

Moreover, as described in the specification of U.S. Pat. No. 4,123,279, a condensed polymer of phenol and formaldehyde containing alkyl groups having 3 to 8 carbon as substituents atoms such as t-butylphenol-formaldehyde resin and octylphenol-formaldehyde resin may be used together.

Examples of the alkali-soluble high-molecular compound containing (2) sulfonamide group include a high-molecular compound obtained by homopolymerizing polymeric monomers containing sulfonamide groups or by copolymerizing another polymeric monomer with the concerned monomers. Examples of the polymeric monomers containing the sulfonamide groups include polymeric monomers made of low-molecular compounds which contains at least one sulfonamide group-NH—$SO_2$ in which at least one hydrogen atom is bonded onto a nitrogen atom and at least one polymerizable unsaturated bond in one molecule. Among these, a low-molecular compound containing any of an acryloyl group, an allyl group and a vinyloxy group and any of a monosubstituted aminosulfonyl group and a substituted sulfonylimino group is preferable. As the compound as described above, for example, enumerated are compounds represented by the following general formulae (I) to (V).

(I)

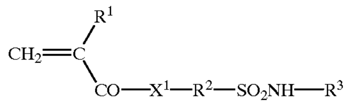

-continued (II)

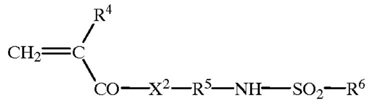

(III)

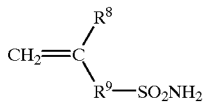

(IV)

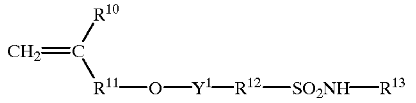

(V)

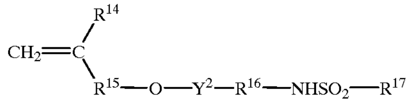

In the formulae, each of reference codes $X^1$ and $X^2$ independently denotes —O— or —$NR_7$—. Each of reference codes $R^1$ and $R^4$ independently denotes a hydrogen atom or —$CH_3$. Each of reference codes $R^2$, $R^5$, $R^9$, $R^{12}$ and $R^6$ independently denotes an alkylene group, a cycloalkylene group, an arylene group or an aralkylene group, each of which may contain a substituent and has 1 to 12 carbon atoms. Each of reference codes $R^3$, $R^7$ and $R^{13}$ independently denotes an alkyl group, a cycloalkyl group, an aryl group or an aralkyl group, each of which may contain a hydrogen atom and a substituent and has 1 to 12 carbon atoms. Moreover, each of reference codes $R^6$ and $R^{17}$ independently denotes an alkyl group, a cycloalkyl group, an aryl group or an aralkyl group, each of which may contain a substituent and has 1 to 12 carbon atoms. Each of reference codes $R^8$, $R^{10}$ and $R^{14}$ independently denotes a hydrogen atom or —$CH_3$. Each of reference codes $R^{11}$ and $R^{15}$ independently denotes a single bond or an alkylene group, a cycloalkylene group, an arylene group or an aralkylene group, each of which may contain a substituent and has 1 to 12 carbon atoms. Each of reference codes $Y^1$ and $Y^2$ independently denotes a single bond or —CO—. Specifically, m-aminosulfonylphenyl methacrylate, N-(p-aminosulfonylphenyl)methacrylamide, N-(p-aminosulfonylphenyl)acrylamide and the like can be preferably used.

The alkali-soluble high-molecular compound containing (3) active imide group preferably contains an active imide group represented by the following formula in the molecule. As the high-molecular compound, exemplified is a high-molecular compound obtained by homopolymerizing polymeric monomers made of low-molecular compounds which contains at least one active imide group represented by the following formula and at least one polymerizable unsaturated bond, or by copolymerizing another polymeric monomer with the concerned monomers.

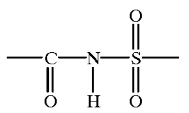

As the compound as described above, specifically, N-(p-toluenesulfonyl)methacrylamide, N-(p-toluenesulfonyl)acrylamide and the like can be preferably used.

A minimum constituent unit constituting the alkali-soluble high-molecular compound, which contains an acid group selected from the above-described functional groups (1) to (6), is not particularly limited to one type. The compound obtained by copolymerizing two types or more of minimum constituent units containing the same acid groups or the compound obtained by copolymerizing two types or more of minimum constituent units containing different acid groups can be also used.

As a copolymerizing method, conventionally well-known graft copolymerizing method, a block copolymerizing method, random copolymerizing method or the like can be used.

Moreover, as preferable alkali-soluble high-molecular compounds for use in the present invention, exemplified are a high-molecular compound obtained by polymerizing two types or more selected from a polymeric monomer containing the above-described phenolic hydroxy groups, a polymeric monomer containing the above-described sulfonamide groups and a polymeric monomer containing the above-described active imide groups, or a high-molecular compound obtained by copolymerizing another polymeric monomer with the concerned two types or more of the polymeric monomers.

In the case where the polymeric monomer containing the phenolic hydroxy group is copolymerized with the polymeric monomer containing the sulfonamide group and/or the polymeric monomer containing the active imide group, a quantity ratio for mixing these components preferably ranges from 50:50 to 5:95, more preferably, ranges from 40:60 to 10:90.

In the case where the alkali-soluble high-molecular compound is a copolymer of a monomer imparting alkali-solubility and another polymeric monomer, the monomer imparting the alkali-solubility including the polymeric monomer containing the above-described phenolic hydroxy group, the polymeric monomer containing the above-described sulfonamide group and the polymeric monomer containing the above-described active imide group, the content of the monomer imparting the alkali solubility is preferably 10 mol % or more, more preferably, 20 mol % or more. When this monomer content is less than 10 mol %, the alkali-solubility tends to be insufficient, and sometimes, an effect of improving a development latitude is not sufficiently achieved.

As the monomer component copolymerized with the polymeric monomer containing the above-described phenolic hydroxy group, the polymeric monomer containing the above-described sulfonamide group and the polymeric monomer containing the above-described active imide group, for example, monomers enumerated in the following (1) to (12) can be used. However, the component is not limited to them.

(1) Acrylic esters and methacrylic esters, each of which contains an aliphatic hydroxy group such as 2-hydroxyethyl acrylate and 2-hydroxyethyl methacrylate.

(2) Alkylacrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate.

(3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate.

(4) Acrylamides and methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(6) Vinyl esters such as vinyl acetate, vinyl chloroacetate, vinyl butyrate and vinyl benzoate.

(7) Styrenes such as styrene, 2-methylstyrene, methylstyrene and chloromethylstyrene.

(8) Vinyl ketones such as methyl vinyl ketone, ethyl vinyl ketone, propyl vinyl ketone and phenyl vinyl ketone.

(9) Olefin grouping such as ethylene, propylene, isobutylene, butadiene and isoprene.

(10) N-vinylpyrrolidone, N-vinylcarbazole, 4-vinylpyridine, acrylonitrile, methacrylonitrile and the like.

(11) Unsaturated imides such as maleimide, N-acryloylacrylamide, N-acetylmethacrylamide, N-propionylmethacrylamide and N-(p-chlorobenzoyl) methacrylamide.

(12) Unsaturated carboxylic acids such as acrylic acid, methacrylic acid, maleic anhydride and itaconic acid.

In the present invention, in the case where the alkali-soluble high-molecular compound is a homopolymer or copolymer of the polymeric monomer containing the above-described phenolic hydroxy group, the polymeric monomer containing the above-described sulfonamide group or the polymeric monomer containing the above-described active imide group, preferably, a weight-average molecular weight thereof is 2,000 or more, and a number-average molecular weight thereof is 500 or more. More preferably, the weight-average molecular weight ranges from 5,000 to 300,000, and the number-average molecular weight ranges from 800 to 250,000, and, a degree of dispersion thereof (weight-average molecular weight/number-average molecular weight) ranges between 1.1 and 10.

Moreover, in the present invention, in the case where the alkali-soluble high-molecular compound is resin such as phenol formaldehyde resin and cresol aldehyde resin, preferably, the weight-average molecular weight thereof ranges from 500 to 20,000, and the number-average molecular weight thereof ranges from 200 to 10,000.

The alkali-soluble high-molecular compound described above may be singly used, or the compounds may be used in a combination of two or more thereof. The weight percentage of the added alkali-soluble high-molecular compound based on the total solids of the photosensitive layer preferably ranges from 30 to 99 wt %, more preferably from 40 to 95 wt %, much more preferably from 50 to 90 wt %. When the weight percentage of the added alkali-soluble high-molecular compound is less than 30 wt %, the durability of the photosensitive layer is deteriorated. And it is not preferable in both of the photosensitivity and the durability that the weight percentage thereof exceeds 99 wt %.

(B) Compound Lowering Solubility of the High-molecular Compound in an Alkali Solution by Dissolving the Same in the Alkali-soluble High-molecular Compound and Reducing the Solubility Lowering Action by Heating (B) component has properties as follows. Specifically, due to the action of the hydrogen-bonding functional group present in the molecule, the solubility of (B) component with (A) alkali-soluble high-molecular compound is good, thus enabling the formation of even coating liquid. Moreover, due to the interaction with (A) component, (B) component can inhibit the alkali-solubility of the concerned high-molecular compound.

Moreover, with regard to (B) compound, the solubility lowering action thereof disappears by heating. However, in the case where (B) component itself is a compound decomposed by heating, when an energy sufficient for the decomposition is not imparted thereto depending on conditions such as a laser output and an irradiation time, there causes a fear of insufficient lowering of the solubility controlling action and lowering of the photosensitivity. Accordingly, the thermal decomposition temperature of (B) component is preferably 150° C. or more.

Examples of preferable (B) compounds for use in the present invention include compounds such as a sulfonic compound, ammonium salt, phosphonium salt and an amide compound, which interact with the above-described (A) component. As described above, (B) component should be appropriately selected in consideration of the interaction with (A) component. Specifically, for example, in the case where the novolak resin is singly used as (A) component, cyanine dye A or the like to be exemplified later is suitably used.

Preferably, the mixing amount ratio of (A) component to (B) component usually ranges from 99/1 to 75/25. In the case where (B) component is contained less than 1%, the interaction with (A) component becomes insufficient, and the alkali solubility cannot be inhibited, thus causing difficulty in forming a good image. Moreover, in the case where (B) component is contained more than 25%, since the interaction is excessive, the photosensitivity is significantly lowered. Both of the above-described cases are not preferable.

(C) Compound Absorbing Light to Generate Heat

Since the photosensitive composition contains a compound absorbing light to generate heat, a photochemical reaction or the like occurs thereon by laser scanning, and the solubility of the photosensitive layer (recording layer) in the developer is increased to a great extent.

The compound absorbing light to generate heat in the present invention is referred to as a compound having a light absorbing band in an infrared ray range of 700 nm or more, preferably 750 to 1200 nm, more preferably 760 to 1200 nm, and having a photothermal conversion function made to emerge in light of a wavelength in the above-described band. Specifically, various pigments and dyes absorbing the light of the above-described wavelengths to generate heat can be used. As the above-described pigments, commercially available pigments or pigments described in "Color Index (C. I.) Handbook", "Latest Pigment Handbook (Saishin Ganryo Binran)" (edited by Japan Association of Pigment Technology, 1977), "Latest Pigment Application Technology (Saishin Ganryo Oyo Gijyutsu)" (CMC, 1986) and "Printing Ink Technology (Insatsu Inki Gijyutsu)" (CMC, 1984) can be used.

Examples of the above-described pigments include a black pigment, an yellow pigment, an orange pigment, a brown pigment, a red pigment, a purple pigment, a blue pigment, a green pigment, a fluorescent pigment, a metal powder pigment and a polymer-bonded dyestuff. Specific examples of the pigments include an insoluble azo pigment, an azo lake pigment, a condensed azo pigment, a chelate azo pigment, a phthalocyanine-based pigment, an anthraquinone-based pigment, a perylene and perinone-based pigment, a thioindigo-based pigment, a quinacridone-based pigment, a dioxazine-based pigment, an isoindolinone-based pigment, a quinophthalone-based pigment, a dyeing lake pigment, an azine pigment, a nitroso pigment, a nitro pigment, a natural pigment, an inorganic pigment and a carbon black.

These pigments may be used without surface treatment or may be used after the surface treatment. Surface treatment methods include a surface coating method with resin and wax, a method of adhering surfactant, a method of bonding a reactive substance (for example, a silane coupling agent, an epoxy compound and polyisocyanate) to a pigment surface. The above-described surface treatment methods are described in "Properties and Applications of Metal Soaps" (Saiwai Shobo Co., Ltd.), "Printing Ink Technology (Insatsu Inki Gijyutsu)" (CMC, 1984) and "Latest Pigment Application Technology (Saishin Ganryo Oyo Gijyutsu)" (CMC, 1986).

A particle diameter of the above-described pigments preferably ranges from 0.01 to 10 $\mu$m, more preferably from 0.05 to 1 $\mu$m, much more preferably from 0.1 to 1 $\mu$m. It is not preferable that the particle diameter of the pigments be less than 0.01 $\mu$m in terms of stability of the dispersant in the photosensitive layer coating liquid. And, it is not preferable that the particle diameter exceeds 10 $\mu$m in terms of evenness of the photosensitive layer.

As a method of dispersing the above-described pigments, a well-known dispersing technology for use in preparing ink, toner and the like can be used. Examples of the dispersing machine include an ultrasonic dispersing machine, a sandmill, an attritor, a pearl mill, a super mill, a ball mill, an impeller, a disperser, a KD mill, a colloid mill, a dynatron, a three-roll mill and a pressurizing kneader. Details thereof are described in "Latest Pigment Application Technology (Saishin Ganryo Oyo Gijyutsu)" (CMC, 1986).

As the above-described dyes, commercially available dyes and well-known dyes described in documents (for example, "Dye Handbook" edited by The Society of Synthetic Organic Chemistry, Japan, 1970) can be used. Specific examples of the dyes include an azo dye, an azo dye in the form of a metallic complex salt, a pyrazolone azo dye, a naphthoquinone dye, an anthraquinone dye, a phthalocyanine dye, a carbonium dye, a quinoneimine dye, a methyne dye, a cyanine dye, a squarylium dyestuff, a pyrylium salt and a metal thiolate complex (for example, nickel thiolate complex).

In the present invention, among the above-described pigments and dyes, the ones absorbing infrared rays or near-infrared rays are particularly preferable in that they are suitable for use in a laser emitting the infrared rays or near-infrared rays.

As such pigments absorbing the infrared rays or near-infrared rays, carbon black is preferably used. Moreover, examples of the dyes absorbing the infrared rays or near-infrared rays include the cyanine dye described in the gazettes of JP-A-58-125246, JP-A-59-84356, JP-A-59-202829, JP-A-60-78787 and the like, the methyne dye described in the gazettes of JP-A-58-173696, JP-A-58-181690, JP-A-58-194595 and the like, the naphthoquinone dye described in the gazettes of JP-A-58-112793, JP-A-58-224793, JP-A-59-48187, JP-A-59-73996, JP-A-60-52940, JP-A-60-63744 and the like, the squarylium dyestuff described in the gazette of JP-A-58-112792 and the like, the cyanine dye described in the specification of British Patent No. 434,875 and the dihydroperimidine squarylium described in the specification of U.S. Pat. No. 5,380,635.

Moreover, as the above-described dye, the near-infrared ray absorbing sensitizer described in the specification of U.S. Pat. No. 5,156,938 is also preferably used. Furthermore, more preferably used are the substituted aryl benzo(thio)pyrylium salt described in the specification of U.S. Pat. No. 3,881,924, the trimethyne thiopyrylium salt described in the gazette of JP-A-57-142645 (specification of U.S. Pat. No. 4,327,169), the pyrylium series compound described in the gazettes of JP-A-58-181051, JP-A-58-220143, JP-A-59-41363, JP-A-59-84248, JP-A-59-84249, JP-A-59-146063 and JP-A-59-146061, the cyanine dyestuff described in the gazette of JP-A-59-216146, the pentamethyne thiopyrylium salt and the like described in the specification of U.S. Pat. No. 4,283,475, the pyrylium compound disclosed in the gazettes of JP-B-5-13514 and JP-B-

5-19702; Epolight III-178, Epolight III-130, Epolight III-125, Epolight IV-62A (these are all made by Epolin Co.) and the like.

Moreover, as another example of the above-described more preferable dyes, the near-infrared ray absorbing dye represented in the formula (I) or (II) in the specification of U.S. Pat. No. 4,756,993 is enumerated.

Examples of particularly preferable dyes there among include cyanine dyestuff, squarylium dyestuff, pyrylium salt and nickel thiolate complex.

Furthermore, the anionic infrared absorbent described in the specification of Japanese Patent Application No. 10-237634 (gazette of JP-A-11-338131) is also enumerated as a preferable one.

These pigments or dyes can be added into the above-described photosensitive composition in the following amounts to the total solids of the photosensitive layer. Specifically, the amount added ranges preferably from 0.01 to 50 wt %, more preferably from 0.01 to 30 wt %, much more preferably from 0.1 to 10 wt %. In the case of dye, the amount ranges particularly preferably from 0.5 to 10 wt %. In the case of pigments, the amount ranges particularly preferably from 1.0 to 10 wt %, further preferably from 3.1 to 10 wt %. When an additional amount of the pigment or dye is less than 0.01 wt %, the photosensitivity is lowered. When the additional amount exceeds 50 wt %, the evenness of the photosensitive layer is lost, and the durability of the photosensitive layer is deteriorated.

Each of these pigments or dyes may be added into the same layer as that having other components. Alternatively, another layer may be provided, and each of these pigments or dyes may be added thereinto. In the case where another layer is provided, preferably, another layer is provided to be adjacent to the layer containing the substance of the present invention, which has thermal decomposability and substantially lowers the solubility of the alkali-soluble high-molecular compound in an undecomposed state, and the pigment or dye is added thereinto.

Moreover, though the dye or pigment and the alkali-soluble high-molecular compound are preferably included in the same layer, it does not matter if the dye or pigment and the alkali-soluble high-molecular compound are included in layers different from each other.

(B+C) Component

In the present invention, in place of (B) compound lowering solubility of the high-molecular compound in the alkali solution by dissolving the same in the alkali-soluble high-molecular compound and reducing the solubility lowering action by heating and (C) compound absorbing light to generate heat, one compound having properties of the both compounds described above (hereinafter, also referred to as "(B+C) component") can be also made to contain. As such a compound, for example, ones represented by the following general formula (Z) are enumerated.

(Z)

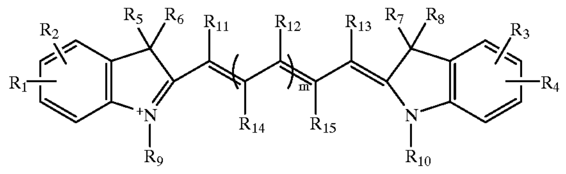

$X^-$

In the above-described general formula (Z), each of reference codes $R_1$ to $R_4$ independently denotes a hydrogen atom or an alkyl group, an alkenyl group, an alkoxy group, a cycloalkyl group or an aryl group, each of which has 1 to 12 carbon atoms and may contain a substituent. $R_1$ and $R_2$, as well as $R_3$ and $R_4$, may be respectively bonded to form a ring structure. Here, specific examples of $R_1$ to $R_4$ include a hydrogen atom, a methyl group, an ethyl group, a phenyl group, a dodecyl group, a naphthyl group, a vinyl group, an aryl group, and a cyclohexyl group. In the case where these groups contain substituents, examples of the substituents include a halogen atom, a carbonyl group, a nitro group, a nitrile group, a sulfonyl group, a carboxy group, carboxylic ester and sulfonic ester.

Each of reference codes $R_1$ to $R_{10}$ independently denotes an alkyl group which has 1 to 12 carbon atoms and may contain a substituent. Here, specific examples of $R_5$ to $R_{10}$ include a methyl group, an ethyl group, a phenyl group, a dodecyl group, a naphthyl group, a vinyl group, an allyl group, and a cyclohexyl group. In the case where these groups contain substituents, examples of the substituents include a halogen atom, a carbonyl group, a nitro group, a nitrile group, a sulfonyl group, a carboxy group, carboxylic ester, and sulfonic ester.

Each of reference codes $R_{11}$ to $R_{13}$ independently denotes an alkyl group which has 1 to 8 carbon atoms and may contain a hydrogen atom, a halogen atom or a substituent. Here, $R_{12}$ may be bonded to $R_{11}$ or $R_{13}$ to form a ring structure. In the case of m >2, a plurality of $R_{12}$ may be bonded to each other to form a ring structure. Specific examples of $R_{11}$ to $R_{13}$ include a chlorine atom, a cyclohexyl group, and cyclopentyl and cyclohexyl rings composed by bonding $R_{12}$ to each other. In the case where these groups contain substituents, examples of the substituents include a halogen atom, a carbonyl group, a nitro group, a nitrile group, a sulfonyl group, a carboxy group, carboxylic ester, and sulfonic ester. Moreover, a reference code m denotes an integer of 1 to 8, preferably 1 to 3.

Each of reference codes $R_{14}$ and $R_{15}$ independently denotes a hydrogen atom, a halogen atom or an alkyl group which has 1 to 8 carbon atoms and may contain a substituent. $R_{14}$ may be bonded to $R_{15}$ to form a ring structure. In the case of m>2, a plurality of $R_{14}$ may be bonded to each other to form a ring structure. Specific examples of $R_{14}$ and $R_{15}$ include a chlorine atom, a cyclohexyl group and cyclopentyl and cyclohexyl rings composed by bonding $R_{14}$ to each other. In the case where these groups contain substituents, examples of the substituents include a halogen atom, a carbonyl group, a nitro group, a nitrile group, a sulfonyl group, a carboxy group, carboxylic acid ester and sulfonic acid ester. Moreover, a reference code m denotes an integer of 1 to 8, preferably 1 to 3.

In the above-described general formula (Z), a reference code $X^-$ denotes anion. Concrete examples of compounds that become anion include perchloric acid, tetrafluoroboric acid, hexafluorophosphoric acid, triisopropyl naphthalene sulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid and paratoluenesulfonic acid. Among them, particularly, hexafluorophosphoric acid, triisopropylnaphthalenesulfonic acid and alkylaromatic sulfonic acid such as 2,5-dimethylbenzenesulfonic acid are preferably used.

The compound represented by the above-described general formula (Z) is a compound generally called cyanine dye. Specifically, compounds to be described below are preferably used. However, the present invention is not limited to these concrete examples.

CYANINE DYE A

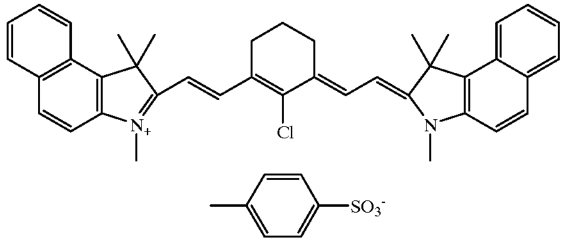

CYANINE DYE B

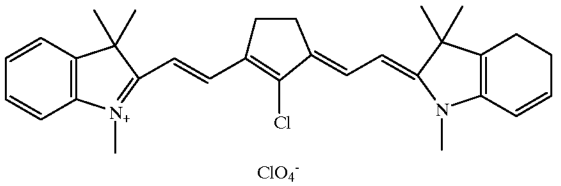

CYANINE DYE C

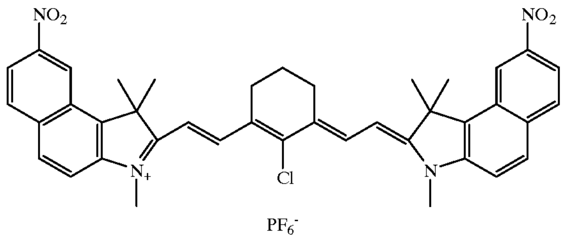

CYANINE DYE D

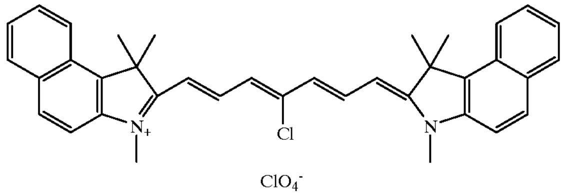

CYANINE DYE E

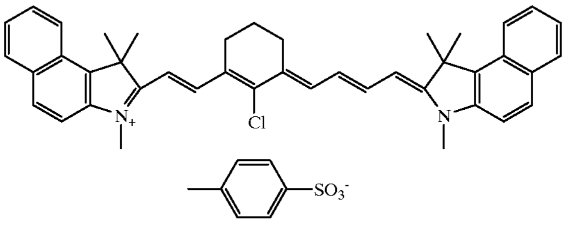

The above-described (B+C) component has a property to absorb light to generate heat (that is, property of (c) component). Moreover, the (B+C) component has a light absorbing band in the infrared region from 700 to 1,200 nm. Furthermore, the (B+C) component is good in compatibility with the alkali-soluble high-molecular compound, is basic dye, and contains, in a molecule, a group interacting on the alkali-soluble high-molecular compound containing an ammonium group and an iminium group (that is, has a property of (B) component). Accordingly, the (B+C) component can interact with the concerned high-molecular compound to control the alkali-solubility thereof, thus being preferably usable for the present invention.

In the present invention, in the case where the (B+C) component such as the above-described cyanine dye having the both properties of (B) component and (C) component is used in place of the same, the amount ratio of this compound to (A) component preferably ranges from 99/1 to 70/30 in terms of the photosensitivity, more preferably ranges from 99/1 to 75/25.

Other components

Various additives can be further added to the above-described photosensitive composition for use in the present invention according to needs. For example, for the purpose of increasing the photosensitivity, cyclic acid anhydrides, phenols, organic acids or sulfonyl compounds can be used together therewith.

Examples of the cyclic acid anhydrides include phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride, which are described in the specification of U.S. Pat. No. 4,115,128.

Examples of the phenols include bisphenol A, p-nitrophenol, p-ethoxyphenol, 2,4,4'-trihydroxy benzophenone, 2,3,4-trihydroxy benzophenone, 4-hydroxy benzophenone, 4,4',4"-trihydroxy triphenylmethane, 4,4',3",4"-tetrahydroxy-3,5,3',5'-tetramethyl triphenylmethane.

Examples of the organic acids include sulfonic acids, sulfinic acids, alkyl sulfuric acids, phosphonic acids, phosphoric esters and carboxylic acids, which are describe in the gazettes of JP-A-60-88942 and JP-A-2-96755. Specific examples include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxy benzoic acid, phthalic acid, terephthalic acid, 4-cyclohexene-1,2-dicarboxylic acid, erucic acid, lauric acid, n-undecanoic acid, ascorbic acid, bis(hydroxyphenyl)sulfone, methyl phenyl sulfone and diphenyl disulfone.

Amounts of the foregoing cyclic acid anhydride, phenols, organic acid groups and sulfonyl compounds in the total solids of the above-described photosensitive composition preferably ranges from 0.05 to 20 wt %, more preferably from 0.1 to 15 wt %, particularly preferably from 0.1 to 10 wt %.

Moreover, into the above-described photosensitive composition of the present invention, surfactant to be described below can be added for the purpose of increasing treatment stability to the developing conditions. Specifically, the surfactant includes nonionic surfactant as described in the gazettes of JP-A-62-251740 and JP-A-3-208514 and amphoteric surfactant as described in the gazettes of JP-A-59-121044 and JP-A-4-13149.

Concrete examples of the above-described nonionic surfactant include sorbitan tristearate, sorbitan monopalmitate, sorbitan triolate, stearic acid monoglyceride and polyoxyethylene nonylphenyl ether.

Concrete examples of the above-described amphoteric surfactant include alkyldi(aminoethyl)glycin, alkyl polyaminoethyl glycin hydrochloride, 2-alkyl-N-carboxyethyl-N-hydroxyethyl imidazolinium betaine and N-tetradecyl-N,N-betaine type (for example, article name "Amogen K", made by Dai-ichi Kogyo Co., Ltd.).

The content of each of the foregoing nonionic surfactant and the amphoteric surfactant in the total solids of the above-described photosensitive composition preferably ranges from 0.05 to 15 wt %, more preferably 0.1 to 5 wt %.

Into the above-described photosensitive composition for use in the present invention, a printing out agent for obtaining a visible image immediately after heating by exposure, as well as the dye or the pigment as an image coloring agent, can be added.

As printing out agent, combination of a compound releasing acid by heating by exposure (photo-acid releasing agent) and an organic dye capable of forming salt is exemplified. Specifically, enumerated are combination of o-naphthoquinone diazide-4-sulfonic acid halogenide and salt-forming organic dye, which are described in the gazettes of JP-A-50-36209 and JP-A-53-8128 and combination of a trihalomethyl compound and a salt-forming organic dye, which are described in the gazettes of JP-A-53-36223, JP-A-54-74728, JP-A-60-3626, JP-A-61-143748, JP-A-61-151644 and JP-A-63-58440. As such trihalomethyl compound, there are a oxazole series compound and a triazine series compound, both of which exhibit storability, and produce a clear printed out image.

As image coloring agent, dyes other than the above-described salt-forming organic dye can be used. As preferable dyes, an oil soluble dye and a basic dye including the salt-forming organic dye can be cited. Specific examples include oil yellow #101, oil yellow #103, oil pink #312, oil green BG, oil blue BOS, oil blue #603, oil black BY, oil black BS, and oil black T-505 (these are all made by Orient Chemical Industries Ltd.), Victorian pure blue, crystal violet (C.I. 42555), methyl violet (C.I. 42535), ethyl violet, Rhodamine B (C.I. 145170B), malachite green (C.I. 42000) and methylene blue (C.I. 52015). Particularly preferable dyes are those described in JP-62-293247 and JP-A-5-313359.

The above dyes can be added into the photosensitive composition preferably at the rate of 0.01 to 10 wt %, more preferably at the rate of 0.1 to 3 wt %, with respect to the solid content thereof.

As occasion demands, plasticizer is added into the photosensitive composition used for the present invention for the purpose of providing a coating layer with flexibility. Examples include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and acrylic or methacrylic acid oligomer or polymer.

Further, as occasion demands, photodegradable compounds such as quinone diazides, diazo compounds or the like may be added into the photosensitive composition. The amount of adding such compounds should preferably be set in the range of 1 to 5 wt % with respect to the solid content of the photosensitive composition.

The photosensitive layer of the present invention can be prepared typically by dissolving each of the above components in a solvent, and coating it over the support for the lithographic printing plate of the present invention. For the solvent to be used in this case, for example, one can be selected from ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N, N-dimethyl acetamide, N, N-dimethyl formamide, tetramethyl urea, N-methyl pyrrolidone, dimethyl sulfoxide, sulfolane, γ-butyrolactone and toluene. However, the solvent is not limited to these examples, and these solvents can be used either alone or in mixture.

The concentration of the above components in the solvent (all solid contents including additives) should preferably be set in the range of 1 to 50 wt %.

Also; the amount of the photosensitive layer coating (solid content) on the support obtained after coating and drying should preferably be set in the range of generally 0.5 to 5.0 g/m$^2$, and more preferably in the range of 0.7 to 3 g/m$^2$. In such a range, an average can easily be set in the range of 0.2 to 2 μm for those parts within the thinnest 10% in thickness of the photosensitive layer on the convex portions of the surface of the support that will be described later.

In the presensitized plate of the first aspect of the present invention, an average for those parts within the thinnest 10% in thickness of the photosensitive layer on the convex portions of the surface of the support is set in the range of 0.2 to 2 μm, preferably in the range of 0.2 to 1 μm, and more preferably in the range of 0.3 to 8 μm.

There is variance in thickness among portions of the photosensitive layer on numerous convex portions present on the surface of the support even on the same presensitized plate. According to the first aspect of the present invention, attention is directed to thin portions of the photosensitive layer, in which problems easily occur, and an average is obtained and used among the values of those parts within the thinnest 10% in thickness of the photosensitive layer on numerous convex portions present on the surface of the support.

By setting the thickness of the thinnest portion of the photosensitive layer on the convex portions of the surface of the support in the above range, it is conceived that stress inside the photosensitive layer is dispersed with respect to a pressure applied from the upper side of the photosensitive layer, and the fracture of the photosensitive layer can be thereby prevented.

Moreover, by setting the thickness of the thinnest portions of the photosensitive layer on the convex portions of the surface of the support in the above range, the problems of inadequate inkings or residual layers formed during development can be prevented, thus realizing a presensitized plate having excellent developing performance. Now, detailed explanation will follow.

If an average value is smaller than 0.2 μm for those parts within the thinnest 10% in thickness of the photosensitive layer on the convex portions of the surface of the support, as described with reference to the amount of alkali etching for the support for a lithographic printing plate, a thickness may easily decrease if developer sensitivity is high, causing an inadequate inking. In addition, scratch resistance may be greatly reduced.

On the other hand, if an average value is larger than 2 μm for those parts within the thinnest 10% in thickness of the photosensitive layer on the convex portions of the surface of the support, the amount of energy necessary for making the entire photosensitive layer soluble in alkali is increased. Thus, the formation of residual layers during development may easily occur, consequently narrowing the development latitude.

According to the first aspect of the present invention, an average is set in the range of 0.2 to 2 μm for those parts within the thinnest 10% in thickness of the photosensitive layer on the convex portions of the surface of the support. Thus, it is possible to prevent the problems including inadequate inkings in case of high developer sensitivity, damage caused by contact, the formation of residual layers during development and a narrow development latitude.

Various methods are available for coating. For example, one may be selected from bar coater coating, rotational coating, spray coating, curtain coating, dip coating, air knife coating, blade coating, and roll coating. As the coating amount is reduced, apparent sensitivity becomes higher, meanwhile, a layer characteristic of the photosensitive layer deteriorates.

Surfactant can be added into the photosensitive layer for the purpose of improving coating performance. For example, fluorine-containing surfactant described in JP-A-62-170950 can be used. The preferable amount of addition is in the range of 0.01 to 1 wt % with respect to the entire solid content of the photosensitive layer, and more preferably in the range of 0.05 to 0.5 wt %.

EXAMPLES

The following examples are provided-for the purpose of further illustrating the present invention but are in no way to be taken as limiting.

Examples About the First Aspect of the Present Invention

1. Preparation of Presensitized Plates

Example A-1

Molten metal was prepared by using an aluminum alloy containing Si: 0.06 wt %, Fe: 0.30 wt %, Cu: 0.017 wt %, Mn: 0.001 wt %, Mg: 0.001 wt %, Zn: 0.001 wt % and Ti: 0.03 wt %, and containing Al and inevitable impurities for the remaining portion. After molten metal processing and filtering, an ingot having a thickness of 500 mm and a width of 1200 mm was made by a DC casting method. After the surface was chipped to have an average thickness of 10 mm by a surface chipper, the ingot was held at 550° C. for about 5 hours for soaking. When the temperature dropped to 400° C., the ingot was formed into a rolled plate having a thickness of 2.7 mm by using a hot rolling mill. Further, after the heat treatment carried out at 500° C. by using a continuous annealing machine, the rolled plate was finished into an aluminum plate having a thickness of 0.24 mm by cold rolling. This aluminum plate was processed to have a width of 1030 mm, and surface treatment described below was continuously carried out.

(a) Alkali Etching

The aluminum plate obtained in the foregoing manner was subjected to spray etching by using aqueous solution containing 2.6 wt % of sodium hydroxide and 6.5 wt % of aluminum ions at a temperature of 70° C., and the aluminum plate was dissolved by 6 g/m$^2$. Then, the aluminum plate was washed by water spraying.

(b) Desmutting

The aluminum plate was subjected to spray desmutting treatment in aqueous solution of nitric acid 1 wt % (containing 0.5 wt % of aluminum ions), and then washed by water spraying. For the aqueous solution of nitric acid used in the desmutting treatment, waste solution generated in the process of electrochemical graining carried out by using an alternating current in the aqueous solution of nitric acid was utilized.

(c) Electrochemical Graining

Electrochemical graining treatment was continuously carried out by using an AC voltage of 60 Hz. Electrolytic solution in this case was the aqueous solution of nitric acid 1 wt % (containing aluminum ions 0.5 wt % and ammonium ions 0.007 wt %), and the temperature was 50° C. An AC power supply waveform was like that shown in FIG. 2. With the time TP necessary for a current value to reach its peak from zero set at 2 msec, and duty ratio set at 1:1, and by using a trapezoidal wave alternating current, the electrochemical graining treatment was carried out while carbon electrodes were set as counter electrodes. Ferrite was used for an auxiliary anode. An electrolytic cell used is shown in FIG. 6.

A current density was 30 A/dm$^2$ at a current peak value. Regarding the quantity of electricity, the total of the quantity of electricity was 250 C/dm$^2$ when the aluminum plate was at the anode side. An amount equivalent to 5% of a current flowing from a power source was diverted to the auxiliary anode.

Then, the aluminum plate was washed by water spraying.

(d) Alkali Etching

The aluminum plate was subjected to spray etching by using aqueous solution containing 26 wt % of sodium hydroxide and 6.5 wt % of aluminum ions at a temperature of 32° C. The aluminum plate was dissolved by 1 g/m$^2$, a smut component mainly containing aluminum hydroxide generated in the previous stage of the electrochemical graining carried out by using the alternating current was removed, and the edge portion of a formed pit was dissolved to be made smooth. Then, the aluminum plate was washed by water spraying.

(e) Desmutting

The aluminum plate was subjected to spray desmutting in aqueous solution of sulfuric acid 25 wt % (containing 0.5 wt % of aluminum ions) at a temperature of 60° C. Then, the aluminum plate was washed by water spraying.

(f) Anodizing

Figure 8:
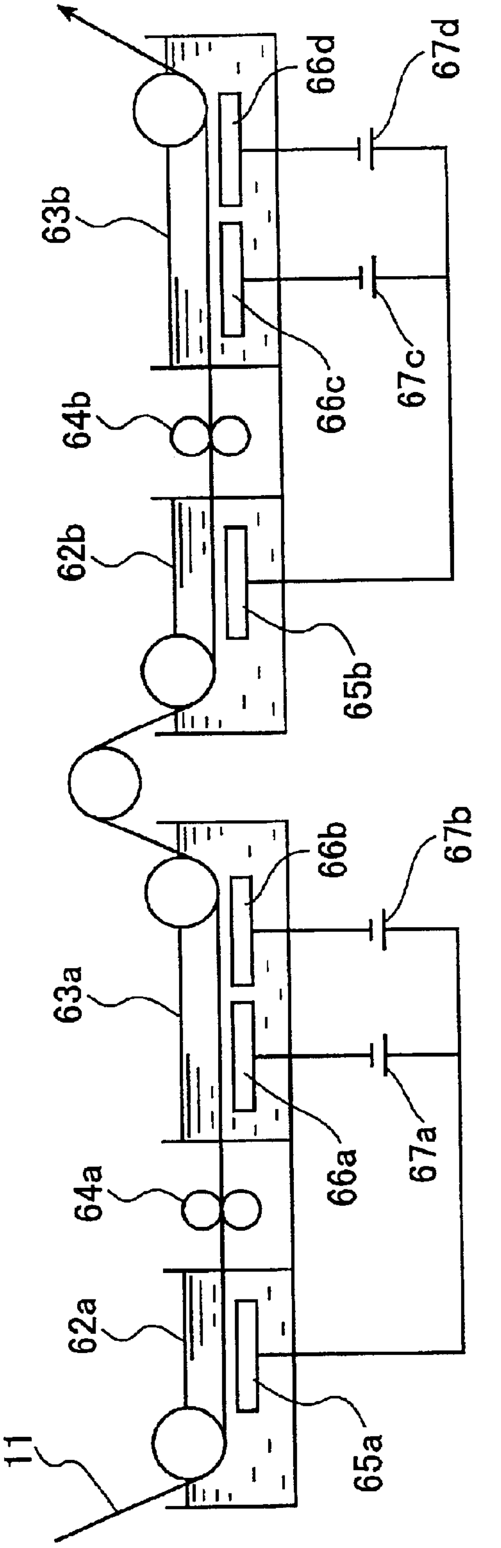
FIG. 8 is a schematic view of an anodizing device based on a two-stage power supply electrolytic method used in anodizing used in the present invention.

By using the anodizing device (each of first and second electrolytic portions has a length of 6 m, each of first and second power supply units has a length of 3 m, and each of first and second power supply electrodes has a length of 2.4 m) of a two-stage power supply electrolytic method having a structure shown in FIG. 8, anodizing was carried out under the conditions that the concentration of sulfuric acid was 170 g/L (containing 0.5 wt % of aluminum ions) for each of the first and second electrolytic portions and a temperature of 43° C. Then, the aluminum plate was washed by water spraying.

In the above-described anodizing device, currents from power sources 67*a* and 67*b* flow to a first power supply electrode 65*a* provided in a first power supply unit 62*a*, and flow through electrolytic solution to an aluminum plate 11. After passing through a set of nip rollers 64*a*, at a first electrolytic portion 63*a*, an oxide layer is formed on the surface of the aluminum plate 11. Then, the currents are passed through electrolytic electrodes 66*a* and 66*b* provided in the first electrolytic portion 63*a*, and returns to the power sources 67*a* and 67*b*.

On the other hand, currents from power sources 67*c* and 67*d* flow to a second power supply electrode 65*b* provided in a second power supply unit 62*b*, and flow through electrolytic solution to the aluminum plate 11 similarly to the above case. After passing through a set of nip rollers 64*b*, at a second electrolytic portion 63*b*, an oxide layer is formed on the surface of the aluminum plate 11. Then, the currents are passed through electrolytic electrodes 66*c* and 66*d* provided in the second electrolytic portion 63*b*, and returns to the power sources 67*c* and 67*d*.

The quantity of electricity supplied from each of the power sources 67*a* and 67*b* to the first power supply unit 62*a* was equal to that supplied from the power sources 67*c* and 67*d* to the second power supply unit 62*b*. A power supply current density on the surface of the oxide layer at the second power supply unit 62*b* was about 23 A/dm$^2$. It means that at the second power supply unit 62*b*, electric power was supplied through the oxide layer of 1.35 g/m$^2$ formed by the first electrolytic portion 63*a*. The amount of oxide layer was 2.7 g/m$^2$ at the end.

(g) Alkali Metal Silicate Treatment

Alkali metal silicate treatment (silicate treatment) was carried out by dipping a support for lithographic printing plate, obtained by the anodizing, into a treatment cell with the aqueous solution containing 1 wt % of III-sodium silicate at a temperature of 30° C. for 10 sec. Then, the support was washed by water spraying.

(h) Formation of Intermediate Layer (Undercoat Layer)

Undercoating solution containing a composition described below was coated on the support for a lithographic printing plate treated with the alkali metal silicate, obtained in the foregoing manner, and dried at a temperature of 80° C. for 15 sec, to form a layer. The coating amount after drying was 15 mg/m$^2$.

Undercoating Solution Composition

| | |
|---|---|
| high-molecular compound described below | 0.3 g |
| methanol | 100 g |
| water | 1 g |
| 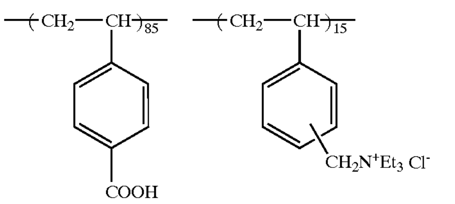 | MOLECULAR WEIGHT 28 THOUSANDS |

(i) Formation of Photosensitive Layer

Subsequently, photosensitive layer coating solution 1 having a composition described below was prepared and, the photosensitive layer coating solution 1 was coated over the support for a lithographic printing plate having the undercoat layer formed thereon, so that the amount after drying (the coating amount of photosensitive layer) meets 1.0 $g/m^2$. Then, drying was carried out in order to form a photosensitive layer. In this way, the presensitized plate of Example A-1 was obtained.

<Composition of Photosensitive Layer Coating Solution 1>

| | |
|---|---|
| capric acid | 0.03 g |
| particular copolymer 1 described later | 0.75 g |
| m, p-cresol novolac (m/p ratio = 6/4, weight-average molecular weight 3,500, and containing 0.5 wt % of unreacted cresol) | 0.25 g |
| p-toluenesulfonic acid | 0.003 g |
| tetrahydrophthalic anhydride | 0.03 g |
| cyanine dye A having a structural formula described below | 0.017 g |
| CYANINE DYE A 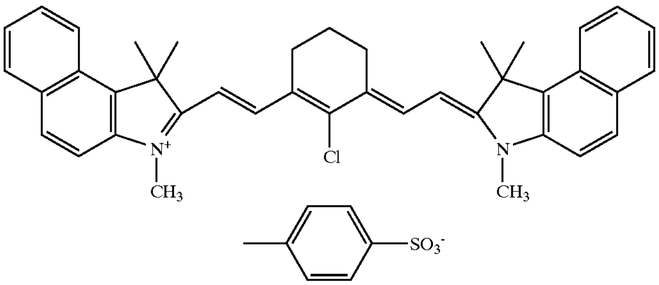 | |
| dye prepared by setting a counter ion of Victorian pure blue BOH as 1-naphthalene sulfonic acid anion | 0.015 g |
| fluorine-containing surfactant (MEGAFACE F177, by Dainippon Ink and Chemicals Inc.) | 0.05 g |
| γ-butyrolactone | 10 g |
| methyl ethyl ketone | 10 g |
| 1-methoxy-2-propanol | 1 g |

<Particular copolymer 1>

Methacrylic acid 31.0 g (0.36 mol), ethyl chloroformate 39.1 g (0.36 mol) and acetonitrile 200 mL were put in a 500 mL-capacity three-neck flask having an agitator, a cooling pipe and a dropping funnel, and a mixture was agitated while being cooled in an ice-water bath. Triethylamine 36.4 g (0.36 mol) was dropped to this mixture with the dropping funnel for about 1 hour. After the end of the dropping, the ice-water bath was removed and the mixture was agitated at a room temperature for 30 min.

Then, p-aminobenzene sulfonamide 51.7 g (0.30 mol) was added to the reactive mixture, and agitated for 1 hour while being heated to 70° C. in an oil bath. After the end of the reaction, the mixture was thrown into water 1 L while agitating the water, and the obtained mixture was agitated for 30 min. The mixture was filtered to remove deposition. After this deposition was turned into a slurry in water 500 mL, the slurry was filtered and, by drying an obtained solid, a white solid containing N-(p-aminosulfonyl phenyl) methacrylamide was obtained (yield 46.9 g).

Subsequently, N-(p-aminosulfonyl phenyl) methacrylamide 4.61 g (0.0192 mol), ethyl methacrylate 2.94 g (0.0258 mol), acrylonitrile 0.80 g (0.015 mol) and N, N-dimethyl acetamide 20 g were put in a 100 mL-capacity three-neck flask having an agitator, a cooling pipe and a dropping funnel. Then, a mixture was agitated while being heated to 65° C. in a hot-water bath. "V-65" (by Wako Pure Chemical Industries, Ltd.) 0.15 g was added to the mixture, and the mixture was agitated under a nitrogen gas flow for 2 hours while being maintained at 65° C. To this reactive mixture, the mixture of N-(p-aminosulfonyl phenyl) methacrylamide 4.61 g, ethyl methacrylate 2.94 g, acrylonitrile 0.80 g, N, N-dimethyl acetamide and "V-65" 0.15 g was further dropped with the dropping funnel for 2 hours. After the end of the dropping, the obtained mixture was further agitated at 65° C. for 2 hours. After the end of the reaction, methanol 40 g was added to the mixture, and cooled. The obtained mixture was then thrown into water 2 L while agitating the water. After the mixture was agitated for 30 min, deposition was removed by filtering, and the deposition was dried. Thus, a particular copolymer 1 which is a white solid of 15 g was obtained.

The weight-average molecular weight of the obtained particular copolymer 1 was measured by gel permeation chromatography, and it was 53,000 (polystyrene standard).

Example A-2 and Comparative Examples A-1 to A-4

A presensitized plate according to Example A-2 was obtained by the same method as that used for Example A-1, except for the dissolving amount of the aluminum plate in the (d) alkali etching, which was set equal to 4 $g/m^2$.

A presensitized plate according to Comparative Example A-1 was obtained by the same method as that used for Example A-1, except for the dissolving amount of the aluminum plate in the (d) alkali etching, which was set equal to 0.2 $g/m^2$.

A presensitized plate according to Comparative Example A-2 was obtained by the same method as that used for Example A-1, except for the dissolving amount of the aluminum plate in the (d) alkali etching, which was set equal to 10 $g/m^2$.

A presensitized plate according to Comparative Example A-3 was obtained by the same method as that used for he Example A-1, except for the coating amount of the photosensitive layer in the (i) formation of photosensitive layer, which was set equal to 0.5 $g/m^2$.

A presensitized plate according to Comparative Example A-4 was obtained by the same method as that used for Example A-1, except for the coating amount of the photosensitive layer in the (i) formation of photosensitive layer, which was set equal to 4 $g/m^2$.

2. Measurement of Thickness of the Photosensitive Layers on Convex Portions of the Surfaces of the Supports For a fractured surface of the anodized layer and the photosensitive layer exposed by bending each of the presensitized plates by 180°, 10-visual-field observation was carried out at a magnification of 20000 by using a T-20 scanning electron microscope (by JEOL, Ltd.). The thickness of each of 6 thinnest places among 60 places of the photosensitive layer on the convex portions of the surface of the support was measured, and an average was obtained. The result is shown in Table A-1.

3. Evaluation of the presensitized plates

The following points were evaluated for the presensitized plates obtained in the foregoing manner.

(1) Evaluation of Development Latitude

Each of the presensitized plate was subjected to exposure by using a semiconductor laser having a wavelength of 830 nm, and a beam diameter of 17 μm ($1/e^2$), such that plate surface energy could reach 120 $mJ/cm^2$ by the main operation speed of 5 m/sec. Then, development by an Automatic Processor 900NP was carried out by using PS plate developer DT-1 (Fuji Photo Film Co., Ltd.) under standard processing conditions.

Subsequently, the development was carried out while changing the electric conductivity of the developer in the manner described below, and development latitude was determined.

First, the developer was exhausted by carbon dioxide gas to reduce electric conductivity on 2 mS/cm scale, and the electrical conductivity causing visible residual layers to be formed on non-image areas of the printing plate was set as a lower limit value.

Then, when PS plate replenisher DT-1R (Fuji Photo film Co., Ltd.) was added to the developer used under the standard conditions to increase the electric conductivity on 2.0 mS/cm scale, the density of solid image areas of the printing plate was lowered. By using this printing plate, printing with DIC graph G (N) black ink (by Dainippon Ink and Chemicals Inc.) was carried out by a Diamond 1F-2 type Sheet-fed Press (by Mitsubishi Heavy Industries, Ltd.), the sheets were sampled after 100 sheets were printed from the start, the inking of the solid image areas was visually evaluated, and the electric conductivity having caused an inadequate inking was set as an upper limit value.

A difference between such lower and upper limit values is called development latitude, and the development latitude was represented by an electric conductivity width (mS/cm).

(2) Evaluation of Damage Resistance

The photosensitive layer surface of each of the presensitized plates was rubbed repeatedly by 5 times with a cotton glove, and directly developed by the developer used under the standard condition. The degree of clear portions due the damages by rubbing was visually observed and evaluated.

One having no changes from before the development was indicated by ○ one having the support almost seen and the color of the photosensitive layer not visible was indicated by X; and the intermediate levels were indicated by ○Δ, Δ, and ΔX.

The results of the evaluation is shown in Table A-1.

It can be understood that the presensitized plates of the first aspect of the present invention showed wide development latitude and high damage resistance (Examples A-1 and A-2).

On the contrary, if the amount of alkali etching or the thickness of the photosensitive layer on the convex portion of the surface of the support was not in the range according to the first aspect of the present invention, the development latitude was narrow and damage resistance was low (Comparative Examples A-1 to A-4).

TABLE A-1

| | Amount of alkali etching ($g/m^2$) | Coating amount of photosensitive layer ($g/m^2$) | Thickness of thinnest 10% of photosensitive layer on convex portions of surface of support (μm) | Development latitude (mS/cm) | Scratch resistance |
|---|---|---|---|---|---|
| Example A-1 | 1 | 1.0 | 0.2 | 12 | Δ |
| Example A-2 | 4 | 1.0 | 0.3 | 16 | ○Δ |
| Comparative Example A-1 | 0.2 | 1.0 | 0.1 | 8 | x |
| Comparative Example A-2 | 10 | 1.0 | 0.5 | 8 | Δx |

TABLE A-1-continued

| | Amount of alkali etching ($g/m^2$) | Coating amount of photosensitive layer ($g/m^2$) | Thickness of thinnest 10% of photosensitive layer on convex portions of surface of support ($\mu m$) | Development latitude (mS/cm) | Scratch resistance |
|---|---|---|---|---|---|
| Comparative Example A-3 | 1 | 0.5 | 0.05 | 6 | x |
| Comparative Example A-4 | 1 | 4.0 | 2.5 | 6 | Δx |

Examples about the Second Aspect of the Present Invention

1. Preparation of Supports for a Lithographic Printing plates

Example B-1

(a) Treatment was continuously carried out by using JIS A3005 aluminum plate having a thickness of 0.3 mm and a width of 1030 mm (the aspect ratio (a ratio of a length of the width direction with respect to a length of the rolling direction)=1.1) as described below.

(b) Mechanical graining was carried out by rotating roller-like nylon brushes while supplying suspension containing silica sand having specific gravity of 1.12 and water as graining slurry liquid to the surface of the aluminum plate. A material for the nylon brush was 6–10 nylon, having a bristle length of 50 mm, and a bristle diameter of 0.295 mm. The nylon brush was made by boring holes in a ϕ300 mm stainless cylinder and densely implanting bristles therein. Three of such rotary brushes were prepared. Each distance between two supporting rollers (ϕ200 mm) in the lower part of the brush was 300 mm. Each brush roller was pressed until a load of a driving motor for rotating the brush reached plus 7 kW with respect to the load before the brush roller was pressed to the aluminum plate. The rotating direction of each brush was the same as the moving direction of the aluminum plate.

(c) The aluminum plate was subjected to spray etching by using aqueous solution containing 26 wt % of sodium hydroxide and 6.5 wt % of aluminum ions, at a solution temperature of 75° C. The aluminum plate was dissolved by 5 $g/m^2$, and pointed portions of the asperities formed by the brush and the slurry liquid were dissolved. Then, the aluminum plate was washed by water spraying.

(d) Spray desmutting was carried out by using aqueous solution containing nitric acid 1 wt % (containing 0.5 wt % of aluminum ions) at a solution temperature of 30° C., and then the aluminum plate was washed by water spraying. For the aqueous solution based on nitric acid, used in the desmutting, waste solution resulted from the process of electrochemical graining carried out by using an alternating current in the aqueous solution of nitric acid was used.

(e) Electrochemical graining was continuously carried out by using a DC voltage. Electrolytic solution in this case was aqueous solution containing nitric acid 1 wt % (containing 0.5 wt % of aluminum ions and 0.007 wt % of ammonium ions), and a solution temperature was 50° C. Ferrite was used for an anode, and titanium for a cathode. For electrolytic treatment, a DC voltage having a ripple rate of 20% or lower was used. A current density was 80 $A/dm^2$, and the quantity of electricity was 200 $C/dm^2$. The cathode and the anode made a pair. Then, the aluminum plate was washed by water spraying.

(f) The aluminum plate was subjected to spray etching by using aqueous solution containing 26 wt % of sodium hydroxide and 6.5 wt % of aluminum ions. Light etching was carried out to dissolve the aluminum plate by 5.0 $g/m^2$, and a smut component mainly containing aluminum hydroxide, generated in the previous stage of the electrochemical graining carried out in the aqueous solution based on nitric acid by using the alternating current, was removed. Then, the aluminum plate was washed by water spraying.

(g) Spray desmutting was carried out by using the aqueous solution of nitric acid 1 wt % (containing 0.5 wt % of aluminum ions and 0.007 wt % of ammonium ions) at a solution temperature of 30° C. Then, the aluminum plate was washed by water spraying. For the aqueous solution based on nitric acid, used in the desmutting, waste solution resulted from the process of electrochemical graining carried out by using an alternating current was used.

(h) Electrochemical graining was continuously carried out by using an AC voltage. Electrolytic solution this case was aqueous solution containing nitric acid 1 wt % (containing 0.5 wt % of aluminum ions and 0.007 wt % of ammonium ions), and a solution temperature was 50° C. For the waveform of an AC power supply, the time TP necessary for a current value to reach its peak from zero was set equal to 1 msec, a duty ratio equal to 1:1, and by using a trapezoidal wave alternating current, the electrochemical graining was carried out with carbon electrodes set as counter electrodes. Ferrite was used for an auxiliary anode. A current density was 60 $A/dm^2$ at a peak current value, and the total of the quantity of electricity was 240 $C/dm^2$ when the aluminum plate was at the anode side. 5% of the amount of current flowing from the power source was diverted to the auxiliary anode. Then, the aluminum plate was washed by water spraying.

(i) The aluminum plate was subjected to spray etching by using aqueous solution containing 5 wt % of sodium hydroxide and 0.5 wt % of aluminum ions. The aluminum plate was dissolved by 0.1 $g/m^2$, and a smut component mainly containing aluminum hydroxide, generated in the previous stage of the electrochemical graining carried out by using the alternating current, was removed. Also, the edge portion of a formed pit was dissolved to be made smooth. Then, the aluminum plate was washed by water spraying.

(j) Spray desmutting was carried out by using aqueous solution containing sulfuric acid 25 wt % (containing 0.5 wt % of aluminum ions) at a solution temperature of 60° C. Then, the aluminum plate was washed by water spraying.

(k) Anodizing was carried out by using a DC voltage in aqueous solution containing nitric acid 15 wt % (containing 0.5 wt % of aluminum ions) at a solution temperature of 35° C. such that the amount of an anodized layer could reach 1.8 $g/m^2$ at a current density of 2 $A/dm^2$.

(l) After each treatment and water washing, solution squeegeeing was carried out by a nip roller. The support for a lithographic printing plate thus obtained was then applied to the preparation of a presensitized plate as described later.

Example B-2

(a) Treatment was continuously carried out by using JIS A3005 aluminum plate having a thickness of 0.3 mm and a width of 1030 mm (the aspect ratio—1.3) as described below.

(b) Mechanical graining was carried out by rotating a roller-like nylon brushes while supplying suspension containing silica sand having specific gravity of 1.12 and water as graining slurry liquid to the surface of the aluminum plate. A material for the nylon brush was 6.10 nylon, having a bristle length of 50 mm, and a bristle diameter of 0.48 mm. The nylon brush was made by boring holes in a ϕ300 mm stainless cylinder and densely implanting bristles therein. Three of such rotary brushes were prepared. Each distance between two supporting rollers (ϕ200 mm) in the lower part of the brush was 300 mm. Each brush roller was pressed until a load of a driving motor for rotating the brush reached plus 7 kW with respect to the load before each brush roller was pressed to the aluminum plate. The rotating direction of the brush was the same as the moving direction of the aluminum plate. (c) The aluminum plate was subjected to spray etching by using aqueous solution containing 26 wt % of sodium hydroxide and 6.5 wt % of aluminum ions, at a solution temperature of 75° C. The aluminum plate was dissolved by 5 $g/m^2$, and pointed portions of the asperities formed by the brush and the slurry liquid were dissolved. Then, the aluminum plate washed by water spraying.

(d) Spray desmutting was carried out by using aqueous solution containing hydrochloric acid 1 wt % (containing 0.5 wt % of aluminum ions) at a solution temperature of 30° C., and then the aluminum plate was washed by water spraying. For the aqueous solution based on hydrochloric acid used in the desmutting, waste solution resulted from the process of electrochemical graining carried out by using an alternating current in the aqueous solution of hydrochloric acid was used.

(e) Electrochemical graining was continuously carried out by using an AC voltage. Electrolytic solution in this case was aqueous solution containing hydrochloric acid 1 wt % (containing 0.5 wt % of aluminum ions), and a solution temperature was 35° C. For the waveform of an AC power supply, the time TP necessary for a current value to reach its peak value from 0 was set equal to 1 msec, a duty ratio equal to 1:1, and by using a trapezoidal wave alternating current, the electrochemical graining was carried out with carbon electrodes set as counter electrodes. Ferrite was used for an auxiliary anode. A current density was 25 $A/dm^2$ at a peak current value, and the total of the quantity of electricity 100 $C/dm^2$ when the aluminum plate was at the anode side. 5% of the amount of current flowing from the power source was diverted to the auxiliary anode. Then, the aluminum plate was washed by water spraying.

(f) The aluminum plate was subjected to spray etching by using aqueous solution containing 26 wt % of sodium hydroxide and 6.5 wt % of aluminum ions. Light etching was carried out to dissolve the aluminum plate by 0.3 $g/m^2$, and a smut component mainly containing aluminum hydroxide, generated in the previous stage of the electrochemical graining carried out in the aqueous solution based on hydrochloric acid by using the alternating current, was removed. Then, the aluminum plate was washed by water spraying.

(g) Spray desmutting was carried out by using the aqueous solution of nitric acid 1 wt % (containing 0.5 wt % of aluminum ions and 0.007 wt % of ammonium ions) at a solution temperature of 30° C. Then, the aluminum plate was washed by water spraying. For the aqueous solution based on nitric acid used in the desmutting, waste solution resulted from the process of electrochemical graining carried out by using an alternating current was used.

(h) Electrochemical graining was continuously carried out by using an AC voltage. Electrolytic solution in this case was aqueous solution containing nitric acid 1 wt % (containing 0.5 wt % of aluminum ions and 0.007 wt % of ammonium ions), and a solution temperature was 50° C. For the waveform of an AC power supply, the time TP necessary for a current value to reach its peak from zero was set equal to 1 msec, a duty ratio equal to 1:1, and by using a trapezoidal wave alternating current, the electrochemical graining was carried out with carbon electrodes set as counter electrodes. Ferrite was used for an auxiliary anode. A current density was 60 $A/dm^2$ at a peak current value, and the total of the quantity of electricity was 240 $C/dm^2$ when the aluminum plate was at the anode side. 5% of the amount of current flowing from the power source was diverted to the auxiliary anode. Then, the aluminum plate was washed by water spraying.

(i) The aluminum plate was subjected to spray etching by using aqueous solution containing 5 wt % of sodium hydroxide and 0.5 wt % of aluminum ions. The aluminum plate was dissolved by 0.1 $g/m^2$, and a smut component mainly containing aluminum hydroxide, generated in the previous stage of the electrochemical graining carried out by using the alternating current, was removed. Also, the edge portion of a formed pit was dissolved to be made smooth. Then, the aluminum plate was washed by water spraying.

(j) Spray desmutting was carried out by using aqueous solution containing sulfuric acid 25 wt % (containing 0.5 wt % of aluminum ions) at a solution temperature of 60° C. Then, the aluminum plate was washed by water spraying.

(k) Anodizing was carried out by using a DC voltage in aqueous solution containing sulfuric acid 15 wt % (containing 0.5 wt % of aluminum ions) at a solution temperature of 35° C. such that the amount of an anodized layer could reach 1.8 $g/m^2$ at a current density of 2 $A/dm^2$.

(l) After each treatment and water washing, solution squeegeeing was carried out by a nip roller. The support for a lithographic printing plate thus obtained was then applied to the preparation of a presensitized plate as described later.

Example B-3

(a) Treatment was continuously carried out by using JIS A1050 aluminum plate having a thickness of 0.3 mm and a width of 1030 mm (the aspect ratio=1.1) as described below.

(b) Mechanical graining was carried out by rotating a roller-like nylon brushes while supplying suspension containing silica sand having specific gravity of 1.12 and water as graining slurry liquid to the surface of the aluminum plate. A material for the nylon brush was 6.10 nylon, having a bristle length of 50 mm, and a bristle diameter of 0.295 mm. The nylon brush was made by boring holes in a ϕ300 mm stainless cylinder and densely implanting bristles therein. Three of such rotary brushes were prepared. Each distance between two supporting rollers (ϕ200 mm) in the lower part of the brush was 300 mm. Each brush roller was pressed until a load of a driving motor for rotating the brush reached plus 7 kW with respect to the load before the brush roller was pressed to the aluminum plate. The rotating direction of each brush was the same as the moving direction of the aluminum plate.

(c) The aluminum plate was subjected to spray etching by using aqueous solution containing 26 wt % of sodium hydroxide and 6.5 wt % of aluminum ions, at a solution temperature of 75° C. The aluminum plate was dissolved by 3 $g/m^2$, and concave and pointed portions of the asperities formed by the brush and the slurry liquid were dissolved. Then, the aluminum plate washed by water spraying.

(d) Spray desmutting was carried out by using aqueous solution containing nitric acid 1 wt % (containing 0.5 wt % of aluminum ions) at a solution temperature of 30° C., and then the aluminum plate was washed by water spraying. For the aqueous solution based on nitric acid, used in the desmutting, waste solution resulted from the process of electrochemical graining carried out by using an alternating current in the aqueous solution of nitric acid was used.

(e) Electrochemical graining was continuously carried out by using an AC voltage. Electrolytic solution in this case was aqueous solution containing nitric acid 1 wt % (containing 0.5 wt % of aluminum ions and 0.007 wt % of ammonium ions), and a solution temperature was 50° C. For the waveform of an AC power supply, the time TP necessary for a current value to reach its peak value from 0 was set equal to 1 msec, a duty ratio equal to 1:1, and by using a trapezoidal wave alternating current, the electrochemical graining was carried out with carbon electrodes set as counter electrodes. Ferrite was used for an auxiliary anode. A current density was 60 $A/dm^2$ at a peak current value, and the total of the quantity of electricity 100 $C/dm^2$ when the aluminum plate was at the anode side. 5% of the amount of current flowing from the power source was diverted to the auxiliary anode. Then, the aluminum plate was washed by water spraying.

(f) The aluminum plate was subjected to spray etching by using aqueous solution containing 5 wt % of sodium hydroxide and 0.5 wt % of aluminum ions. The aluminum plate was dissolved by 1.7 $g/m^2$, and a smut component mainly containing aluminum hydroxide, generated in the previous stage of the electrochemical graining carried out by using the alternating current, was removed. Also, the edge portion of a formed pit was dissolved to be made smooth. Then, the aluminum plate was washed by water spraying.

(g) Spray desmutting was carried out by using the aqueous solution of sulfuric acid 25 wt % (containing 0.5 wt % of aluminum ions) at a solution temperature of 60° C. Then, the aluminum plate was washed by water spraying. (k) Anodizing was carried out by using a DC voltage in aqueous solution containing sulfuric acid 15 wt % (containing 0.5 wt % of aluminum ions) at a solution temperature of 35° C. such that the amount of an anodized layer could reach 1.8 $g/m^2$ at a current density of 2 $A/dm^2$.

(l) After each treatment and water washing, solution squeegeeing was carried out by a nip roller. The support for a lithographic printing plate thus obtained was then applied to the preparation of a presensitized plate as described later.

Example B-4

(a) Treatment was continuously carried out by using JIS A1050 aluminum plate having a thickness of 0.3 mm and a width of 1030 mm (the aspect ratio=1.1) as described below.

(b) Mechanical graining was carried out by rotating a roller-like nylon brushes while supplying suspension containing silica sand having specific gravity of 1.12 and water as graining slurry liquid to the surface of the aluminum plate. A material for the nylon brush was 6.10 nylon, having a bristle length of 50 mm, and a bristle diameter of 0.48 mm. The nylon brush was made by boring holes in a ϕ300 mm stainless cylinder and densely implanting bristles therein. Three of such rotary brushes were prepared. Each distance between two supporting rollers (ϕ200 mm) in the lower part of the brush was 300 mm. Each brush roller was pressed until a load of a driving motor for rotating the brush reached plus 7 kW with respect to the load before the brush roller was pressed to the aluminum plate. The rotating direction of each brush was the same as the moving direction of the aluminum plate.

(c) The aluminum plate was subjected to spray etching by using aqueous solution containing 26 wt % of sodium hydroxide and 6.5 wt % of aluminum ions, at a solution temperature of 75° C. The aluminum plate was dissolved by 4 $g/m^2$, and pointed portions of asperity formed by the brush and the slurry liquid were dissolved. Then, the aluminum plate was washed by water spraying.

(d) Spray desmutting was carried out by using aqueous solution containing nitric acid 1 wt % (containing 0.5 wt % of aluminum ions) at a solution temperature of 30° C., and then the aluminum plate was washed by water spraying. For the aqueous solution based on nitric acid used in the desmutting, waste solution resulted from the process of electrochemical graining carried out by using an alternating current in the aqueous solution of nitric acid was used.

(e) Electrochemical graining was continuously carried out by using an AC voltage. Electrolytic solution in this case was aqueous solution containing nitric acid 1 wt % (containing 0.5 wt % of aluminum ions and 0.007 wt % of ammonium ions), and a solution temperature was 50° C. For the waveform of an AC power supply, the time TP necessary for a current value to reach its peak value from 0 was set equal to 1 msec, a duty ratio was set equal to 1:1, and by using a trapezoidal wave alternating current, the electrochemical graining was carried out with carbon electrodes set as counter electrodes. Ferrite was used for an auxiliary anode. A current density was 60 $A/dm^2$ at a peak current value, and the total of the quantity of electricity was 160 $C/dm^2$ when the aluminum plate was at the anode side. The current flowing from the power source was diverted by 5% to the auxiliary anode. Then, the aluminum plate was washed by water spraying.

(f) The aluminum plate was subjected to spray etching by using aqueous solution containing 5 wt % of sodium hydroxide and 0.5 wt % of aluminum ions. The aluminum plate was dissolved by 0.2 $g/m^2$, and a smut component mainly containing aluminum hydroxide, generated in the previous stage of the electrochemical graining carried out by using the alternating current, was removed. Also, the edge portion of a formed pit was dissolved to be made smooth. Then, the aluminum plate was washed by water spraying.

(g) Spray desmutting was carried out by using the aqueous solution containing sulfuric acid 25 wt % (containing 0.5 wt % of aluminum ions) at a solution temperature of 60° C. Then, the aluminum plate was washed by water spraying.

(k) Anodizing was carried out by using a DC voltage in aqueous solution containing sulfuric acid 15 wt % (containing 0.5 wt % of aluminum ions) at a solution temperature of 35° C. so that the amount of an anodized layer could reach 1.2 $g/m^2$ at a current density of 2 $A/dm^2$.

(l) After each treatment and water washing, solution squeegeeing was carried out by a nip roller. The support for a lithographic printing plate thus obtained was then applied to the preparation of a presensitized plate as described later.

Examples B-5 to B-7

A support for a lithographic printing plate was prepared by the same method as that used for Example B-1, except for the fact that the step (b) as omitted, and after the step (k), the aluminum plate was dipped in the aqueous solution containing 1.0 wt % of sodium silicate at a solution temperature of 20° C. for 14 sec for the purpose of treatment for water wettability, then washed by water spraying, and dried.

(Comparative Example B-1

(a) Treatment was continuously carried out by using JIS A1050 aluminum plate having a thickness of 0.3 mm and a width of 1030 mm (the aspect ratio=1.1) as described below.

(c) The aluminum plate was subjected to spray etching by using aqueous solution containing 26 wt % of sodium hydroxide and 6.5 wt % of aluminum ions, at a solution temperature of 75° C. The aluminum plate was dissolved by 5 $g/m^2$, and rolling oil or a natural oxide layer was removed. Then, the aluminum plate was washed by water spraying.

(d) Spray desmutting was carried out by using aqueous solution containing nitric acid 1 wt % (containing 0.5 wt % of aluminum ions and 0.007 wt % of ammonium ions) at a solution temperature of 30° C., and then the aluminum plate was washed by water spraying. For the aqueous solution based on nitric acid used in the desmutting, waste solution resulted from the process of electrochemical graining carried out by using an alternating current in the aqueous solution of nitric acid was used.

(e) Electrochemical graining was continuously carried out by using an AC voltage. Electrolytic solution in this case was aqueous solution containing nitric acid 1 wt % (containing 0.5 wt % of aluminum ions and 0.007 wt % of ammonium ions), and a solution temperature was 50° C. For the waveform of an AC power supply, the time TP necessary for a current value to reach its peak value from 0 was set equal to 1 msec, a duty ratio was set equal to 1:1, and by using a trapezoidal wave alternating current, the electrochemical graining was carried out with carbon electrodes set as counter electrodes. Ferrite was used for an auxiliary anode. A current density was 60 $A/dm^2$ at a peak current value, and the total of the quantity of electricity was 270 $C/dm^2$ when the aluminum plate was at the anode side. The current flowing from the power source was diverted by 5% to the auxiliary anode. Then, the aluminum plate was washed by water spraying.

(f) The aluminum plate was subjected to spray etching by using aqueous solution containing 5 wt % of sodium hydroxide and 0.5 wt % of aluminum ions. The aluminum plate was dissolved by 0.2 $g/m^2$, and a smut component mainly containing aluminum hydroxide generated in the previous stage of the electrochemical graining carried out by using the alternating current, was removed. Also, the edge portion of a formed pit was dissolved to be made smooth. Then, the aluminum plate was washed by water spraying.

(g) Spray desmutting was carried out by using the aqueous solution containing sulfuric acid 25 wt % (containing 0.5 wt % of aluminum ions) at a solution temperature of 60° C. Then, the aluminum plate was washed by water spraying.

(k) Anodizing was carried out by using a DC voltage in aqueous solution containing sulfuric acid 15 wt % (containing 0.5 wt % of aluminum ions) at a solution temperature of 35° C. so that the amount of an anodized layer could reach 2.7 $g/m^2$ at a current density of 2 $A/dm^2$.

(l) After each treatment and water washing, solution squeegeeing was carried out by a nip roller. The support for a lithographic printing plate thus obtained was then applied to the preparation of a presensitized plate as described later.

Comparative Example B-2

(a) Treatment was continuously carried out by using JIS A1050 aluminum plate having a thickness of 0.3 mm and a width of 1030 mm (the aspect ratio=1.1) as described below.

(c) The aluminum plate was subjected to spray etching by using aqueous solution containing 26 wt % of sodium hydroxide and 6.5 wt % of aluminum ions, at a solution temperature of 75° C. The aluminum plate was dissolved by 5 $g/m^2$, and rolling oil or a natural oxide layer was removed. Then, the aluminum plate was washed by water spraying.

(d) Spray desmutting was carried out by using aqueous solution containing nitric acid 1 wt % (containing 0.5 wt % of aluminum ions and 0.007 wt % of ammonium ions) at a solution temperature of 30° C., and then the aluminum plate was washed by water spraying. For the aqueous solution based on nitric acid used in the desmutting, waste solution resulted from the process of electrochemical graining carried out by using an alternating current in the aqueous solution of nitric acid was used.

(e) Electrochemical graining was continuously carried out by using an AC voltage. Electrolytic solution in this case was aqueous solution containing nitric acid 1 wt % (containing 0.5 wt % of aluminum ions and 0.007 wt % of ammonium ions), and a solution temperature was 50° C. For the waveform of an AC power supply, the time TP necessary for a current value to reach its peak value from 0 was set equal to 1 msec, a duty ratio was set equal to 1:1, and by using a trapezoidal wave alternating current, the electrochemical graining was carried out with carbon electrodes set as counter electrodes. Ferrite was used for an auxiliary anode. A current density was 60 $A/dm^2$ at a peak current value, and the total of the quantity of electricity was 300 $C/dm^2$ when the aluminum plate was at the anode side. The current flowing from the power source was diverted by 5% to the auxiliary anode. Then, the aluminum plate was washed by water spraying.

(f) The aluminum plate was subjected to spray etching by using aqueous solution containing 5 wt % of sodium hydroxide and 0.5 wt % of aluminum ions. The aluminum plate was dissolved by 0.1 $g/m^2$, and a smut component mainly containing aluminum hydroxide, generated in the previous stage of the electrochemical graining carried out by using the alternating current, was removed. Then, the aluminum plate was washed by water spraying.

(g) Spray desmutting was carried out by using the aqueous solution containing sulfuric acid 25 wt % (containing 0.5 wt % of aluminum ions) at a solution temperature of 60° C. Then, the aluminum plate was washed by water spraying.

(k) Anodizing was carried out by using a DC voltage in aqueous solution containing sulfuric acid 15 wt % (containing 0.5 wt % of aluminum ions) at a solution temperature of 35° C. so that the amount of an anodized layer could reach 1.8 $g/m^2$ at a current density of 2 $A/dm^2$.

(l) After each treatment and water washing, solution squeegeeing was carried out by a nip roller. The support for a lithographic printing plate thus obtained was then applied to the preparation of a presensitized plate as described later.

Comparative Example B-3

(a) Treatment was continuously carried out by using JIS A3005 aluminum plate having a thickness of 0.3 mm and a width of 1030 mm (the aspect ratio=1.1) as described below.

(b) Mechanical graining was carried out by rotating a roller-like nylon brushes while supplying suspension containing silica sand having specific gravity of 1.12 and water as graining slurry liquid to the surface of the aluminum plate. A material for the nylon brush was 6.10 nylon, having a bristle length of 50 mm, and a bristle diameter of 0.295 mm. The nylon brush was made by boring holes in a ϕ300 mm stainless cylinder and densely implanting bristles therein. Three of such rotary brushes were prepared. Each distance between two supporting rollers (ϕ200 mm) in the lower part of the brush was 300 mm. Each brush roller was pressed until a load of a driving motor for rotating the brush reached plus 7 kW with respect to the load before the brush roller was pressed to the aluminum plate. The rotating direction of each brush was the same as the moving direction of the aluminum plate.

(c) The aluminum plate was subjected to spray etching by using aqueous solution containing 26 wt % of sodium hydroxide and 6.5 wt % of aluminum ions, at a solution temperature of 75° C. The aluminum plate was dissolved by 5 g/m$^2$, and pointed portions of asperity formed by the brush and the slurry liquid were dissolved. Then, the aluminum plate was washed by water spraying.

(d) Spray desmutting was carried out by using aqueous solution containing hydrochloric acid 1 wt % (containing 0.5 wt % of aluminum ions) at a solution temperature of 30° C., and then the aluminum plate was washed by water spraying. For the aqueous solution based on hydrochloric acid used in the desmutting, waste solution resulted from the process of electrochemical graining carried out by using an alternating current in the aqueous solution of hydrochloric acid was used.

(e) Electrochemical graining was continuously carried out by using an AC voltage. Electrolytic solution in this case was aqueous solution containing hydrochloric acid 1 wt % (containing 0.5 wt % of aluminum ions), and a solution temperature was 35° C. For the waveform of an AC power supply, the time TP necessary for a current value to reach its peak value from 0 was set equal to 1 msec, a duty ratio was set equal to 1:1, and by using a trapezoidal wave alternating current, the electrochemical graining was carried out with carbon electrodes set as counter electrodes. Ferrite was used for an auxiliary anode. A current density was 25 A/dm$^2$ at a peak current value, and the total of the quantity of electricity was 100 C/dm$^2$ when the aluminum plate was at the anode side. The current flowing from the power source was diverted by 5% to the auxiliary anode. Then, the aluminum plate was washed by water spraying.

(f) The aluminum plate was subjected to spray etching by using aqueous solution containing 26 wt % of sodium hydroxide and 6.5 wt % of aluminum ions. Light etching was carried out to dissolve the aluminum plate by 0.3 g/m$^2$, and a smut component mainly containing aluminum hydroxide, generated in the previous stage of the electrochemical graining carried out in the aqueous solution based on hydrochloric acid by using the alternating current, was removed. Then, the aluminum plate was washed by water spraying.

(g) Spray desmutting was carried out by using the aqueous solution containing nitric acid 1 wt % (containing 0.5 wt % of aluminum ions and 0.007 wt % of ammonium ions) at a solution temperature of 30° C. Then, the aluminum plate was washed by water spraying. For the aqueous solution based on nitric acid used in the desmutting, waste solution resulted from the process of electrochemical graining carried out by using an alternating current was used.

(h) Electrochemical graining was continuously carried out by using an AC voltage. Electrolytic solution in this case was aqueous solution containing nitric acid 1 wt % (containing 0.5 wt % of aluminum ions and 0.007 wt % of ammonium ions), and a solution temperature was 50° C. For the waveform of an AC power supply, the time TP necessary for a current value to reach its peak from zero was set equal to 1 msec, and a duty ratio was set equal to 1:1, and by using a trapezoidal wave alternating current, the electrochemical graining was carried out with carbon electrodes set as counter electrodes. Ferrite was used for an auxiliary anode. A current density was 60 A/dm$^2$ at a peak current value, and the total of the quantity of electricity was 240 C/dm$^2$ when the aluminum plate was at the anode side. The current flowing from the power source was diverted by 5% to the auxiliary anode. Then, the aluminum plate was washed by water spraying.

(i) The aluminum plate was subjected to spray etching by using aqueous solution containing 5 wt % of sodium hydroxide and 0.5 wt % of aluminum ions. The aluminum plate was dissolved by 0.1 g/m$^2$, and a smut component mainly containing aluminum hydroxide, generated in the previous stage of the electrochemical graining carried out by using the alternating current, was removed. Also, the edge portion of a formed pit was dissolved to be made smooth. Then, the aluminum plate was washed by water spraying.

(j) Spray desmutting was carried out by using aqueous solution containing sulfuric acid 25 wt % (containing 0.5 wt % of aluminum ions) at a solution temperature of 60° C. Then, the aluminum plate was washed by water spraying.

(k) Anodizing was carried out by using a DC voltage in aqueous solution containing sulfuric acid 15 wt % (containing 0.5 wt % of aluminum ions) at a solution temperature of 35° C. so that the amount of an anodized layer could reach 1.8 g/m$^2$ at a current density of 2 A/dm$^2$.

(l) After each treatment and water washing, solution squeegeeing was carried out by a nip roller. The support for a lithographic printing plate thus obtained was then applied to the preparation of a presensitized plate as described later.

Comparative Example B-4

(a) Treatment was continuously carried out by using JIS A3005 aluminum plate having a thickness of 0.3 mm and a width of 1030 mm (the aspect ratio=1.3) as described below.

(b) Mechanical graining was carried out by rotating a roller-like nylon brushes while supplying suspension containing silica sand having specific gravity of 1.12 and water as abrasive slurry liquid to the surface of the aluminum plate. A material for the nylon brush was 6.10 nylon, having a bristle length of 50 mm, and a bristle diameter of 0.48 mm. The nylon brush was made by boring holes in a ϕ300 mm stainless cylinder and densely implanting bristles therein. Three of such rotary brushes were prepared. Each distance between two supporting rollers (ϕ200 mm) in the lower part of the brush was 300 mm. Each brush roller was pressed until a load of a driving motor for rotating the brush reached plus 7 kW with respect to the load before the brush roller was pressed to the aluminum plate. The rotating direction of each brush was the same as the moving direction of the aluminum plate.

(c) The aluminum plate was subjected to spray etching by using aqueous solution containing 26 wt % of sodium hydroxide and 6.5 wt % of aluminum ions, at a solution temperature of 75° C. The aluminum plate was dissolved by 5 $g/m^2$, and pointed portions of asperity formed by the brush and the slurry liquid were dissolved. Then, the aluminum plate was washed by water spraying.

(d) Spray desmutting was carried out by using aqueous solution containing hydrochloric acid 1 wt % (containing 0.5 wt % of aluminum ions) at a solution temperature of 30° C., and then the aluminum plate was washed by water spraying. For the aqueous solution based on hydrochloric acid used in the desmutting, waste solution resulted from the process of electrochemical graining carried out by using an alternating current in the aqueous solution of hydrochloric acid was used.

(e) Electrochemical graining was continuously carried out by using an AC voltage. Electrolytic solution in this case was aqueous solution containing hydrochloric acid 1 wt % (containing 0.5 wt % of aluminum ions), and a solution temperature was 35° C. For the waveform of an AC power supply, the time TP necessary for a current value to reach its peak value from 0 was set equal to 1 msec, a duty ratio was set equal to 1:1, and by using a trapezoidal wave alternating current, the electrochemical graining was carried out with carbon electrodes set as counter electrodes. Ferrite was used for an auxiliary anode. A current density was 25 $A/dm^2$ at a peak current value, and the total of the quantity of electricity was 200 $C/dm^2$, when the aluminum plate was at the anode side. The current flowing from the power source was diverted by 5% to the auxiliary anode. Then, the aluminum plate was washed by water spraying.

(f) The aluminum plate was subjected to spray etching by using aqueous solution containing 26 wt % of sodium hydroxide and 6.5 wt % of aluminum ions. Light etching was carried out to dissolve the aluminum plate by 0.3 $g/m^2$, and a smut component mainly containing aluminum hydroxide, generated in the previous stage of the electrochemical graining carried out in the aqueous solution based on hydrochloric acid by using the alternating current, was removed. Then, the aluminum plate was washed by water spraying.

(g) Spray desmutting was carried out by using the aqueous solution containing nitric acid 1 wt % (containing 0.5 wt % of aluminum ions and 0.007 wt % of ammonium ions) at a solution temperature of 30° C. Then, the aluminum plate was washed by water spraying. For the aqueous solution based on nitric acid used in the desmutting, waste solution resulted from the process of electrochemical graining carried out by using an alternating current was used.

(h) Electrochemical graining was continuously carried out by using an AC voltage. Electrolytic solution in this case was aqueous solution containing nitric acid 1 wt % (containing 0.5 wt % of aluminum ions and 0.007 wt % of ammonium ions), and a solution temperature was 50° C. For the waveform of an AC power supply, the time TP necessary for a current value to reach its peak from zero was set equal to 1 msec, and a duty ratio was set equal to 1:1, and by using a trapezoidal wave alternating current, the electrochemical graining was carried out with carbon electrodes set as counter electrodes. Ferrite was used for an auxiliary anode. A current density was 60 $A/dm^2$ at a peak current value, and the total of the quantity of electricity was 240 $C/dm^2$ when the aluminum plate was at the anode side. The current flowing from the power source was diverted by 5% to the auxiliary anode. Then, the aluminum plate was washed by water spraying.

(i) The aluminum plate was subjected to spray etching by using aqueous solution containing 5 wt % of sodium hydroxide and 0.5 wt % of aluminum ions. The aluminum plate was dissolved by 0.1 $g/m^2$, and a smut component mainly containing aluminum hydroxide, generated in the previous stage of the electrochemical graining carried out by using the alternating current, was removed. Also, the edge portion of a formed pit was dissolved to be made smooth. Then, the aluminum plate was washed by water spraying.

(j) Spray desmutting was carried out by using aqueous solution containing sulfuric acid 25 wt % (containing 0.5 wt % of aluminum ions) at a solution temperature of 60° C. Then, the aluminum plate was washed by water spraying.

(k) Anodizing was carried out by using a DC voltage in aqueous solution containing sulfuric acid 15 wt % (containing 0.5 wt % of aluminum ions) at a solution temperature of 35° C. so that the amount of an anodized layer could reach 1.8 $g/m^2$ at a current density of 2 $A/dm^2$.

(l) After each treatment and water washing, solution squeegeeing was carried out by a nip roller. The support for a lithographic printing plate thus obtained was then applied to the preparation of a presensitized plate as described later.

Comparative Example B-5

(a) Treatment was continuously carried out by using JIS A1050 aluminum plate having a thickness of 0.3 mm and a width of 1030 mm (the aspect ratio 1.1) as described below.

(b) Mechanical graining was carried out by rotating a roller-like nylon brushes while supplying suspension containing silica sand having specific gravity of 1.12 and water as abrasive slurry liquid to the surface of the aluminum plate. A material for the nylon brush was 6.10 nylon, having a bristle length of 50 mm, and a bristle diameter of 0.295 mm. The nylon brush was made by boring holes in a ϕ300 mm stainless cylinder and densely implanting bristles therein. Three of such rotary brushes were prepared. Each distance between two supporting rollers (ϕ200 mm) in the lower part of the brush was 300 mm. Each brush roller was pressed until a load of a driving motor for rotating the brush reached plus 7 kW with respect to the load before the brush roller was pressed to the aluminum plate. The rotating direction of each brush was the same as the moving direction of the aluminum plate.

(c) The aluminum plate was subjected to spray etching by using aqueous solution containing 26 wt % of sodium hydroxide and 6.5 wt % of aluminum ions, at a solution temperature of 75° C. The aluminum plate was dissolved by 14 $g/m^2$, and pointed portions of asperity formed by the brush and the slurry liquid were dissolved. Then, the aluminum plate was washed by water spraying.

(d) Spray desmutting was carried out by using aqueous solution containing nitric acid 1 wt % (containing 0.5 wt % of aluminum ions and 0.007 wt % of ammonium ions) at a solution temperature of 30° C., and then the aluminum plate was washed by water spraying. For the aqueous solution based on nitric acid used in the desmutting, waste solution resulted from the process of electrochemical graining carried out by using an alternating current in the aqueous solution of nitric acid was used.

(e) Electrochemical graining was continuously carried out by using an AC voltage. Electrolytic solution in this case was aqueous solution containing nitric acid 1 wt % (containing 0.5 wt % of aluminum ions and 0.007 wt % of ammonium ions), and a solution temperature was 50° C. For the waveform of an AC power supply, the time TP necessary for a current value to reach its peak value from 0 was set equal to 1 msec, a duty ratio was set equal to 1:1, and by using a trapezoidal wave alternating current, the electrochemical graining was carried out with carbon electrodes set as counter electrodes. Ferrite was used for an auxiliary anode. A current density was 60 $A/dm^2$ at a peak current value, and the total of the quantity of electricity 230 $C/dm^2$ when the aluminum plate was at the anode side side. The current flowing from the power source was diverted by 5% to the auxiliary anode. Then, the aluminum plate was washed by water spraying.

(f) The aluminum plate was subjected to spray etching by using aqueous solution containing 5 wt % of sodium hydroxide, and 0.5 wt % of aluminum ions. The aluminum plate was dissolved by 1.2 $g/m^2$, and a smut component mainly containing aluminum hydroxide, generated in the previous stage of the electrochemical graining carried out by using the alternating current, was removed. Also, the edge portion of a formed pit was dissolved to be made smooth. Then, the aluminum plate was washed by water spraying.

(g) Spray desmutting was carried out by using the aqueous solution containing sulfuric acid 25 wt % (containing 0.5 wt % of aluminum ions) at a solution temperature of 60° C. Then, the aluminum plate was washed by water spraying.

(k) Anodizing was carried out by using a DC voltage in aqueous solution containing sulfuric acid 15 wt % (containing 0.5 wt % of aluminum ions) at a solution temperature of 35° C. so that the amount of an anodized layer could reach 2.7 $g/m^2$ at a current density of 2 $A/dm^2$.

(l) After each treatment and water washing, solution squeegeeing was carried out by a nip roller. The support for a lithographic printing plate thus obtained was then applied to the preparation of a presensitized plate as described later.

Comparative Example B-6

A support for a lithographic printing plate was prepared by the same method as that for Comparative Example B-5, except for the fact that the amount of dissolving the aluminum plate was set equal to 0.05 $g/m^2$ in the step (f) of etching.

Comparative Example B-7

(a) Treatment was continuously carried out by using a JIS A1050 aluminum plate having a thickness of 0.3 mm and a width of 1030 mm (the aspect ratio=1.1) as described below.

(b) Mechanical graining was carried out by rotating a roller-like nylon brushes while supplying a suspension containing silica sand having a specific gravity of 1.12 and water as an abrasive slurry liquid to the surface of the aluminum plate. The nylon brush was formed of 6.10 nylon, having a bristle length of 50 mm and a bristle diameter of 0.48 mm. The nylon brush was made by boring holes in a φ300 mm stainless cylinder and densely implanting bristles therein. Three of such rotary brushes were prepared. Each distance between two supporting rollers (φ200 mm) in the lower part of the brush was 300 mm. Each brush roller was pressed to the aluminum plate until a load of a driving motor for rotating the brush reached plus 7 kW with respect to the load before the brush roller was pressed. The rotating direction of each brush was the same as the moving direction of the aluminum plate.

(c) The aluminum plate was subjected to spray etching by using aqueous solution containing 26 wt % of sodium hydroxide and 6.5 wt % of aluminum ions, at a solution temperature of 75° C. The aluminum plate was dissolved by 8 $g/m^2$, and the pointed portions of asperities formed by the brush and the slurry liquid were dissolved. Then, the aluminum plate was washed by water spraying.

(d) Spray desmutting was carried out by using an aqueous solution containing 1 wt % of nitric acid (containing 0.5 wt % of aluminum ions and 0.007 wt % of ammonium ions) at a solution temperature of 30° C., and then the aluminum plate was washed by water spraying. For the aqueous solution based on nitric acid used in the desmutting, waste solution resulted from the process of electrochemical graining carried out by using an alternating current in the aqueous solution of nitric acid was used.

(e) Electrochemical graining was continuously carried out by using an AC voltage. An electrolytic solution in this case was an aqueous solution containing 1 wt % of nitric acid (containing 0.5 wt % of aluminum ions and 0.007 wt % of ammonium ions), and a solution temperature was 50° C. The waveform of an alternating current of the AC power supply was trapezoidal, in which the time TP necessary for a current value to reach its peak value from 0 was set equal to 1 msec, and a duty ratio was set equal to 1:1. By using the alternating current, the electrochemical graining was carried out with a carbon electrode set as a counter electrode. Ferrite was used for an auxiliary anode. A current density was 60 $A/dm^2$ at a peak current value, and the total quantity of electricity was 210 $C/dm^2$ when the aluminum plate was at the anode side. The current flowing from the power source was diverted by 5% to the auxiliary anode. Then, the aluminum plate was washed by water spraying.

(f) The aluminum plate was subjected to spray etching by using an aqueous solution containing 5 wt % of sodium hydroxide and 0.5 wt % of aluminum ions. The aluminum plate was dissolved by 1.0 $g/m^2$, and a smut component mainly containing aluminum hydroxide, generated in the previous stage of the electrochemical graining carried out by using the alternating current, was removed. Also, the edge portion of a formed pit was dissolved to be made smooth. Then, the aluminum plate was washed by water spraying.

(g) Spray desmutting was carried out by using an aqueous solution containing sulfuric acid 25 wt % (containing 0.5 wt % of aluminum ions) at a solution temperature of 60° C. Then, the aluminum plate was washed by water spraying.

(k) Anodizing was carried out by using a DC voltage in an aqueous solution containing 15 wt % of sulfuric acid (containing 0.5 wt % of aluminum ions) at a solution temperature of 35° C. such that the amount of an anodized layer could reach 2.4 $g/m^2$ at a current density of 2 $A/dm^2$.

(l) After each treatment and water washing, solution squeegeeing was carried out by a nip roller. The support for a lithographic printing plate thus obtained was then applied to the preparation of a presensitized plate as described later.

2. Preparation of Presensitized Plates (1) An intermediate layer, a photosensitive layer and a mat layer were formed on a surface of the support for a lithographic printing plate, obtained in each of Examples B-1 to B-4 and Comparative Examples B-1 to B-7 in the following process. A presensitized plate (positive working PS plate) having a coating amount after drying set at 2.0 g/$m^2$ was prepared.

A. Formation of Intermediate Layer

An intermediate layer was formed by coating an undercoat solution containing a composition below, and drying it at 80° C. for 30 sec. The coating amount after drying was 30 mg/$m^2$.

Undercoat solution components: aminoethyl phosphonic acid 0.10 g, phenylphosphonic acid 0.15 g, β-alanine 0.10 g, methanol 40 g, and pure water 60 g.

B. Formation of Photosensitive Layer

A photosensitive solution containing a composition below was coated on the intermediate layer, and a positive working photosensitive layer was formed by drying it at 110° C. for 1 min.

Photosensitive solution components: ester compound of 1,2-diazonaphthoquinone-5-sulfonyl chloride and pyrogallol-acetone resin (described in Example 1 of specification of U.S. Pat. No. 3,635,709) 0.45 g, cresol-formaldehyde novolak resin (meta/para ratio: 6/4; weight-average molecular weight: 3,000; number-average molecular weight: 1,100; unreacted cresol content: 0.7 wt %) 1.1 g, m-cresol-formaldehyde novolak resin (weight-average molecular weight: 1,700; number-average molecular weight: 600; unreacted cresol content: 1 wt %) 0.3 g, poly[N-(p-aminosulfonylphenyl)acrylamide-co-normalbutylacrylate-co-diethyleneglycol monomethyl ether methacrylate] (described in the specification of Japanese Patent Application No. 3-311241 (gazette of JP-A-5-150453); mol ratio of various monomers in order: 40:40:20; weight-average molecular weight: 40,000; number-average molecular weight: 20,000) 0.02 g, p-normaloctylphenol-formaldehyde resin (described in U.S. Pat. No. 4,123,279) 0.02 g, naphtoquinone-1,2-diazide-4-sulfonyl chloride 0.01 g, tetrahydrophthalic anhydride 0.1 g, benzoic acid 0.02 g, 4-[p-N,N-bis(ethoxycarbonylmethyl)aminophenyl]-2,6-bis(trichloromethyl)-S-triazine 0.01 g, 4-[p-N-(p-hydroxybenzoyl)aminophenyl]-2,6-bis(trichloromethyl)-S-triazine 0.02 g, 2-trichloromethyl-5-(4-hydroxystyryl)-1,3,4-oxadiazole 0.01 g, dye 0.02 g obtained by changing a counter anion of Victorian pure blue BOH into 1-naphthalenesulfonic acid, MODIPAR F-200 (fluorine-containing surfactant by NOF Corp., 30 wt % mixed solvent solution of methyl ethyl ketone and methyl isobutyl ketone) 0.06 g, MEGAFACE F177 (fluorine-containing surfactant by Dai Nippon Ink and Chemicals Inc., methyl isobutyl ketone solution of 20 wt %) 0.02 g, methyl ethyl ketone 15 g, and 1-methoxy-2-propanol 10 g.

C. Formation of Mat Layer

A mat layer was provided on the photosensitive layer by electrostatic-spraying a copolymer solution containing methyl methacrylate/ethyl acrylate/sodium acrylate=68/20/12 based on a method described in Example 1 of JP-A-61-28986.

(2) An intermediate layer and a photosensitive layer were formed on the surface of the support for a lithographic printing plate, obtained in Example B-5 in the following process. A presensitized plate (negative working PS plate) having a coating amount after drying set at 2.0 g/$m^2$ was prepared.

A. Treatment for Water Wettability

For the purpose of performing treatment for water wettability, the support for a lithographic printing plate was dipped in a 2.5 wt % aqueous solution of sodium silicate at 70° C. Then, the support was washed by water spraying, and dried.

B. Formation of Intermediate Layer

An intermediate layer was formed by coating a water receptive undercoat solution containing a composition below, and drying it at 100° C. for 20 sec. The coating amount after drying was 10 mg/$m^2$.

Undercoat Solution Components methylmethacrylate/ethylacrylate/2-acrylamide-2-methylpropanesulfonyl sodium copolymer (60/25/15 mol ratio) 0.02 g, and methanol 100 g.

C. Formation of Photosensitive Layer

A negative working photosensitive layer was formed on the intermediate layer by coating a photosensitive solution containing a composition below, and drying it at 110° C. for 1 min.

Photosensitive solution components: polyurethane resin (A) 5 g obtained by a method described below, dodecyl benzene sulfonate 1.2 g of a condensate of 4-diazophenylamine and formaldehyde, propane-1,2,3-tricarboxilic acid 0.05 g, phosphoric acid 005 g, 4-sulfophthalic acid 0.05 g, tricresyl phosphate 0.25 g, half ester 0.1 g by n-hexanol of styrene-maleic anhydride copolymer, dye 0.18 g obtained by changing a counter anion of Victorian pure blue BOH into 1-naphthalene sulfonic acid, compound 0.015 g represented by $[C_6F_{17}CH_2CH_2O]_{1.7}PO[OH]_{1.3}$, MEGAFACE F177 (fluorine-containing surfactant by Dai Nippon Ink and Chemicals Inc., methyl isobutyl ketone solution of 20 wt %) 0.06 g, 1-methoxy-2-propanol 20 g, methanol 40 g, methyl ethyl ketone 40 g, and ion-exchange water 1 g.

<Preparation of Polyurethane Resin (A)>

2,2-bis(hydroxymethyl)propionic acid 11.5 g (0.0860 mol), diethylene glycol 7.26 g (0.0684 mol) and 1,4-butanediol 4.11 g (0.0456 mol) were poured into a 500 mL-capacity three-neck round-bottom flask having a condenser and an agitator, and dissolved in N,N-dimethylacetamide 118 g. Then, 4,4'-diphenyl methane diisocyanate 30.8 g (0.123 mol), hexamethylene diisocyanate 13.8 g (0.0819 mol) and di-n-butyl tin dilaurate 0.1 g as a catalyst were added, and 7-hour heating was carried out at 90C under agitation. N,N-dimethylacetamide 100 mL, methanol 50 mL and acetic acid 50 mL were added to the obtained reaction solution. After agitation, the solution was poured into water 4L while being agitated, and white polymer was deposited. This polymer was filtered, washed by water, and dried under a reduced pressure. Accordingly, 62 g of polymer (polyurethane resin (A)) was obtained.

(3) An intermediate layer and a photosensitive layer were formed on the surface of the support for a lithographic printing plate, obtained in Example B-6 in the process described below, and then a presensitized plate (negative working PS plate having alkali-solubility increased by photothermal conversion) having a coating amount after drying set at 2.0 g/$m^2$ was prepared.

A. Formation of Intermediate Layer

An intermediate layer was formed by coating an undercoat solution containing a composition below, and drying it at 80° C. for 10 sec. The coating amount after drying was 11 mg/$m^2$.

Undercoat solution components: β-alanine 0.1 g, phenylphosphonic acid 0.05 g, methanol 40 g, and pure water 60 g.

B. Formation of Photosensitive Layer

A photosensitive layer for a negative working laser recording material was formed by coating a photosensitive solution containing a composition below on the intermediate layer by using a wire bar, and drying it at 100° C. for 1 min.

Photosensitive solution components: nonylphenol 0.05 g, 2,4,6-trimethoxy diazonium-2,6-dimethylbenzene sulfonate 0.3 g, crosslinking agent (B) 0.5 g obtained by a method described below, poly(p-hydroxystyrene) MARUKALINKER MS-4 (by Maruzen Petrochemical Co., Ltd.) 1.5 g, 2,6 dimethylene-(4,5-naphthalene-1,3,3-trimethyl pyrrol)-4-monochloro-5,6-propane-hepten-methyl benzene sulphonate (cyanine dyestuff) 0.07 g, IZEN-SPIRON BLUE C-RH (by Hodogaya Chemical Co. Ltd.) 0.035 g, MEGAFACE F177 (Dai Nippon Ink and Chemicals Inc., fluorine-containing surfactant, methyl isobutyl ketone solution of 20 wt %) 0.01 g, methyl ethyl ketone 12 g, methyl alcohol 10 g, and 1-methoxy-2-propanol 8 g.

<Preparation of Crosslinking Agent (B)>

1-[α-methyl-α-(4-hydroxyphenyl)ethyl]-4-[α,α-bis(4-hydroxyphenyl)ethyl]benzene was reacted with formalin in potassium hydroxide aqueous solution. The reaction solution was acidified by sulfuric acid, crystallized, and then crosslinking agent (B) having purity of 92% was obtained.

(4) An intermediate layer and a photosensitive layer were formed on the surface of the support for a lithographic printing plate, obtained in Example B-7 in the following process. Then, a presensitized plate (positive working PS plate having alkali-solubility increased by photothermal conversion) having a coating amount after drying set at 2.0 $g/m^2$ was prepared.

A. Treatment for Water Wettability

For the purpose of performing treatment for water wettability, the support for a lithographic printing plate was dipped in a aqueous solution containing 1 wt % of sodium silicate at 30° C. for 10 sec. Then, the support was washed by water spraying, and dried.

B. Formation of Intermediate Layer

An intermediate layer was formed by coating a undercoat solution of a composition below, having an acid group and an onium group described in JP-A-10-282645, and then drying it at 100° C. for 10 sec. The coating amount after drying was 15 $mg/m^2$.

Undercoat solution component: high-molecular compound 0.14 g represented by a formula (7) below, methanol 100 g, and water 1 g (7)

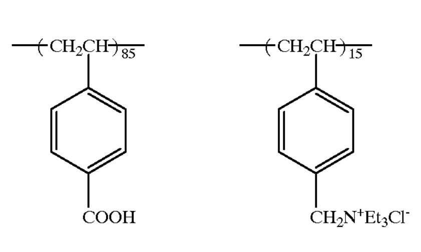

C. Formation of Photosensitive Layer

A photosensitive layer of a positive working laser exposable type was formed by continuously coating a photosensitive solution containing a composition below on the intermediate layer by using a wire bar, and then drying it at 10° C. for 1 min.

Photosensitive solution components: an alkali-soluble high-molecular compound (C) 0.7 g obtained by a method described below, 2,6-dimethylene-(4,-5-naphthalene-1,3,3-trimethyl pyrrol)-4-monochrolo-5,6-propane-hepten-methyl benzene sulphonate (cyanine dyestuff) 0.1 g, tetrahydrophthalic anhydride 0.05 g, p-toluene sulfonic acid 0.002 g, dye 0.02 g obtained by changing a counter anion of Victorian pure blue BOH into 1-naphthalenesulfonic acid anion, MEGAFACE F177 (fluorine-containing surfactant by Dai Nippon Ink and Chemicals Inc., methyl isobutyl ketone solution of 20 wt %) 0.05 g, γ-butyrolactone 8 g, methyl ethyl ketone 8 g, and 1-methoxy-2-propanol 4 g.

<Production of Alkali-soluble High-molecular Compound (C)>

Methacrylic acid 31.0 g (0.36 mol), ethyl chloroformate 39.1 g (0.26 mol) and acetonitrile 200 mL were poured into a 500 mL-capacity three-neck flask having an agitator, a cooling pipe and a dropping funnel. The mixture was agitated while being cooled in an ice-water bath, and triethylene amine 36.4 g (0.36 mol) was added by using the dropping funnel for about 1 hour. After the dropping, the mixture was agitated at a room temperature for 30 min, p-aminobenzenesulfonamide 51.7 g (0.30 mol) was added, and then the mixture was agitated for 1 hour while being heated to 70° C. in an oil bath. The mixture was then turned into slurry in water and, after filtering, a white solid containing N-(p-aminosulphenyl)methacrylamide was obtained. This solid 5.04 g (0.021 mol), ethyl methacrylate 2.05 g (0.018 mol), acrylonitrile 1.11 g (0.021 mol) and N,N-dimethylacetamide 20 g were put in, heated to 65° C., mixed with "V-65" 0.15 g by Wako Pure Chemical Industries, Ltd., and agitated under a nitrogen air flow for 2 hours. Then, the mixture of N-(p-aminosulfophenyl) methacrylamide 5.04 g, ethyl methacrylate 2.05 g, acrylonitrile 1.11 g, N, N-dimethylacetamide 20 g, and "V-65" 0.15 g was added dropwise to the above for 2 hours. After reaction, methanol 40 g was added, mixed for 30 min, and then a deposit was filtered and dried. Thus, a white alkali-soluble high-molecular compound (C) (molecular weight 53,000) 15 g was obtained.

3. Evaluation of Presensitized Plates

A. The presensitized plate prepared by using the support for a lithographic printing plate obtained in each of Examples B-1 to B-4 and Comparative Examples B-1 to B-7 was exposed in a vacuum printing frame through a transparent positive film by a 3 kW metal halide lamp at a distance of 1 m for 50 sec. Then, the plate was processed through an automatic developing device Stabron 900 V (Fuji Photo Film Co., Ltd.) provided with DP-4 (Fuji Photo Film Co., Ltd.) (1:8 water diluted solution) as a developer and FP2-W (1:7) (Fuji Photo Film Co., Ltd.) as a rinsing solution.

This lithographic printing plate was left for a day, and then printing was evaluated. A printing machine used was SOR-M available from Heidelberg Co., Ltd.; fountain solution EU-3 (1:100) (Fuji Photo Film Co., Ltd.) and isopropyl alcohol (10:100); and ink Trans G-N Black ink (Dai Nippon Ink and Chemicals Inc.).

B. The presensitized plate prepared by using the support for a lithographic printing plate obtained in Example B-5 was exposed and processed by the same method as that for A, except for the fact that DN 3C (1:1) (Fuji Photo Film Co., Ltd.) was used as a developer, and FP2-W (1:1) (Fuji Photo Film Co., Ltd.) was used as a rinsing solution.

Then, printing was evaluated by the same method as that for A.

C. The presensitized plate prepared by using the support for a lithographic printing plate obtained in Example B-6 was exposed at a main scanning speed of 5 m/s by using a semiconductor laser having an output of 500 mW, a wavelength of 830 nm, and a beam diameter of 17 μm. Then, the plate was heated to 110° C. by using a panel heater for 30 sec, and developed for 30 sec, by using DP-4 (1:8) (Fuji Photo Film Co., Ltd.) as a developer. The amount of element Si on the surface after the development was 10.5 atm %.

Then, printing was evaluated by the same method as that for A.

D. The presensitized plate prepared by using the support for a lithographic printing plate obtained in Example B-7 was exposed at a main scanning speed 5 m/s by using a semiconductor laser having an output of 500 mW, a wavelength of 830 nm, and a beam diameter of 17 $\mu$m. Then, the plate was subjected to development for 30 sec by using an alkali developer 1 and an alkali developer 2 having compositions below. After the development, for the purpose of protecting the plate surface, gum arabic 3 $g/m^2$ was coated.

Then, printing was evaluated by the same method as that for A.

Alkali developer 1 components: sodium hydroxide 2.8 wt %, silicon dioxide 2.0 wt %, nonionic surfactant (Pluronic PE-3100, by BASF Co., Ltd.) 0.5 wt %, and water 94.7 wt %.

Alkali developer 2 components: potassium hydroxide 2.8 wt %, D-sorbite 2.5 wt %, pentasodium diethylenetriaminepenta(methylenephosphonate 0.1 wt, nonionic surfactant (PLRONIC PLURONIC P-85, by Asahi Denka Kogyo K. K.) 0.1 wt %, and water 94.5 wt %.

Items to be evaluated were as follows:

(1) Surface Characteristic of Supports for Lithographic Printing Plates

For a surface of non-image areas of each of the lithographic printing plates, arithmetic average roughness $R_a$, 10-point average roughness $R_z$, the number $P_c$ of roughness curve peaks, and the 85-degree surface gloss were measured.

The arithmetic average roughness $R_a$, the 10-point average roughness $R_z$ m, and the number $P_c$ of roughness curve peaks for the surface were measured by using a surface roughness gauge (Surfcom (470570A) by Tokyo Seimitsu Co., Ltd., and a sensing pin: 2 $\mu$m R).

The 85-degree surface gloss was measured by using a glossmeter (UGV-4K by Suga Test Instruments Co., Ltd.).

(2) Adjustment Easiness of Amount of Fountain Solution on Plate

The gloss of the non-image areas of each of the printing plates was visually observed during printing, and evaluated by 5 grades.

A: Excellent non-glossy state
B: Good almost non-glossy state
C: Failed glossy state
A–B: intermediate state between A and B
B–C: intermediate state between B and C (3) Resistance to Interlinking of Halftone Dots when Fountain Solution is Reduced After 10000 sheets were printed by a printing machine under the normal amount of fountain solution, printing was carried out under the condition of a small amount of fountain solution. The state of filling-in of halftone dots on the print was visually observed, and evaluated by 5 grades.

A: Excellent unfilled state of halftone dots
B: Good almost unfilled state of halftone dots
C: Failed filled state of halftone dots
A–B: intermediate state between A and B
B–C: intermediate state between B and C (4) Local Residual Layers on Non-image Areas On the plate having been subjected to development, the state of residual layers on the non-image areas by a magnifying glass, and evaluated by 5 grades.

A: Excellent state of no residual layer
B: Good state of almost no residual layer
C: Failed state of residual layers present
A–B: intermediate state between A and B
B–C: intermediate state between B and C Tables B-1 to B-3 show the results of evaluation. It can be understood that the presensitized plates of the second aspect of the present invention using the supports for lithographic printing plates of the second aspect of the present invention were excellent regarding all the foregoing items to be evaluated in the case of the lithographic printing plates (Examples B-1 to B-7)

TABLE B-1

| | Example | | | |
|---|---|---|---|---|
| | B-1 | B-2 | B-3 | B-4 |
| (a) State of rolled aluminum | | | | |
| Aspect ratio | 1.1 | 1.3 | 1.1 | 1.1 |
| Aluminum material | JIS A3005 | JIS A3005 | JIS A1050 | JIS A1050 |
| (b) Mechanical graining Brush bristle diameter (mm) | 0.3 | 0.48 | 0.3 | 0.48 |
| (c) Chemical etching Dissolving amount ($g/m^2$) | 5 | 5 | 3 | 4 |
| (d) Desmutting Processing time (sec) | 10 | 10 | 10 | 10 |
| (e) Preparatory electrochemical graining | | | | |
| Quantity of electricity ($C/dm^2$) | 200 | 100 | 100 | 100 |
| Solution type | nitric acid 1 wt % | hydro-chloric acid 1 wt % | nitric acid 1 wt % | nitric acid 1 wt % |
| Solution temperature (° C.) | 50 | 35 | 50 | 50 |
| (f) Chemical etching Dissolving amount ($g/m^2$) | 5.0 | 0.3 | 1.7 | 0.2 |
| (g) Desmutting Processing time (sec) | 10 | 10 | 10 | 10 |
| (h) Electrochemical graining | | | | |
| Quantity of electricity ($C/dm^2$) | 240 | 240 | — | — |
| Solution type | nitric acid 1 wt % | nitric acid 1 wt % | — | — |
| Solution temperature (° C.) | 50 | 50 | — | — |
| (i) Chemical etching Dissolving amount ($g/m^2$) | 0.1 | 0.1 | — | — |
| (j) Desmutting Processing time (sec) | 10 | 10 | — | — |
| (k) Anodizing Amount of anodized layer ($g/m^2$) | 1.8 | 1.8 | 1.8 | 1.2 |
| Physical property value | | | | |
| $R_a$ (m) | 0.38 | 0.36 | 0.43 | 0.45 |
| $R_z$ (m) | 3.63 | 3.86 | 3.69 | 4.20 |
| $P_c$ (0.3—0.3) (number/mm) | 26 | 17 | 30 | 27 |
| 85-degree surface gloss | 17.7 | 29 | 29.6 | 28.1 |
| Printing evaluation | | | | |
| Adjustment easiness of amount of fountain solution on plate | A | A–B | A–B | A–B |
| Resistance to interlocking of halftone dots when fountain solution is reduced | A–B | A | A–B | A–B |
| Local residual layers on non-image area | A | A | A | A |

Evaluation A: Excellent B: Good C: Failed

TABLE B-2

| | Example | | | Comparative Example | |
|---|---|---|---|---|---|
| | B-5 | B-6 | B-7 | B-1 | B-2 |
| (a) State of rolled aluminum | | | | | |
| Aspect ratio | 1.1 | 1.1 | 1.1 | 1.1 | 1.1 |
| Aluminum material | JIS A3005 | JIS A3005 | JIS A3005 | JIS A1050 | JIS A1050 |
| (b) Mechanical graining | | | | | |
| Brush bristle diameter (mm) | — | — | — | — | — |
| (c) Chemical etching Dissolving amount ($g/m^2$) | 5 | 5 | 5 | 5 | 5 |
| (d) Desmutting Processing time (sec) | 10 | 10 | 10 | 10 | 10 |
| (e) Preparatory electro-chemical graining | | | | | |
| Quantity of electricity ($C/dm^2$) | 200 | 200 | 200 | 270 | 300 |
| Solution type | nitric acid 1 wt % | nitric acid 1 wt % | nitric acid 1 wt % | nitric acid 1 wt % | nitric acid 1 wt % |
| Solution temperature (° C.) | 50 | 50 | 50 | 50 | 50 |
| (d) Chemical etching Dissolving amount ($g/m^2$) | 5.0 | 5.0 | 5.0 | 0.2 | 0.1 |
| (g) Desmutting Processing time (sec) | 10 | 10 | 10 | 10 | 10 |
| (h) Electrochemical graining | | | | | |
| Quantity of electricity ($C/dm^2$) | 240 | 240 | 240 | — | — |
| Solution type | nitric acid 1 wt % | nitric acid 1 wt % | nitric acid 1 wt % | — | — |
| Solution temperature (° C.) | 50 | 50 | 50 | — | — |
| (i) Chemical etching Dissolving amount ($g/m^2$) | 0.1 | 0.1 | 0.1 | — | — |
| (j) Desmutting Processing time (sec) | 10 | 10 | 10 | — | — |
| (k) Anodizing Amount of anodized layer ($g/m^2$) | 1.8 | 1.8 | 1.8 | 2.7 | 1.8 |
| Physical property value | | | | | |
| $R_a$ (μm) | 0.38 | 0.38 | 0.38 | 0.27 | 0.32 |
| $R_z$ (μm) | 3.63 | 3.63 | 3.63 | 2.96 | 3.63 |
| $P_c$ (0.3—0.3) (number/mm) | 26 | 26 | 26 | 19 | 18 |
| 85-degree surface gloss | 17.7 | 29 | 29.6 | 28.1 | 35.7 |
| Printing evaluation | | | | | |
| Adjustment easiness of amount of fountain solution on plate | A | A | A | B–C | C |
| Resistance to inter-locking of halftone dots when fountain solution is reduced | A–B | A–B | A–B | C | C |
| Local residual layers on non-image area | A | A | A | A | B–C |
| Overall evaluation | A | A | A | C | C |

Evaluation A: Excellent B: Good C: Failed

TABLE B-3

| | Comparative Example | | | | |
|---|---|---|---|---|---|
| | B-3 | B-4 | B-5 | B-6 | B-7 |
| (a) State of rolled aluminum | | | | | |
| Aspect ratio | 1.1 | 1.3 | 1.1 | 1.1 | 1.1 |
| Aluminum material | JIS A3005 | JIS A3005 | JIS A1050 | JIS A1050 | JIS A1050 |
| (b) Mechanical graining Brush bristle diameter (mm) | 0.3 | 0.48 | 0.3 | 0.3 | 0.48 |
| (c) Chemical etching Dissolving amount ($g/m^2$) | 5 | 5 | 14 | 14 | 8 |
| (d) Desmutting Processing time (sec) | 10 | 10 | 10 | 10 | 10 |
| (e) Preparatory electro-chemical graining | | | | | |
| Quantity of electricity ($C/dm^2$) | 100 | 200 | 230 | 230 | 210 |
| Solution type | hydro-chloric acid 1 wt % | hydro-chloric acid 1 wt % | nitric acid 1 wt % | nitric acid 1 wt % | nitric acid 1 wt % |
| Solution temperature (° C.) | 35 | 35 | 50 | 50 | 50 |
| (f) Chemical etching Dissolving amount ($g/m^2$) | 0.3 | 0.3 | 1.2 | 0.05 | 1.0 |
| (g) Desmutting Processing time (sec) | 10 | 10 | 10 | 10 | 10 |
| (h) Electrochemical graining | | | | | |
| Quantity of electricity ($C/dm^2$) | 240 | 240 | — | — | — |
| Solution type | nitric acid 1 wt % | nitric acid 1 wt % | — | — | — |
| Solution tempera- (° C.) | 50 | 50 | — | — | — |
| (i) Chemical etching Dissolving amount ($g/m^2$) | 0.1 | 0.1 | — | — | — |
| (j) Desmutting Processing time (sec) | 10 | 10 | — | — | — |
| (k) Anodizing Amount of anodized layer ($g/m^2$) | 1.8 | 1.8 | 2.7 | 2.7 | 2.7 |
| Physical property value | | | | | |
| $R_a$ (μm) | 0.30 | 0.46 | 0.51 | 0.50 | 0.53 |
| $R_z$ (μm) | 4.01 | 4.59 | 3.87 | 4.55 | 5.07 |
| $P_c$ (0.3–0.3) (number/mm) | 14 | 22 | 27 | 29 | 26 |
| 85-degree surface gloss | 39.1 | 25.6 | 20.8 | 18.2 | 25.7 |
| Printing evaluation | | | | | |
| Adjustment easiness of amount of fountain solution on plate | A–B | A–B | A | A–B | A–B |
| Resistance to inter-locking of halftone dots when fountain solution is reduced | A–B | A | A | A–B | A |
| Local residual layers on non-image areas | B–C | B–C | C | C | C |
| Overall evaluation | B | B | B–C | B–C | B–C |

Evaluation A: Excellent B: Good C: Failed

Examples About the Third aspect of the Present Invention

1. Preparation of Supports for Lithographic Printing Plates

Example C-1

(a) Treatment was continuously carried out by using a JIS A1050 aluminum plate having a thickness of 0.3 mm and a width of 1030 mm as described below.

(b) The aluminum plate was subjected to spray etching by using an aqueous solution containing 26 wt % of sodium hydroxide and 6.5 wt % of aluminum ions, at a solution temperature of 75° C. The aluminum plate was dissolved by 5 g/$m^2$, and rolling oil or a natural oxide layer was removed. Then, the aluminum plate was washed by water spraying.

(c) Spray desmutting was carried out by using an aqueous solution containing 1 wt % of hydrochloric acid (containing 0.5 wt % of aluminum ions) at a solution temperature of 30° C., and then the aluminum plate was washed by water spraying. For the aqueous solution based on hydrochloric acid used in the desmutting, waste solution resulted from the process of electrochemical graining carried out by using an alternating current in the aqueous solution of hydrochloric acid was used.

(d) Electrochemical graining was continuously carried out by using an AC voltage. An electrolytic solution in this case was an aqueous solution containing 1 wt % of hydrochloric acid (containing 0.5 wt % of aluminum ions), and a solution temperature was 35° C. The waveform of an alternating current of the AC power supply was trapezoidal, in which the time TP necessary for a current value to reach its peak value from 0 was set equal to 1 msec, a duty ratio was set equal to 1:1, and a frequency was set equal to 120 Hz. By using the alternating current, the electrochemical graining was carried out with a carbon electrode set as a counter electrode. Ferrite was used for an auxiliary anode. A current density was 50 A/$dm^2$ at a peak current value, and the total quantity of electricity was 200 C/$dm^2$ when the aluminum plate was at the anode side. The current flowing from the power source was diverted by 5% to the auxiliary anode. Then, the aluminum plate was washed by water spraying.

(e) The aluminum plate was subjected to spray etching by using an aqueous solution containing 26 wt % of sodium hydroxide and 6.5 wt % of aluminum ions. The etching was lightly carried out to dissolve the aluminum plate by 0.3 g/$m^2$, and a smut component mainly containing aluminum hydroxide, generated in the previous stage of the electrochemical graining carried out in the aqueous solution based on hydrochloric acid by using the alternating current, was removed. Then, the aluminum plate was washed by water spraying.

(f) Spray desmutting was carried out by using an aqueous solution containing nitric acid 1 wt % (containing 0.5 wt % of aluminum ions and 0.007 wt % of ammonium ions) at a solution temperature of 30° C. Then, the aluminum plate was washed by water spraying. For the aqueous solution based on nitric acid used in the desmutting, waste solution resulted from the process of electrochemical graining carried out by using an alternating current was used.

(g) Electrochemical graining was continuously carried out by using an AC voltage. An electrolytic solution in this case was an aqueous solution containing 1 wt % of nitric acid (containing 0.5 wt % of aluminum ions and 0.007 wt % of ammonium ions), and a solution temperature was 50° C. The waveform of an alternating current of the AC power supply was trapezoidal, in which the time TP necessary for a current value to reach its peak from zero was set equal to 1 msec, a duty ratio was set equal to 1:1, and a frequency was set equal to 60 Hz. By using the alternating current, the electrochemical graining was carried out with a carbon electrode set as a counter electrode. Ferrite was used for an auxiliary anode. A current density was 60 A/$dm^2$ at a peak current value, and the total quantity of electricity was 210 C/$dm^2$ when the aluminum plate was at the anode side. The current flowing from the power source was diverted by 5% to the auxiliary anode. Then, the aluminum plate was washed by water spraying.

(h) The aluminum plate was subjected to spray etching by using an aqueous solution containing 5 wt % of sodium hydroxide and 0.5 wt % of aluminum ions. The aluminum plate was dissolved by 0.2 g/$m^2$, and a smut component mainly containing aluminum hydroxide, generated in the previous stage of the electrochemical graining carried out by using the alternating current, was removed. Also, the edge portion of a formed pit was dissolved to be made smooth. Then, the aluminum plate was washed by water spraying.

(i) Spray desmutting was carried out by using an aqueous solution containing 25 wt % of sulfuric acid (containing 0.5 wt % of aluminum ions) at a solution temperature of 60° C. Then, the aluminum plate was washed by water spraying.

(j) Anodizing was carried out by using a DC voltage in an aqueous solution containing 15 wt % of sulfuric acid (containing 0.5 wt % of aluminum ions) at a solution temperature of 35° C. such that the amount of an anodized layer could reach 2.7 g/$m^2$ at a current density of 2 A/$dm^2$.

(k) After each treatment and water washing, solution squeegeeing was carried out by a nip roller. The support for a lithographic printing plate thus obtained was then applied to the preparation of a presensitized plate as described later.

Example C-2

A support for a lithographic printing plate was prepared by the same method as that for Example C-1 except for the fact that instead of the step (b), the following steps (l) and (m) were carried out.

(l) Mechanical graining was carried out by rotating a roller-like nylon brushes while supplying a suspension containing silica sand having a specific gravity of 1.12 and water as an abrasive slurry liquid to the surface of the aluminum plate. The nylon brush was formed of 6.10 nylon, having a bristle length of 50 mm, and a bristle diameter of 0.295 mm. The nylon brush was made by boring holes in a $\phi$300 mm stainless cylinder and densely implanting bristles therein. Three of such rotary brushes were prepared. Each distance between two supporting rollers ($\phi$200 mm) in the lower part of the brush was 300 mm. Each brush roller was pressed to the aluminum plate until a load of a driving motor for rotating the brush reached plus 7 kW with respect to the load before the brush roller was pressed. The rotating direction of each brush was the same as the moving direction of the aluminum plate.

(m) The aluminum plate was subjected to spray etching by using aqueous solution containing 26 wt % of sodium hydroxide and 6.5 wt % of aluminum ions, at a solution temperature of 75° C. The aluminum plate was dissolved by 5 g/$m^2$, and the pointed portions of asperities formed by the brush and the slurry liquid were dissolved. Then, the aluminum plate was washed by water spraying.

Example C-3

A support for a lithographic printing plate was prepared by the same method as that for Example C-1 except for the fact that instead of the step (d), a step (n) described below was carried out, and the dissolving amount of the aluminum plate was set equal to 5 $g/m^2$ in the etching in the step (e).

(n) Electrochemical graining was continuously carried out by using a DC voltage. Electrolytic solution in this case was aqueous solution containing 1 wt % of nitric acid (containing 0.5 wt % of aluminum ions and 0.007 wt % of ammonium ions), and a solution temperature was 50° C. Ferrite was used for an anode and titanium for a cathode. A DC voltage having a ripple rate of 20% or lower was used for electrolysis. A current density was 80 $A/dm^2$, and the quantity of electricity was 200 $C/dm^2$. The anode and the cathode made a pair. Then, the aluminum plate was washed by water spraying.

Comparative Example C-1

A support for a lithographic printing plate was prepared by the same method as that for Example C-1 except for the fact that (a) a JIS A3005 aluminum plate having a thickness of 0.3 mm and a width of 1030 mm was used and, in the step (d), a frequency of the alternating current used for electrochemical graining was 60 Hz, and the total of the quantity of electricity was 100 $C/dm^2$ when the aluminum plate was at the anode side.

Comparative Example C-2

A support for a lithographic printing plate was prepared by the same method as that for Example C-1 except for the fact that (a) a JIS A3005 aluminum plate having a thickness of 0.3 mm and a width of 1030 mm was used and, in the step (d), a frequency of the alternating current used for electrochemical graining was 60 Hz.

Comparative Example C-3

A support for a lithographic printing plate was prepared by the same method as that for Example C-1, except for the fact that aqueous solution containing 1 wt % of hydrochloric acid (containing 0.5 wt % of aluminum ions and 0.007 wt % of ammonium ions) was used at a solution temperature of 30° C. in the desmutting in the step (c), the steps (d) to (f) were omitted, the total of the quantity of electricity was 600 $C/dm^2$ when the aluminum plate was at the anode side in the electrochemical graining in the step (g), and the dissolving amount of the aluminum plate was 2 $g/m^2$ in the etching in the step (h).

Comparative Example C-4

A support for a lithographic printing plate was prepared by the same method as that for Example C-1, except for the fact that the steps (c) to (e) were omitted, aqueous solution containing 2 wt % of nitric acid (containing 0.5 wt % of aluminum ions and 0.007 wt % of ammonium ions) was used for electrolysis in the electrochemical graining in the step (g), a solution temperature was 30° C., the total of the quantity of electricity was 400 $C/dm^2$ when the aluminum plate was at the anode side in the step (g), and the dissolving amount of the aluminum plate was 2 $g/m^2$ in the step (h).

Comparative Example C-5

A support for a lithographic printing plate was prepared by the same method as that for Example C-1, except for the fact that the steps (l) and (m) were carried out instead of the step (b) (in the etching step (m), the dissolving amount of the aluminum plate was 15 $g/m^2$), the steps (c) to (e) were omitted, the total of the quantity of electricity was 300 $C/dm^2$ in the electrochemical graining in the step (g) when the aluminum plate was at the anode side, and the dissolving amount of the aluminum plate was 2 $g/m^2$ in the etching in the step (h).

Comparative Example C-6

A support for a lithographic printing plate was prepared by the same method as that for Example C-1, except for the fact that the steps (l) and (m) were carried out instead of the step (b) (in the step (l), a bristle diameter of the brush used was 0.48 mm), the steps (c) to (e) were omitted, and the dissolving amount of the aluminum plate was 1 $g/m^2$ in the etching in the step (h).

Comparative Example C-7

A support for a lithographic printing plate was prepared by the same method as that for Example C-1, except for the fact that the steps (l) and (m) were carried out instead of the step (b) (in the step (l), a bristle diameter of the brush used was 0.48 mm).

Comparative Example C-8

A support for a lithographic printing plate was prepared by the same method as that for Example C-1, except for the fact that (a) a JIS A3005 aluminum plate having a thickness of 0.3 mm and a width of 1030 mm was used, a frequency of the alternating current used for electrochemical graining in the step (d) was 60 Hz, and the total of the quantity of electricity was 360 $C/dm^2$ in the step (g) when the aluminum plate was at the anode side.

Comparative Example C-9

A support for a lithographic printing plate was prepared by the same method as that for Example C-1, except for the fact that the total of the quantity of electricity for the electrochemical graining in the step (g) was 270 $C/dm^2$ when the aluminum plate was at the anode side.

Comparative Example C-10

A support for a lithographic printing plate was prepared by the same method as that for Example C-1, except for the fact that the total of the quantity of electricity for the electrochemical graining in the step (g) was 360 $C/dm^2$ when the aluminum plate was at the anode side.

Comparative Example C-11

A support for a lithographic printing plate was prepared by the same method as that for Example C-1, except for the fact that the steps (c) to (e) were omitted, an aqueous solution containing 1 wt % of nitric acid (containing 0.5 wt % of aluminum ions) was used for electrolysis in the electrochemical graining in the step (g), and the total of the quantity of electricity in the step (g) was 270 $C/dm^2$ when the aluminum plate was at the anode side.

2. Surface Property of Supports for Lithographic Printing Plates

With regard to the support for a lithographic printing plate obtained in each of Examples C-1 to C-3 and Comparative Examples C-1 to C-11, the surface filtered waviness curve, the surface arithmetic average roughness and the 85-degree surface gloss were measured. In practice, by a later-described method, a c was prepared from each support for a lithographic printing plate. Then, for non-image areas of a lithographic printing plate obtained by plate making of the presensitized plate, each of the above surface properties was measured, and they were regarded as the surface properties of each support for the lithographic printing plate.

Under the conditions that a cut-off value was 0.8 mm and an evaluation length was 6 mm, the surface filtered waviness curve was measured in compliance with JIS B0610-1987, by using a surface roughness gauge (Surfcom (470570 A) by Tokyo Seimitsu Co., Ltd., and a sensing pin: 2 $\mu$m R). In the chart of the obtained filtered waviness curve, the number of waviness having a depth 0.3 $\mu$m or higher and the number of waviness having a depth 1.0 $\mu$m or higher were counted.

Under the conditions that a cut-off value was 0.8 mm and an evaluation length was 6 mm, the surface arithmetic average roughness was measured in compliance with JIS B0601-1994 by using a surface roughness gauge (Surfcom (470570 A) by Tokyo Seimitsu Co., Ltd., and a sensing pin: 2 $\mu$m R).

The 85-degree surface gloss was measured by using a glossmeter (UGV-4K by SUGA Test Instruments Co., Ltd.).

Tables C-1 to C-3 show the results.

In addition, with regard to the support for a lithographic printing plate obtained in each of Examples C-1 to C-3 and Comparative Examples C-1 to C-11, the surface was observed at a magnification of 3750 by using SEM (JEOL Ltd.). In each of the supports for lithographic printing plates except Comparative Examples C-3 and C-4, it was verified that uniform honeycomb pits having diameters of 0.5 to 2 $\mu$m were present on the full surface of the support.

Moreover, in the preparation process of each support for a lithographic printing plate, also for the aluminum plate right after the first electrochemical graining, as in the foregoing case, a surface filtered waviness curve was measured, and the number of waviness having a depth 0.3 $\mu$m or higher and the number of waviness having a depth 1.0$\mu$ or higher were counted.

3. Preparation of Presensitized Plates (1) By the same method as that for "2. Preparation of presensitized plates" (1) in <Examples about the second aspect of the present invention>, an intermediate layer, a photosensitive layer and a mat layer were formed on a surface of the support for a lithographic printing plate obtained in each of Examples C-1 to C-3 and Comparative Examples C-1 to C-11. A presensitized plate (positive working PS plate) having a coating amount after drying set at 2.0 g/m$^2$ was prepared.

(2) By the same method as that for "2. Preparation of presensitized plates" (2) in <Examples about the second aspect of the present invention>, an intermediate layer and a photosensitive layer were formed on a surface of the support for a lithographic printing plate obtained in Example C-1. A presensitized plate (negative working PS plate) having a coating amount after drying set at 2.5 g/m$^2$ was prepared (Example C-4).

(3) By the same method as that for "2. Preparation of presensitized plates" (3) in <Examples about the second aspect of the present invention>, an intermediate layer and a photosensitive layer were formed on a surface of the support of a lithographic printing plate obtained in Example C-1. A presensitized plate (negative working PS plate having alkali-solubility increased by photothermal conversion) having a coating amount after drying set at 1.5 g/m$^2$ was prepared (Example C-5).

(4) By the same method as that for "2. Preparation of presensitized plates" (4) in <Examples about the second aspect of the present invention>, an intermediate layer and a photosensitive layer were formed on a surface of the support of a lithographic printing plate obtained in Example C-1. A presensitized plate (positive working PS plate having alkali-solubility increased by photothermal conversion) having a coating amount after drying set at 1.8 g/m$^2$ was prepared (Example C-6).

(5) According to the processes described below, an adhesive layer, a photosensitive layer and a protective layer were formed on a surface of the support for a lithographic printing plate obtained in Example C-1. A presensitized plate (photopolymer PS plate capable of being exposed by laser) having a coating amount after drying set at 2 g/m$^2$ was prepared (Example C-7).

A. Formation of Adhesive Layer

Adhesive compound (D) obtained by the method described below was coated by use of spin coater, and then dried at a temperature of 170C for 10 min, thus forming an adhesive layer. The coating amount after drying was 20 mg/m$^2$.

<Production of Adhesive Compound (D)>

50 g of methylenetetraethoxysilane, 1.1 g of acetic acid, 7.7 g of distilled water and 100 g of ethanol were put into a beaker, and agitated at a room temperature to obtain uniform solvent. Subsequently, this solvent was transported into a three-neck flask attached with an agitator and a return cooler, dipped in an oil bath, and reacted for 7 hours while being agitated at a bath temperature kept at 80° C. Thus, the sol of the adhesive compound (D) was obtained.

B. Formation of Photosensitive Layer

A photosensitive solution containing a composition described below was coated onto the adhesive layer, and a photopolymerizable photopolymer photosensitive layer was formed by drying it at a temperature of 120° C. for 1 min. The coating amount after drying was 1.5 g/m$^2$.

Component of photosensitive solution: pentaerythritol tetraacrylate 1.5 g, poly(allyl methacrylate/methacrylic acid) copolymer (mol ratio 80/20) 2.0 g, 1,2-(p-styrylphenyl)-4,6-bis(trichloromethyl)-s-triazine 0.2 g, propylene glycol monomethyl ether 20 g, methyl ethyl ketone 20 g, Megafac F177 (fluorine-containing surfactant by Dianippon Ink and Chemicals Inc., methyl isobutyl ketone solution of 20 wt %) 0.03 g, and oil-soluble dye (Victorian pure blue BOH) 0.02 g.

C. Formation of Protective Layer

An aqueous solution containing 3 wt % of polyvinyl alcohol (degree of saponification 86.5 to 89 mol %, and degree of polymerization 1000) was coated onto the photosensitive layer, and dried at a temperature of 100° C. for 2 min, thus forming a protective layer.

3. Evaluation of Presensitized Plates

A. For the photosensitive presensitized plate prepared by using the support for a lithographic printing plate obtained in each of Examples C-1 to C-3 and Comparative Examples C-1 to C-11, exposure and processing were carried out and printing was evaluated by the same method as that for "3. Evaluation of presensitized plates" A in <Examples about the second aspect of the present invention>, except for the fact that as rinsing solution, FP2-W (1:1) (Fuji Photo Film Co., Ltd.) was used.

B. For the photosensitive presensitized plate prepared by using the support of a lithographic printing plate obtained in Example C-4, exposure and treatment were carried out and printing was evaluated by the same method as that for "3. Evaluation of presensitized plates" B in <Examples about the second aspect of the present invention>.

C. For the photosensitive presensitized plate prepared by using the support for a lithographic printing plate obtained in Example C-5, exposure, heat treatment and development were carried out and printing was evaluated by the same method as that for "3. Evaluation of presensitized plates" C in <Examples about the second aspect of the present invention>.

D. For the photosensitive presensitized plate prepared by using the support for a lithographic printing plate obtained in Example C-6, exposure and development were carried out, gum arabic was coated and printing was evaluated by the same method as that for "3. Evaluation of presensitized plates" D in <Examples about the second aspect of the present invention>.

E. For the photosensitive presensitized plate prepared by using the support for a lithographic printing plate obtained in Example C-7, YAG laser exposure was carried out by the exposing amount of 0.0132 mW/cm$^2$, and development was carried out by silicate-containing developer (the above described alkali developer 1) for 20 sec.

Thereafter, printing was evaluated by the same method as that for A.

Items to be evaluated are as follows.

(1) Adjustment Easiness of Amount of Fountain Solution on Plate (2) Resistance to Interlinking of Halftone Dots when Fountain Solution is Reduced (3) Local Residual Layers on Non-image Areas The items (1) to (3) were evaluated by the same method as those for each of (2) to (4) of <Examples about the second aspect of the present invention>.

(4) Stain on Blanket Cylinder

After 5000 sheets were printed by a printing machine, the printing machine was stopped, and stain on a blanket cylinder was visually observed. Then, the stain was evaluated by 5 grades.

A: Excellent State of no blanket stain

B: Good State of almost no blanket stain

C: Failed Stained state of blanket

A–B: Intermediate state between A and B

B–C: Intermediate state between B and C

Tables C-1 to C-3 show the results of the evaluation. It can be understood that the presensitized plates of the third aspect of the present invention using the supports for lithographic printing plates of the third aspect of the present invention were excellent regarding all the foregoing items to be evaluated in the case of the lithographic printing plates (Examples C-1 to C-7).

Figure 9A:
FIGS. 9A and 9B are schematic sectional views showing surfaces of supports for lithographic printing plates of the present invention according to Examples C-1 to C-3, specifically FIG. 9A showing a state after first electrolytic graining.
Figure 9B:
Figure 10A:
FIGS. 10A and 10B are schematic sectional views showing a surface of a support for a lithographic printing plate according to Comparative Example C-1, specifically FIG. 10A showing a state after first electrolytic graining.
Figure 10B:
Figure 11A:
FIGS. 11A and 11B are schematic sectional views showing a surface of a support for a lithographic printing plate according to Comparative Example C-2, specifically FIG. 11A showing a state after first electrolytic graining.
Figure 11B:
Figure 12:
FIG. 12 is a schematic sectional view showing a surface of a support for a lithographic printing plate according to Comparative Example C-11.

FIGS. 9 to 11 show schematic sectional views of the surface of the support for a lithographic printing plate after first electrochemical graining (FIGS. 9A, 10A and 11A) and after anodizing treatment (FIGS. 9B, 10B and 11B), which was obtained in each of Examples C-1 to C-3 and Comparative Examples C-1 and C-2. FIG. 12 shows a schematic sectional view of the surface of the support for a lithographic printing plate, obtained in Comparative Example C-11. Comparative Example C-1 had shallow hollows: Comparative Example C-2 had deep hollows; and Comparative Example C-11 had only honeycomb pits.

TABLE C-1

| | Example | | | | | | |
|---|---|---|---|---|---|---|---|
| | C-1 | C-2 | C-3 | C-4 | C-5 | C-6 | C-7 |
| State of rolled aluminum<br>Aluminum material | JIS A1050 | JIS A1050 | JIS A1050 | JIS A1050 | JIS A1050 | JIS A1050 | JIS A1050 |
| Mechanical graining | | | | | | | |
| Brush bristle diameter (mm) | — | 0.3 | — | — | — | — | — |
| Chemical etching | | | | | | | |
| Dissolving amount (g/m$^2$) | 5 | 5 | 5 | 5 | 5 | 5 | 5 |
| Desmutting | | | | | | | |
| Processing time (sec) | 10 | 10 | 10 | 10 | 10 | 10 | 10 |
| Preparatory electro-chemical graining | | | | | | | |
| Quantity of electricity (C/dm$^2$) | 200 | 200 | 200 | 200 | 200 | 200 | 200 |
| Solution type | hydro-chloric acid 1 wt % | hydro-chloric acid 1 wt % | nitric acid 1 wt % | hydro-chloric acid 1 wt % | hydro-chloric acid 1 wt % | hydro-chloric acid 1 wt % | hydro-chloric acid 1 wt % |
| Frequency (Hz) | 120 | 120 | DC | 120 | 120 | 120 | 120 |
| Solution temperature (° C.) | 35 | 35 | 50 | 35 | 35 | 35 | 35 |
| Waviness chart | | | | | | | |
| Waviness of 0.3 μm or higher (number) | 44 | 50 | 50 | 44 | 44 | 44 | 44 |
| Waviness of 1.0 μm or higher (number) | 1 | 2 | 0 | 1 | 1 | 1 | 1 |
| Chemical etching | | | | | | | |
| Dissolving amount (g/m$^2$) | 0.3 | 0.3 | 5 | 0.3 | 0.3 | 0.3 | 0.3 |
| Desmutting | | | | | | | |
| Processing time (sec) | 10 | 10 | 10 | 10 | 10 | 10 | 10 |
| Electrochemical graining | | | | | | | |
| Quantity of electricity (C/dm$^2$) | 210 | 210 | 210 | 210 | 210 | 210 | 210 |
| Solution type | nitric acid 1 wt % | nitric acid 1 wt % | nitric acid 1 wt % | nitric acid 1 wt % | nitric acid 1 wt % | nitric acid 1 wt % | nitric acid 1 wt % |
| Solution temperature (° C.) | 50 | 50 | 50 | 50 | 50 | 50 | 50 |
| Chemical etching | | | | | | | |
| Dissolving amount (g/m$^2$) | 0.2 | 0.2 | 0.1 | 0.2 | 0.2 | 0.2 | 0.2 |
| Desmutting | | | | | | | |

TABLE C-1-continued

| | Example | | | | | | |
|---|---|---|---|---|---|---|---|
| | C-1 | C-2 | C-3 | C-4 | C-5 | C-6 | C-7 |
| Processing time (sec) | 10 | 10 | 10 | 10 | 10 | 10 | 10 |
| Anodizing | | | | | | | |
| Amount of anodized layer ($g/m^2$) | 2.7 | 2.7 | 2.7 | 2.7 | 2.7 | 2.7 | 2.7 |
| Waviness chart | | | | | | | |
| Waviness of 0.3 $\mu$m or higher (number) | 52 | 58 | 55 | 52 | 52 | 52 | 52 |
| Waviness of 1.0 $\mu$m or higher (number) | 1 | 2 | 0 | 1 | 1 | 1 | 1 |
| Arithmetic average roughness ($\mu$m) | 0.39 | 0.43 | 0.38 | 0.39 | 0.39 | 0.39 | 0.39 |
| 85-degree surface gloss | 26.7 | 25 | 17.7 | 26.7 | 26.7 | 26.7 | 26.7 |
| Printing evaluation | | | | | | | |
| Adjustment easiness of amount of fountain solution on plate | A | A | A | A | A | A | A |
| Resistance to interlocking of halftone dots when fountain solution is reduced | A–B | A–B | A–B | A–B | A–B | A–B | A–B |
| Local residual layers on non-image area | A | A | A | A | A | A | A |
| Stain on blanket cylinder | A | A | A | A | A | A | A |
| Overall evaluation | A | A | A | A | A | A | A |

TABLE C-2

| | Comparative Example | | | | | |
|---|---|---|---|---|---|---|
| | C-1 | C-2 | C-3 | C-4 | C-5 | C-6 |
| State of rolled aluminum | JIS | JIS | JIS | JIS | JIS | JIS |
| Aluminum material | A3005 | A3005 | A1050 | A1050 | A1050 | A1050 |
| Mechanical graining | | | | | | |
| Brush bristle diameter (mm) | — | — | — | — | — | — |
| Chemical etching | | | | | | |
| Dissolving amount ($g/m^2$) | 5 | 5 | 5 | 15 | 15 | 5 |
| Desmutting | | | | | | |
| Processing time (sec) | 10 | 10 | 10 | 10 | 10 | 10 |
| Preparatory electrochemical graining | | | | | | |
| Quantity of electricity $C/dm^2$) | 100 | 200 | 600 | 400 | 300 | 210 |
| Solution type | hydro-chloric acid 1 wt % | hydro-chloric acid 1 wt % | hydro-chloric acid 1 wt % | nitric acid 2 wt % | nitric acid 2 wt % | nitric acid 1 wt % |
| Frequency (Hz) | 60 | 60 | 60 | 60 | 60 | 60 |
| Solution temperature (° C.) | 35 | 35 | 60 | 30 | 30 | 50 |
| Waviness chart | | | | | | |
| Waviness of 0.3 $\mu$m or higher (number) | 30 | 46 | 51 | 50 | 53 | 64 |
| Waviness of 1.0 $\mu$m or higher (number) | 0 | 12 | 10 | 2 | 1 | 8 |
| Chemical etching | | | | | | |
| Dissolving amount ($g/m^2$) | 0.3 | 0.3 | 0.3 | 2 | 2 | 1 |
| Desmutting | | | | | | |
| Processing time (sec) | 10 | 10 | 10 | 10 | 10 | 10 |
| Electrochemical graining | | | | | | |
| Quantity of electricity ($C/dm^2$) | 210 | 210 | — | — | — | — |
| Solution type | nitric acid 1 wt % | nitric acid 1 wt % | — | — | — | — |
| Solution temperature (° C.) | 50 | 50 | — | — | — | — |
| Chemical etching | | | | | | |
| Dissolving amount ($g/m^2$) | 0.2 | 0.2 | — | — | — | — |
| Desmutting | | | | | | |

TABLE C-2-continued

| | Comparative Example | | | | | |
|---|---|---|---|---|---|---|
| | C-1 | C-2 | C-3 | C-4 | C-5 | C-6 |
| Processing time (sec) | 10 | 10 | — | — | — | — |
| Anodizing | 2.7 | 2.7 | 2.7 | 2.7 | 2.7 | 2.7 |
| Amount of anodized layer ($g/m^2$) | | | | | | |
| Waviness chart | | | | | | |
| Waviness of 0.3 $\mu$m or higher (number) | 35 | 54 | 55 | 50 | 52 | 67 |
| Waviness of 1.0 $\mu$m or higher (number) | 0 | 11 | 12 | 1 | 0 | 9 |
| Arithmetic average roughness ($\mu$m) | 0.3 | 0.46 | 0.56 | 0.56 | 0.51 | 0.53 |
| 85-degree surface gloss | 39.1 | 24.6 | 24.3 | 23.5 | 22.8 | 25.7 |
| Printing evaluation | | | | | | |
| Adjustment easiness of amount of fountain solution on plate | B | A | A–B | B–C | B–C | A–B |
| Resistance to interlocking of halftone dots when fountain solution is reduced | A–B | A–B | A | A | A | A |
| Local residual layer on non-image areas | B-C | C | C | A-B | A-B | C |
| Stain on blanket cylinder | A | B | B–C | B–C | B | B–C |
| Overall evaluation | B | B–C | B–C | B–C | B–C | B–C |

TABLE C-3

| | | Comparative Example | | | | |
|---|---|---|---|---|---|---|
| | | C-7 | C-8 | C-9 | C-10 | C-11 |
| State of rolled aluminum | Aluminum material | JIS A1050 | JIS A3005 | JIS A1050 | JIS A1050 | JIS A1050 |
| Mechanical graining | Brush bristle diameter (mm) | 0.48 | — | — | — | — |
| Chemical etching | Dissolving amount ($g/m^2$) | 5 | 5 | 5 | 5 | 5 |
| Desmutting | Processing time (sec) | 10 | 10 | 10 | 10 | 10 |
| Preparatory electrochemical graining | Quantity of electricity ($C/dm^2$) | 200 | 200 | 200 | 200 | 270 |
| | Solution type | hydrochloric acid 1 wt % | hydrochloric acid 1 wt % | hydrochloric acid 1 wt % | hydrochloric acid 1 wt % | nitric acid 1 wt % |
| | Freguency (Hz) | 120 | 60 | 120 | 120 | 60 |
| | Solution temperature (° C.) | 35 | 35 | 35 | 35 | 50 |
| Waviness chart | Waviness of 0.3 $\mu$m or higher (number) | 55 | 46 | 44 | 44 | 32 |
| | Waviness of 1.0 $\mu$m higher (number) | 10 | 12 | 1 | 1 | 0 |
| Chemical etching | Dissolving amount ($g/m^2$) | 0.3 | 0.3 | 0.3 | 0.3 | 0.2 |
| Desmutting | Processing time (sec) | 10 | 10 | 10 | 10 | 10 |
| Preparatory electrochemical graining | Quantity of electricity ($C/dm^2$) | 210 | 360 | 270 | 360 | — |
| | Solution type | nitric acid 1 wt % | nitric acid 1 wt % | nitric acid 1 wt % | nitric acid 1 wt % | — |
| | Solution temperature (° C.) | 50 | 50 | 50 | 50 | — |
| Chemical etching | Dissolving amount ($g/m^2$) | 0.2 | 0.2 | 0.2 | 0.2 | — |
| Desmutting | Processing time (sec) | 10 | 10 | 10 | 10 | — |
| Anodizing | Amount of anodized layer ($g/m^2$) | 2.7 | 2.7 | 2.7 | 2.7 | 2.7 |
| Waviness chart | Waviness of 0.3 $\mu$m or higher (number) | 61 | 54 | 71 | 79 | 32 |
| | Waviness of 1.0 $\mu$m or higher (number) | 11 | 11 | 8 | 43 | 0 |

TABLE C-3-continued

| | | Comparative Example | | | | |
|---|---|---|---|---|---|---|
| | | C-7 | C-8 | C-9 | C-10 | C-11 |
| Arithmetic average roughness (μm) | | 0.61 | 0.57 | 0.59 | 0.66 | 0.29 |
| 85-degree surface gloss | | 19.2 | 21.3 | 19.1 | 13.2 | 32.2 |
| Printing evaluation | Adjustment easiness of amount of fountain solution on plate | A | A | A | A | C |
| | Resistance to interlocking of halftone dots when fountain solution is reduced | A–B | A–B | A–B | A | C |
| | Local residual layers on non-image areas | C | B–C | B–C | C | A |
| | Stain on blanket cylinder | B–C | C | B–C | C | A |
| | Overall evaluation | C | B–C | B–C | C | C |

Examples about the Fourth Aspect of the Present Invention

1. Preparation of Supports for Lithographic Printing Plates

Example D-1

A JIS A1050 aluminum plate having a thickness of 0.24 mm was subjected to an etching by using aqueous solution containing sodium hydroxide 26 wt % (containing 6.5 wt % of aluminum ions) at a temperature of 70° C. The aluminum plate was dissolved by 6 $g/m^2$, and then washed by water. A neutralization treatment was performed for the aluminum plate in aqueous solution containing 25 wt % of sulfuric acid, and washed by water. Then, electrolytic graining was carried out by using aqueous solution containing hydrochloric acid 0.8 wt % (containing 0.5 wt % of aluminum ions) as electrolytic solution, at a temperature of 35° C., using a rectangular wave alternating current of 60 Hz, so that a current density was 25 $A/dm^2$ and the total of the quantity of electricity was 200 $C/dm^2$ when the aluminum plate was at the anode side.

Subsequently, the aluminum plate was subjected to another etching by using aqueous solution containing sodium hydroxide 5 wt % (containing 1.5 wt % of aluminum ions) at a temperature of 35° C. A smut component mainly containing aluminum hydroxide, resulted from the previous process of the electrolytic graining, was removed, and the edge portion of the generated pit was dissolved to be made smooth. Then, the aluminum plate was washed by water. The dissolving amount of aluminum excluding the amount of smut generated during the electrolytic graining was 0.3 $g/m^2$.

Thereafter, electrolytic graining was carried out by using aqueous solution containing nitric acid 1 wt % (containing 0.5 wt % of aluminum ions and 0.007 wt % of ammonium ions) as electrolytic solution, at a temperature of 50° C., using a rectangular wave alternating current of 60 Hz, so that a current density was 30 $A/dm^2$ and the total of the quantity of electricity was 210 $C/dm^2$ when the aluminum plate was at the anode side. Subsequently, the aluminum plate was washed by water.

Then, the aluminum plate was subjected to an etching by using aqueous solution containing sodium hydroxide 5 wt % (containing 1.5 wt % of aluminum ions) at a temperature of 35° C. A smut component mainly containing aluminum hydroxide resulted from the previous process of the electrolytic graining was removed, and the edge portion of the generated pit was dissolved to be made smooth. Then, the aluminum plate was washed by water. The dissolving amount of aluminum excluding the amount of smut generated during the electrolytic graining was 0.2 $g/m^2$.

Subsequently, a neutralization treatment was performed for the aluminum plate in aqueous solution containing sulfuric acid 25 wt % (containing 0.5 wt % of aluminum ions) at a temperature of 60° C., and washed by water. Then, the aluminum plate was subjected to anodizing in electrolytic solution containing 170 g/L of sulfuric acid, at a temperature of 50° C. and for 50 sec, by a current density of 5 $A/dm^2$ of a direct current.

Thereafter, the aluminum plate was dipped in aqueous solution containing 1 wt % of III-sodium silicate at a temperature of 30° C. for 10 sec. Then, the aluminum plate was washed by water and dried. In this way, a support for a lithographic printing plate was obtained.

Example D-2

A JIS A1050 aluminum plate having a thickness of 0.24 mm was subjected to an etching by using aqueous solution containing sodium hydroxide 26 wt % (containing 6.5 wt % of aluminum ions) at a temperature of 70° C. The aluminum plate was dissolved by 6 $g/m^2$, and then washed by water. A neutralization treatment was performed for the aluminum plate in aqueous solution containing 25 wt % of sulfuric acid, and washed by water. Then, electrolytic graining was carried out by using aqueous solution containing nitric acid 1 wt % (containing 0.5 wt % of aluminum ions and 0.007 wt % of ammonium ions) as electrolytic solution, at a temperature of 50° C., using a rectangular wave alternating current of 0.3 Hz, so that a current density was 25 $A/dm^2$ and the total of the quantity of electricity was 200 $C/dm^2$ when the aluminum plate was at the anode side.

Subsequently, the aluminum plate was subjected to an etching by using aqueous solution containing sodium hydroxide 26 wt % (containing 6.5 wt % of aluminum ions) at a temperature of 70° C. A smut component mainly containing aluminum hydroxide, resulted from the previous process of the electrolytic graining, was removed, and the edge portion of the generated pit was dissolved to be made smooth. Then, the aluminum plate was washed by water. The dissolving amount of aluminum excluding the amount of smut generated during the electrolytic graining was 3 $g/m^2$.

Thereafter, electrolytic graining was carried out by using aqueous solution containing nitric acid 1 wt % (containing 0.5 wt % of aluminum ions and 0.007 wt % of ammonium ions) as electrolytic solution, at a temperature of 50° C., using a rectangular wave alternating current of 60 Hz, so that a current density was 30 A/dm$^2$ and the total of the quantity of electricity was 210 C/dm$^2$ when the aluminum plate was at the anode side. Then, the aluminum plate was washed by water.

Then, the aluminum plate was subjected to an etching by using aqueous solution containing sodium hydroxide 5 wt % (containing 1.5 wt % of aluminum ions) at a temperature of 35° C. A smut component mainly containing aluminum hydroxide resulted from the previous process of the electrolytic graining was removed, and the edge portion of the generated pit was dissolved to be made smooth. Then, the aluminum plate was washed by water. The dissolving amount of aluminum excluding the amount of smut generated during the electrolytic graining was 0.2 g/m$^2$.

Subsequently, a neutralization treatment was performed for the aluminum plate in aqueous solution containing sulfuric acid 25 wt % (containing 0.5 wt % of aluminum ions) at a temperature of 60° C., and washed by water. Then, the aluminum plate was subjected to an anodizing treatment in electrolytic solution containing 170 g/L of sulfuric acid, at a temperature of 50° C. and for 50 sec, by a current density of 5 A/dm$^2$ of a direct current.

Then, the aluminum plate was dipped in aqueous solution containing 1 wt % of III-sodium silicate at a temperature of 30° C. for 10 sec, then washed by water and dried. In this way, a support for a lithographic printing plate was obtained.

Example D-3

A JIS A1050 aluminum plate having a thickness of 0.24 mm was subjected to an etching by using aqueous solution containing sodium hydroxide 26 wt % (containing 6.5 wt % of aluminum ions) at a temperature of 70° C. The aluminum plate was dissolved by 6 g/m$^2$, and then washed by water. A neutralization treatment was performed for the aluminum plate in aqueous solution containing 25 wt % of sulfuric acid, and washed by water. Then, electrochemical graining was continuously carried out by using a DC voltage. Electrolytic solution in this case was aqueous solution containing nitric acid 1 wt % (containing 0.5 wt % of aluminum ions and 0.007 wt % of ammonium ions), and a solution temperature was 50° C. Ferrite was used for an anode, and titanium for a cathode. A DC voltage having a ripple rate of 20% or lower was used for electrolysis. A current density was 80 A/dm$^2$, and the quantity of electricity was 200 C/dm$^2$. The cathode and the anode made a pair. Then, the aluminum plate was washed by water spraying.

Subsequently, the aluminum plate was subjected to an etching by using aqueous solution containing sodium hydroxide 26 wt % (containing 6.5 wt % of aluminum ions) at a temperature of 70° C. A smut component mainly containing aluminum hydroxide, resulted from the previous process of the electrolytic graining, was removed, and the edge portion of the generated pit was dissolved to be made smooth. Then, the aluminum plate was washed by water. The dissolving amount of aluminum excluding the amount of smut generated during the electrolytic graining was 3 g/m$^2$.

Thereafter, electrolytic graining was carried out by using aqueous solution containing nitric acid 1 wt % (containing 0.5 wt % of aluminum ions and 0.007 wt % of ammonium ions) as electrolytic solution, at a temperature of 50° C., using a rectangular wave alternating current of 60 Hz, so that a current density was 30 A/dm$^2$ and the total of the quantity of electricity was 210 C/dm$^2$ when the aluminum plate was at the anode side, and then the aluminum plate was washed by water.

Then, the aluminum plate was subjected to an etching by using aqueous solution containing sodium hydroxide 5 wt % (containing 1.5 wt % of aluminum ions) at a temperature of 35° C. A smut component mainly containing aluminum hydroxide resulted from the previous process of the electrolytic graining was removed, and the edge portion of the generated pit was dissolved to be made smooth. Then, the aluminum plate was washed by water. The dissolving amount of aluminum excluding the amount of smut generated during the electrolytic graining was 0.2 g/m$^2$.

Subsequently, a neutralization treatment was performed for the aluminum plate in aqueous solution containing sulfuric acid 25 wt % (containing 0.5 wt % of aluminum ions) at a temperature of 60° C., and washed by water. Then, the aluminum plate was subjected to an anodizing treatment in electrolytic solution containing 170 g/L of sulfuric acid at a temperature of 50° C. and for 50 sec, by a current density of 5 A/dm$^2$ using a direct current.

Then, the aluminum plate was dipped in aqueous solution containing 1 wt % of III-sodium silicate at a temperature of 30° C. for 10 sec, The aluminum plate was then washed by water and dried. In this way, a support for a lithographic printing plate was prepared.

Comparative Example D-1

A JIS A1050 aluminum plate having a thickness of 0.24 mm was subjected to an etching by using aqueous solution containing sodium hydroxide 26 wt % (containing 6.5 wt % of aluminum ions) at a temperature of 70° C. The aluminum plate was dissolved by 6 g/m$^2$, and then washed by water. A neutralization treatment was performed for the aluminum plate in aqueous solution containing 25 wt % of sulfuric acid, and washed by water. Then, electrolytic graining was carried out by using aqueous solution containing nitric acid 1 wt % (containing 0.5 wt % of aluminum ions and 0.007 wt % of ammonium ions) as electrolytic solution, at a temperature of 50° C., using a rectangular wave alternating current of 60 Hz, so that a current density was 30 A/dm$^2$ and the total of the quantity of electricity was 270 C/dm$^2$ when the aluminum plate was at the anode side. Then, the aluminum plate was washed by water.

Then, the aluminum plate was subjected to an etching by using aqueous solution containing sodium hydroxide 5 wt % (containing 1.5 wt % of aluminum ions) at a temperature of 35° C. A smut component mainly containing aluminum hydroxide, resulted from the previous process of the electrolytic graining, was removed, and the edge portion of the generated pit was dissolved to be made smooth. Then, the aluminum plate was washed by water. The dissolving amount of aluminum excluding the amount of smut generated during the electrolytic graining was 0.2 g/m$^2$.

Subsequently, a neutralization treatment was performed for the aluminum plate in aqueous solution containing sulfuric acid 25 wt % (containing 0.5 wt % of aluminum ions) at a temperature of 60° C., and washed by water. Then, the aluminum plate was subjected to an anodizing treatment in electrolytic solution containing 170 g/L of sulfuric acid, at a temperature of 50° C. and for 50 sec, by a current density of 5 A/dm$^2$ of a direct current.

Then, the aluminum plate was dipped in aqueous solution containing 1 wt % of III-sodium silicate at a temperature of 30° C. and for 10 sec. The aluminum plate was washed by water and dried. In this way, a support for a lithographic printing plate was prepared.

Comparative Example D-2

A JIS A1050 aluminum plate having a thickness of 0.24 mm was subjected to an etching by using aqueous solution containing sodium hydroxide 26 wt % (containing 6.5 wt % of aluminum ions) at a temperature of 70° C. The aluminum plate was dissolved by 6 $g/m^2$, and then washed by water. A neutralization treatment was performed for the aluminum plate in aqueous solution containing 25 wt % of sulfuric acid, and washed by water. Then, electrolytic graining was carried out by using aqueous solution containing nitric acid 2 wt % (containing 0.5 wt % of aluminum ions and 0.007 wt % of ammonium ions) as electrolytic solution, at a temperature of 30° C., using a rectangular wave alternating current of 60 Hz, so that a current density was 60 $A/dm^2$ and the total of the quantity of electricity was 400 $C/dm^2$ when the aluminum plate was at the anode side. Then, the aluminum plate was washed by water.

Then, the aluminum plate was subjected to an etching by using aqueous solution containing sodium hydroxide 5 wt % (containing 1.5 wt % of aluminum ions) at a temperature of 35° C. A smut component mainly containing aluminum hydroxide, resulted from the previous process of the electrolytic graining, was removed, and the edge portion of a generated pit was dissolved to be made smooth. Then, the aluminum plate was washed by water. The dissolving amount of aluminum excluding the amount of smut generated during the electrolytic graining was 0.2 $g/m^2$.

Subsequently, a neutralization treatment was performed for the aluminum plate in aqueous solution containing sulfuric acid 25 wt % (containing 0.5 wt % of aluminum ions) at a temperature of 60° C., and washed by water. Then, the aluminum plate was subjected to an anodizing treatment in electrolytic solution containing 170 g/L of sulfuric acid, at a temperature of 50° C. and for 50 sec, by a current density of 5 $A/dm^2$ of a direct current.

Then, the aluminum plate was dipped in aqueous solution containing 1 wt % of III-sodium silicate at a temperature of 30° C. and for 10 sec. The aluminum plate was then washed by water and dried. In this way, a support for a lithographic printing plate was obtained.

Comparative Example D-3

A JIS A1050 aluminum plate having a thickness of 0.24 mm was subjected to an etching by using aqueous solution containing sodium hydroxide 26 wt % (containing 6.5 wt % of aluminum ions) at a temperature of 70° C. The aluminum plate was dissolved by 6 $g/m^2$, and then washed by water. A neutralization treatment was performed for the aluminum plate in aqueous solution containing 25 wt % of sulfuric acid, and washed by water. Then, electrolytic graining was carried out by using mixed aqueous solution containing 1 wt % of hydrochloric acid and 2 wt % of acetic acid as electrolytic solution, at a temperature of 35° C., using a rectangular wave alternating current of 60 Hz, so that a current density was 50 $A/dm^2$ and the quantity of electricity for one operation was 80 $C/dm^2$ when the aluminum plate was at the anode side. This processing was repeating by 6 times. Then, the aluminum plate was washed by water.

Then, the aluminum plate was subjected to an etching by using aqueous solution containing sodium hydroxide 5 wt % (containing 1.5 wt % of aluminum ions) at a temperature of 35° C. A smut component mainly containing aluminum hydroxide, resulted from the previous process of the electrolytic graining, was removed, and the edge portion of the generated pit was dissolved to be made smooth. Then, the aluminum plate was washed by water. The dissolving amount of aluminum excluding the amount of smut generated during the electrolytic graining was 0.2 $g/m^2$.

Subsequently, neutralization treatment was performed for the aluminum plate in aqueous solution containing sulfuric acid 25 wt % (containing 0.5 wt % of aluminum ions) at a temperature of 60° C., and washed by water. Then, the aluminum plate was subjected to an anodizing treatment in electrolytic solution containing 170 g/L of sulfuric acid, at a temperature of 50° C. and for 50 sec, by a current density of 5 $A/dm^2$ of a direct current.

Then, the aluminum plate was dipped in aqueous solution containing 1 wt % of III-sodium silicate at a temperature of 30° C. for 10 sec. The aluminum plate was then washed by water and dried. In this way, a support for a lithographic printing plate was obtained.

Comparative Example D-4

A JIS A1050 aluminum plate having a thickness of 0.24 mm was subjected to mechanical graining by rotating roller-like nylon brushes while supplying aqueous suspension containing pumice of 400 mesh to the surface of the aluminum plate. A material of the nylon brush was 610 nylon, having a bristle length of 50 mm and a bristle diameter of 0.295 mm. The nylon brush was made by boring holes in the stainless cylinder of ϕ 300 mm and densely planting bristles therein. Three rotary brushes were used. Each distance between two supporting rollers (ϕ 200 mm) in the lower part of the brush was 300 mm. Each brush roller was pressed until a load of a driving motor for pressing the brush reached plus 7 kW for the load before the brush roller was pressed to the aluminum plate. The rotating direction of each brush was the same as the moving direction of the aluminum plate.

The aluminum plate was washed well by water after the mechanical graining. Then, the aluminum plate was subjected to an etching by using aqueous solution containing sodium hydroxide 26 wt % (containing 6.5 wt % of aluminum ions) at a temperature of 70° C. The aluminum plate was dissolved by 6 $g/m^2$, and then washed by water. Then, electrolytic graining was carried out by using aqueous solution containing nitric acid 1 wt % (containing 0.5 wt % of aluminum ions and 0.007 wt % of ammonium ions) as electrolytic solution, at a temperature of 50° C., using a rectangular wave alternating current of 60 Hz, so that a current density was 30 $A/dm^2$ and the total of the quantity of electricity was 230 $C/dm^2$ when the aluminum plate was at the anode side.

Then, the aluminum plate was subjected to an etching by using aqueous solution containing sodium hydroxide 5 wt % (containing 1.5 wt % of aluminum ions) at a temperature of 35° C. A smut component mainly containing aluminum hydroxide, resulted from the previous process of the electrolytic graining, was removed, and the edge portion of the generated pit was dissolved to be made smooth. Then, the aluminum plate was washed by water. The dissolving amount of aluminum excluding the amount of smut generated during the electrolytic graining was 0.2 $g/m^2$.

Subsequently, a neutralization treatment was performed for the aluminum plate in aqueous solution containing sulfuric acid 25 wt % (containing 0.5 wt % of aluminum ions) at a temperature of 60° C., and washed by water. Then, the aluminum plate was subjected to an anodizing treatment in electrolytic solution containing 170 g/L of sulfuric acid, at a temperature of 50° C. and for 50 sec, by a current density of 5 $A/dm^2$ of a direct current.

Then, the aluminum plate was dipped in aqueous solution containing 1 wt % of III-sodium silicate at a temperature of 30° C. and for 10 sec. The aluminum plate was then washed by water and dried. In this way, a support for a lithographic printing plate was obtained.

Comparative Example D-5

A support for a lithographic printing plate was obtained by the same method as that for Comparative Example D-4 except for the fact that the bristle diameter of the nylon brush used for the mechanical graining treatment was changed to 0.48 mm.

Comparative Example D-6

A support for a lithographic printing plate was obtained by the same method as that for Comparative Example D-4 except for the fact that the number of nylon brushes used for the mechanical graining was changed to 2, and the bristle diameter of the first brush was 0.72 mm, that of the second brush 0.295 mm.

2. Preparation of Presensitized Plates

By the same method as that for (h) and (i) of (Example A-1) of "1. Preparation of presensitized plates" in <Examples about the first aspect of the present invention>, an intermediate layer (undercoat layer) and a photosensitive layer were formed on a surface of the support for a lithographic printing plate obtained in each of Examples D-1 to D-3 and Comparative Examples D-1 to D-6, and then a presensitized plate was prepared.

3. Evaluation of Presensitized Plates

The presensitized plate obtained in the foregoing manner was then subjected to exposure at a main operation speed of 5 m/sec, by using a semiconductor laser having an output of 500 mW, a wavelength of 830 nm and a beam diameter of 17 $\mu$m ($1/e^2$). Then, the plate was developed by using water-diluted solution of PS plate developer (Fuji Photo Film Co., Ltd.) for 30 sec, and evaluated.

Items to be evaluated are as follows.

(1) Surface Characteristic of Supports for Lithographic Printing Plates 5 samples of non-image areas of each obtained lithographic printing plate were taken at random. About 1 mm length of the section of each of the samples was observed at a magnification of 5000 by using the scanning electron microscope T-20 (JEOL Co., Ltd.). The number of concave portions each having a width of 8 $\mu$m or wider and a depth of 1.7 $\mu$m or deeper was counted, and averaged.

In addition, the 85-degree surface gloss of the non-image areas of each lithographic printing plate was measured by using a digital deflection glossmeter UGV-4K (SUGA Test Instruments Co., Ltd.).

(2) Scum Resistance of Lithographic Printing Plates

Evaluation was made for printing of each lithographic printing plate. Harris Kikuhan monochrome machine (Harris Co., Ltd.) was used for the printing machine; Geos Black ink (Dainippon Ink and Chemicals Inc.) for ink; and for fountain solution, a mixture of 90 vol % of one obtained by diluting EU-3 (Fuji Photo Film Co., Ltd.) with water to 1:100, and 10 vol % of isopropyl alcohol. Printing was made on woodfree paper, the deposition of ink on the non-image areas when the number of printed sheets reached 1000 was observed, and dot scum was evaluated. Excellent and good (no practical problems) levels were represented by ○ a level having a practical problem by X.

(3) Adjustment Easiness of Amount of Fountain Solution on Plate

The plate surface was visually observed during printing, the amount of fountain solution was adjusted based on the gloss of the non-image areas, and the easiness of fine adjustment of the amount of solution was evaluated. Excellent and good levels in which the amount of fountain solution was easily adjusted were represented by ○ a level in which the amount of fountain solution was hard to be adjusted and had a practical problem was represented by X.

Table D-1 shows the results of evaluation. It can be understood that the presensitized plates of the fourth aspect of the present invention using the supports for a lithographic printing plates according to the fourth aspect of the present invention had no scum on the non-image areas, and provided excellent-quality images and easy fine adjustment of the amount of the fountain solution in the case of a lithographic printing plate (Examples D-1 to D-3).

On the other hand, when the surface gloss (85-degree surface gloss) of the support was high Comparative Examples D-1 and D-2), fine adjustment of the amount of the fountain solution was difficult. When the support had a large number of concave portions having particular sizes and depths Comparative Examples D-3 to D-6), in the case of the lithographic printing plate, scumming occurred in the non-image areas because of the residual layers of a photosensitive layer (recording layer), making it impossible to obtain a good print.

In addition, it can be understood from Examples and Comparative Examples that the surface characteristic of the support for a lithographic printing plate according to the fourth aspect of the present invention was achieved by adjusting the conditions for the surface treatment process of the aluminum plate.

TABLE D-1

| | Example | | | Comparative Example | | | | | |
|---|---|---|---|---|---|---|---|---|---|
| | D-1 | D-2 | D-3 | D-1 | D-2 | D-3 | D-4 | D-5 | D-6 |
| Number of concave portions having width 8 $\mu$m or wider, or depth 1.7 $\mu$m or deeper (number/mm) | 10 | 8 | 9 | 10 | 10 | 12 | 32 | 38 | 42 |
| 85-degree surface gloss | 22 | 28 | 25 | 31 | 33 | 26 | 18 | 16 | 16 |
| Formation of dot residual layers | ○ | ○ | ○ | ○ | ○ | x | x | x | x |
| Adjustment easiness of amount of fountain solution on plate | ○ | ○ | ○ | x | x | ○ | ○ | ○ | ○ |

Examples about the Fifth Aspect of the Present Invention

1. Preparation of Supports for Lithographic Printing Plates

Example E-1

Molten aluminum alloy was prepared by using an aluminum alloy containing Si: 0.06 wt %, Fe: 0.30 wt %, Cu: 0.017 wt %, Mn: 0.001 wt %, Mg: 0.001 wt %, Zn: 0.001 wt %, and Ti: 0.03 wt %, and containing Al and inevitable impurities for the remaining portion. After molten metal processing and filtering, an ingot having a thickness of 500 mm and a width of 1200 mm was made by a DC casting method. After the surface was chipped to have an average thickness of 10 mm by a surface chipper, the ingot was held at 550° C. for about 5 hours for soaking. When the temperature dropped to 400° C., the ingot was formed into a rolled plate having a thickness of 2.7 mm by using a hot rolling mill. Further, after the heat treatment was carried out at 500° C. by using a continuous annealing device, the rolled plate was finished into an aluminum plate having a thickness of 0.24 mm by cold rolling. This aluminum plate was processed to have a width of 1030 mm, and surface treatment described below was continuously carried out.

(a) Alkali Etching

The aluminum plate obtained in the foregoing manner was subjected to spray etching by using aqueous solution containing 2.6 wt % of sodium hydroxide and 6.5 wt % of aluminum ions at a temperature of 70° C., and the aluminum plate was dissolved by 13 $g/m^2$. Thereafter, the aluminum plate was washed by water spraying.

(b) Desmutting

The aluminum plate was subjected to spray desmutting treatment using aqueous solution containing nitric acid 1 wt % (containing 0.5 wt % of aluminum ions) at a temperature of 30° C., and then washed by water spraying. For the aqueous solution of nitric acid used for the desmutting, waste solution generated in the process of electrochemical graining carried out by using an alternating current in the aqueous solution of nitric acid was utilized.

(c) Electrochemical Graining

Electrochemical graining treatment was continuously carried out by using an AC voltage. Electrolytic solution in this case was the aqueous solution containing nitric acid 1 wt % (containing aluminum ions 0.5 wt % and ammonium ions 0.007 wt %), and a temperature was 50° C. An AC power source waveform was like that shown in FIG. 2. With the time TP necessary for a current value to reach its peak from zero set at 2 msec, and duty ratio set at 1:1, a frequency set at 60 Hz, and by using a trapezoidal wave alternating current, the electrochemical graining was carried out while carbon electrodes were set as counter electrodes. Ferrite was used for an auxiliary anode. An electrolytic cell used is shown in FIG. 6. A current density was 30 $A/dm^2$ at a current peak value. Regarding the quantity of electricity, the total of the quantity of electricity was 180 $C/dm^2$ when the aluminum plate was at the anode side. An amount equivalent to 5% of a current flowing from a power source was diverted to the auxiliary anode. Thereafter, the aluminum plate was washed by water spraying.

(d) Etching

The aluminum plate was subjected to spray etching by using aqueous solution containing 26 wt % of sodium hydroxide and 6.5 wt % of aluminum ions at a temperature of 70° C. The aluminum plate was dissolved by 13 $g/m^2$, a smut component mainly containing aluminum hydroxide generated in the previous stage of the electrochemical graining carried out by using the alternating current was removed, and the edge portion of a formed pit was dissolved to be made smooth. Then, the aluminum plate was washed by water spraying.

(e) Desmutting

The aluminum plate was subjected to spray desmutting using aqueous solution containing sulfuric acid 25 wt % (containing 0.5 wt % of aluminum ions) at a temperature of 60° C. Then, the aluminum plate was washed by water spraying.

(f) Anodizing

By using the anodizing device (each of first and second electrolytic portions has a length of 6 m, each of first and second power supply units has a length of 3 m, and each of first and second power supply electrodes has a length of 2.4 m) of a two-stage power supply electrolytic treatment method having a structure shown in FIG. 8, anodizing was carried out under the conditions that the concentration of sulfuric acid was 100 g/L for each of the first and second electrolytic portions (containing 0.5 wt % of aluminum ions), a temperature was 50° C., a specific gravity was 1.1, and electric conductivity was 0.39 S/cm. Then, the aluminum plate was washed by water spraying.

The quantity of electricity supplied from each of the power sources **67*a* and 67*b* to the first power supply unit 62*a* was equal to that supplied from the power sources 67*c* and 67*d* to the second power supply unit 62*b*. A power supply current density on the surface of the oxide layer at the second power supply unit 62*b* was about 23 $A/dm^2$. It means that at the second power supply unit 62*b*, electric power was supplied through the oxide layer of 1.2 $g/m^2$ formed by the first electrolytic portion 63*a***. The amount of oxide layer was 2.4 $g/m^2$ at the end.

(g) Alkali Metal Silicate Treatment Alkali metal silicate treatment (silicate treatment) was carried out by dipping a support for lithographic printing plate, obtained by the anodizing, in the layer treated by the aqueous solution containing 1 wt % of III-sodium silicate at a temperature of 30° C. for 10 sec. Then, the support was washed by water spraying.

(Examples E-2 to E-7 and Comparative Examples E-1 to E-3)

In the support for a lithographic printing plate according to Example E-1, the electrolytic conditions of the step (f) anodizing were changed to ones like those described in Table E-1, and then as occasion demanded, post treatment described in Table E-1 was carried out. In this way, each support for a lithographic printing plate was prepared.

2. Average pore diameters and average pore densities of micropores present on anodized layers of the supports for lithographic printing plates With respect to the support for a lithographic printing plate, obtained in each of Examples E-1 to E-7 and Comparative Examples E-1 to E-3, measurement was performed for an average pore diameter and an average pore density of micropores present in an anodized layer.

An average pore diameter d was observed without any deposition made on the surface by the use of the scanning electron microscope S-900 (Hitachi, Ltd.) at a magnification of 150000 by developing the presensitized plate, water-washing it to remove gum from the non-image areas, and naturally drying the surface. Pore diameters were visually read from the obtained SEM photographic image, an average value for 30 pore diameters was calculated, and this value was set at an average pore diameter d.

An average pore density p was calculated by taking out 10 fields of 400 nm around in an SEM photograph similarly taken at a magnification of 150000, counting the number of micropores present therein, and then calculating an average value among them.

3. Preparation of Presensitized Plates

A presensitized plate was prepared by forming an intermediate layer (undercoat layer) and a photosensitive layer on a surface of the support for a lithographic printing plate obtained in each of Examples E-1 to E-7 and Comparative Examples E-1 to E-3, based on the same method as that for (h) and (i) of (Example A-1) of "1. Preparation of presensitized plates" in <Examples about the first aspect of the present invention>, except for the fact that the coating amount of the photosensitive layer was 1.8 $g/m^2$.

4. Evaluation of Presensitized Plates

Each presensitized plate obtained in the foregoing manner was subjected to exposure at a main operation speed of 5 m/sec, by using a semiconductor laser having an output of 500 mW, a wavelength of 830 nm, and a beam diameter of 17 $\mu$m ($1/e^2$). Then, the plate was developed for 30 sec, by using water-diluted solution of PS plate developer DP-4 (1:8) by Fuji Photo Film Co., Ltd, and evaluated.

Items to be evaluated are as follows.

(1) Sensitivity of Presensitized Plates

After the formation of an image in the foregoing manner, development was carried out by using PS plate developer DT-1 (Fuji Photo Film Co., Ltd.) under standard processing surface of the plate, the state of removing the ink from the start of printing was visually observed on the print, and scum resistance was evaluated based on the level of its recovery. The evaluation of one having ink completely removed within 20 prints was represented by ○ and the evaluation of one having ink stuck on the non-image areas and thus ink incompletely removed even after the printing of 20 sheets was represented by X.

Table E-1 shows the results of evaluation. It can be understood that the presensitized plates of the fifth aspect of the present invention using the supports for lithographic printing plates according to the fifth aspect of the present invention, the opening area of micropores present in the anodized layers, controlled within a predetermined range, had excellent sensitivity and scum resistance, and enabled good images to be formed, in the case of lithographic printing plates (Examples E-1 to E-7).

On the other hand, it can be understood that when the opening area of micropores was too large or too small (Comparative Examples E-1 to E-3), sensitivity was deteriorated in either case. Particularly, when the pore diameter was too large (Comparative Example E-1), scum resistance was a problem.

TABLE E-1

| | Anodizing | | | | Average | Average | | | |
|---|---|---|---|---|---|---|---|---|---|
| | Electrolytic concentration | Electrolytic temperature (° C.) | Current density ($A/dm^2$) | Post treatment | pore diameter d ($\times 10^{-9}$ m) | pore density $\rho$ ($\times 10^{16}/m^2$) | $\pi(d/2)^2 \times \rho$ | Sensitivity ($mJ/cm^2$) | Scum resistance |
| Example E-1 | 170 | 50 | 5 | None | 8 | 1 | 0.50 | 120 | ○ |
| Example E-2 | 100 | 50 | 0.7 | None | 7 | 1.4 | 0.54 | 115 | ○ |
| Example E-3 | 250 | 50 | 2 | None | 7 | 1.6 | 0.62 | 110 | ○ |
| Example E-4 | 100 | 50 | 0.7 | Dipped in aqueous solution of sodium hydroxide of pH 12 at 30° C. for 10 sec. | 7 | 2 | 0.77 | 105 | ○ |
| Example E-5 | 300 | 50 | 5 | None | 6 | 2 | 0.57 | 110 | ○ |
| Example E-6 | 100 | 30 | 10 | None | 10 | 0.8 | 0.63 | 110 | ○ |
| Example E-7 | 450 | 50 | 5 | None | 7.5 | 4 | 1.77 | 100 | ○ |
| Comparative Example E-1 | 200 | 55 | 5 | Dipped in aqueous solution of sodium hydroxide of pH 12 at 40° C. for 20 sec. | 20 | 1 | 3.14 | 135 | X |
| Comparative Example E-2 | 80 | 35 | 30 | None | 10 | 0.6 | 0.47 | 150 | ○ |
| Comparative Example E-3 | 170 | 33 | 5 | None | 8 | 0.85 | 0.43 | 145 | ○ |

conditions. Plate surface energy immediately before the amount of residual layers was suddenly increased was set as an index for sensitivity, in the case where the plate surface energy of a laser light was gradually reduced.

(2) Scum Resistance of Lithographic Printing Plates

By using each of the obtained lithographic printing plates, by a diamond 1F-2 sheet-fed press (Mitsubishi Heavy Industries, Ltd.), printing was performed by using DIC graph G (N) Black ink (Dainippon Ink and Chemicals Inc.). The printing was temporarily stopped when 5000 sheets were printed from the start, ink was applied on the full The presensitized plate of the first aspect of the present invention is advantageous in that a wider development latitude is set, which hardly causes developing failures such as the generating of non-image portions or residual layers even when fluctuation occurs in sensitivity of the developer, and the generating of scratch-like non-image portions is hardly occurred, thus handling thereof in usual operation is facilitated.

The presensitized plate of the second aspect of the present invention is advantageous in that, in the case of a lithographic printing plate, the blanket cylinder is difficult to have stain, no local residual layer is present on the non-image areas, fine adjustment of the amount of the fountain solution is easy during printing, and ink hardly spreads when fountain solution is reduced. The support for a lithographic printing plate according to the second aspect of the present invention is suitably used for preparing the presensitized plate of the second aspect of the present invention. According to the second aspect of the present invention, as a result of regulating the surface characteristics of the support for a lithographic printing plate in a particular range, it is possible to provide a presensitized plate capable of exercising good printing performance in the case of a lithographic printing plate. Moreover, such a support for a lithographic printing plate is accurately determined to facilitate production management, and thus quality stability thereof can be secured.

The presensitized plate of the third aspect of the present invention is advantageous, in that in the case of a lithographic printing plate, the blanket cylinder is difficult to have stain, no local residual layer is present on the non-image areas, fine adjustment of the amount of the fountain solution is easy during printing, and ink hardly spreads when fountain solution is reduced. The support for a lithographic printing plate according to the third aspect of the present invention is suitably used for preparing the presensitized plate of the third aspect of the present invention. The support for a lithographic printing plate can be easily prepared by regulating surface properties after the first electrolytic graining in a particular range. According to the third aspect of the present invention, as a result of regulating the surface properties of the support for a lithographic printing plate in a particular range, it is possible to provide a presensitized plate capable of exercising good printing performance in the case of a lithographic printing plate. Moreover, such a support for a lithographic printing plate is accurately determined to facilitate production management, and thus quality stability can be secured.

The presensitized plate of the fourth aspect of the present invention is a thermal positive working type, and advantageous in that, in the case of a lithographic printing plate, a good print can be obtained without any local residual layers present on the non-image areas, and fine adjustment of the amount of the fountain solution is easy during printing. The support for a lithographic printing plate according to the fourth aspect of the present invention is suitably used for preparing the presensitized plate of the fourth aspect of the present invention.

The presensitized plate of the fifth aspect of the present invention is a thermal positive working type, and advantageous in that direct recording can be made from the digital data of a computer or the like by using an infrared laser, the formation of residual layers caused by the penetration of the photosensitive layer into the micropores formed on the anodized layer is limited, high sensitivity is provided, the scum resistance of the non-image areas is high in the case of a lithographic printing plate, and a high-quality image can be formed. The support for a lithographic printing plate according to the fifth aspect of the present invention is suitably used for preparing the presensitized plate of the fifth aspect of the present invention.

What is claimed is:

1. A support for a lithographic printing plate, provided by subjecting an aluminum plate to graining treatment and anodizing treatment, wherein when a diameter and a density of a micropore present in an anodized layer are respectively d(m) and ρ (number of micropores/$m^2$), both d and ρ satisfy an expression (i) below:

$$0.5<\pi(d/2)^2\times\rho<2.0 \quad \text{(i)}.$$

2. A presensitized plate comprising the support for a lithographic printing plate according to claim 1 and a recording layer thereon, said recording layer containing infrared absorbent and a high-molecular compound insoluble in water and soluble in an alkali aqueous solution, wherein solubility to an alkali developer is increased by infrared laser exposure.

* * * * *